(12) United States Patent
Kariya et al.

(10) Patent No.: US 10,062,851 B2
(45) Date of Patent: Aug. 28, 2018

(54) COMPOSITION FOR FORMING ORGANIC SEMICONDUCTOR FILM, ORGANIC SEMICONDUCTOR ELEMENT, AND METHOD FOR MANUFACTURING ORGANIC SEMICONDUCTOR ELEMENT

(71) Applicant: FUJIFILM CORPORATION, Minato-ku, Tokyo (JP)

(72) Inventors: Toshihiro Kariya, Kanagawa (JP); Kensuke Masui, Kanagawa (JP); Takafumi Nakayama, Kanagawa (JP); Shuji Kanayama, Kanagawa (JP); Hiroyuki Takahashi, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 15/375,187

(22) Filed: Dec. 12, 2016

(65) Prior Publication Data
US 2017/0125693 A1    May 4, 2017

Related U.S. Application Data

(63) Continuation of application No. PCT/JP2015/069504, filed on Jul. 7, 2015.

(30) Foreign Application Priority Data

Jul. 18, 2014 (JP) .................................. 2014-147505
Jul. 1, 2015 (JP) .................................. 2015-132597

(51) Int. Cl.
*H01L 51/00* (2006.01)
*H01L 51/05* (2006.01)

(52) U.S. Cl.
CPC ........ *H01L 51/0071* (2013.01); *H01L 51/004* (2013.01); *H01L 51/0043* (2013.01);
(Continued)

(58) Field of Classification Search
None
See application file for complete search history.

(56) References Cited

U.S. PATENT DOCUMENTS

| 8,372,312 | B1 | 2/2013 | Wu et al. |
| 8,389,670 | B2 * | 3/2013 | Kastler ............... C08G 61/126 |
| | | | 528/377 |

(Continued)

FOREIGN PATENT DOCUMENTS

| JP | 2013-516054 A | 5/2013 |
| JP | 2014-013920 A | 1/2014 |
| WO | 2010/000670 A1 | 1/2010 |

OTHER PUBLICATIONS

Extended European Search Report dated Jun. 8, 2017, issued in corresponding EP Patent Application No. 15821963.4.

*Primary Examiner* — Michelle Mandala
(74) *Attorney, Agent, or Firm* — SOLARIS Intellectual Property Group, PLLC

(57) ABSTRACT

An object of the present invention is to provide a composition for forming an organic semiconductor film that makes it possible to obtain an organic semiconductor film having excellent mobility and heat stability, an organic semiconductor element including an organic semiconductor film having excellent mobility and heat stability, and a method for manufacturing the organic semiconductor element.
The composition for forming an organic semiconductor film of the present invention contains an organic semiconductor having a condensed polycyclic aromatic group and a polymer, in which the number of rings in the condensed polycyclic aromatic group is equal to or greater than 4, at least two rings in the condensed polycyclic aromatic group contain at least one atom selected from the group consisting of a sulfur atom, a nitrogen atom, a selenium atom, and an oxygen atom, the condensed polycyclic aromatic group (Continued)

contains, as a partial structure, at least any one structure selected from the group consisting of a benzene ring, a naphthalene ring, and a phenanthrene ring, and the polymer has a glass transition temperature of equal to or higher than −100° C. and equal to or less than −30° C. and an elastic recovery of equal to or less than 30%.

18 Claims, 2 Drawing Sheets

(52) U.S. Cl.
CPC ...... *H01L 51/0068* (2013.01); *H01L 51/0074* (2013.01); *H01L 51/0094* (2013.01); *H01L 51/0004* (2013.01); *H01L 51/0005* (2013.01); *H01L 51/0533* (2013.01); *H01L 51/0545* (2013.01); *H01L 51/0558* (2013.01)

(56) References Cited

U.S. PATENT DOCUMENTS

| | | | |
|---|---|---|---|
| 2011/0204295 A1 | 8/2011 | Kuwabara et al. | |
| 2012/0261648 A1* | 10/2012 | Wu | H01L 51/0074 257/40 |
| 2013/0062598 A1 | 3/2013 | Usta et al. | |

* cited by examiner

COMPOSITION FOR FORMING ORGANIC SEMICONDUCTOR FILM, ORGANIC SEMICONDUCTOR ELEMENT, AND METHOD FOR MANUFACTURING ORGANIC SEMICONDUCTOR ELEMENT

CROSS-REFERENCE TO RELATED APPLICATIONS

This application is a Continuation of International Application No. PCT/JP2015/069504 filed on Jul. 7, 2015, which claims priority to Japanese Patent Application No. 2014-147505 filed on Jul. 18, 2014, and Japanese Patent Application No. 2015-132597 filed on Jul. 1, 2015. The entire contents of these applications are incorporated herein by reference.

BACKGROUND OF THE INVENTION

1. Field of the Invention

The present invention relates to a composition for forming an organic semiconductor film, an organic semiconductor element, and a method for manufacturing the organic semiconductor element.

2. Description of the Related Art

An organic transistor having an organic semiconductor film (organic semiconductor layer) is used in a field effect transistor (FET) used in a liquid crystal display or an organic EL display, a Radio Frequency Identifier (RFID, RF tag), and the like, because the use of the organic transistor makes it possible to achieve lightening of weight and cost reduction and to achieve flexibilization.

Various methods have been suggested as methods for preparing an organic semiconductor film. For example, as compositions for forming an organic semiconductor film, the compositions described in JP2013-516054A and JP2014-13920A are known.

SUMMARY OF THE INVENTION

An object of the present invention is to provide a composition for forming an organic semiconductor film that makes it possible to obtain an organic semiconductor film having excellent mobility and heat stability.

Another object of the present invention is to provide an organic semiconductor element including an organic semiconductor film having excellent mobility and heat stability and a method for manufacturing the organic semiconductor element.

The above objects of the present invention were achieved by means described in the following <1>, <10>, or <20>. Preferred embodiments will be also described below in <2> to <9> and <11> to <19>.

<1> A composition for forming an organic semiconductor film comprising an organic semiconductor having a condensed polycyclic aromatic group and a polymer, in which the number of rings in the condensed polycyclic aromatic group is equal to or greater than 4, at least two rings in the condensed polycyclic aromatic group contain at least one atom selected from the group consisting of a sulfur atom, a nitrogen atom, a selenium atom, and an oxygen atom, the condensed polycyclic aromatic group contains, as a partial structure, at least any one structure selected from the group consisting of a benzene ring, a naphthalene ring, and a phenanthrene ring, and the polymer has a glass transition temperature of equal to or higher than −100° C. and equal to or less than −30° C. and an elastic recovery of equal to or less than 30%, <2> The composition for forming an organic semiconductor film described in <1>, in which the polymer has a surface energy of equal to or less than 30 mN/m$^2$, <3> The composition for forming an organic semiconductor film described in <1> or <2>, in which the polymer is at least one kind of resin selected from the group consisting of natural rubber, synthetic rubber, a silicone resin, a thermoplastic elastomer, and a urea resin, <4> The composition for forming an organic semiconductor film described in any one of <1> to <3>, in which the polymer is at least one kind of polymer selected from the group consisting of ethylene-propylene rubber, acrylonitrile-butadiene rubber, hydrogenated nitrile rubber, fluororubber, a perfluoroelastomer, a tetrafluoroethylene propylene copolymer, an ethylene-propylene-diene copolymer, styrene-butadiene rubber, polychloroprene, polyneoprene, butyl rubber, a methyl phenyl silicone resin, a methyl phenyl vinyl silicone resin, a methyl vinyl silicone resin, a fluorosilicone resin, acryl rubber, ethylene acryl rubber, chlorosulfonated polyethylene, chloropolyethylene, an epichlorohydrin copolymer, a polyisoprene-natural rubber copolymer, polyisoprene rubber, a styrene-isoprene block copolymer, a polyester urethane copolymer, a polyether urethane copolymer, a polyether ester thermoplastic elastomer, and polybutadiene rubber, <5> The composition for forming an organic semiconductor film described in any one of <1> to <4>, in which the number of rings in the condensed polycyclic aromatic group is 5 or 6, <6> The composition for forming an organic semiconductor film described in any one of <1> to <5>, in which the condensed polycyclic aromatic group contains at least two heterocyclic rings, and the heterocyclic rings each contain one heteroatom, <7> The composition for forming an organic semiconductor film described in any one of <1> to <6>, in which the organic semiconductor contains at least one kind of compound represented by any one of Formulae 1 to 16,

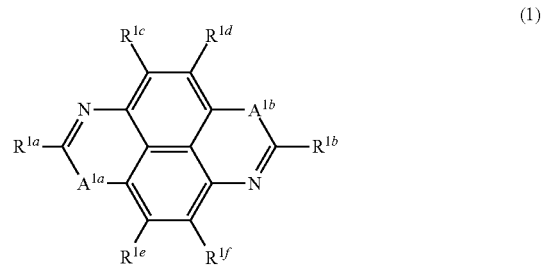

(1)

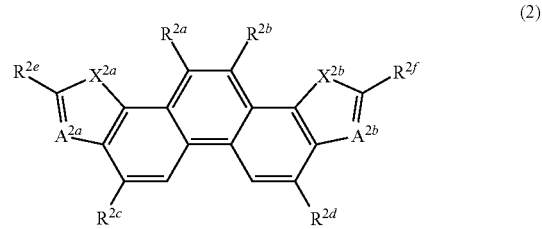

(2)

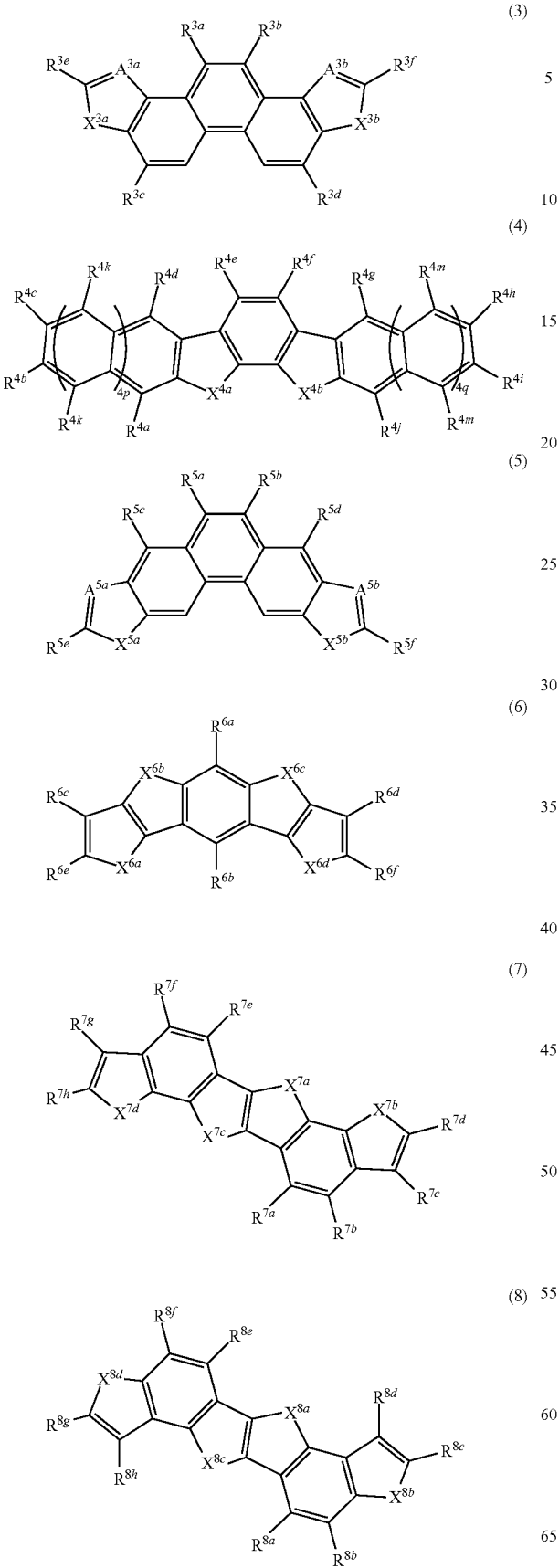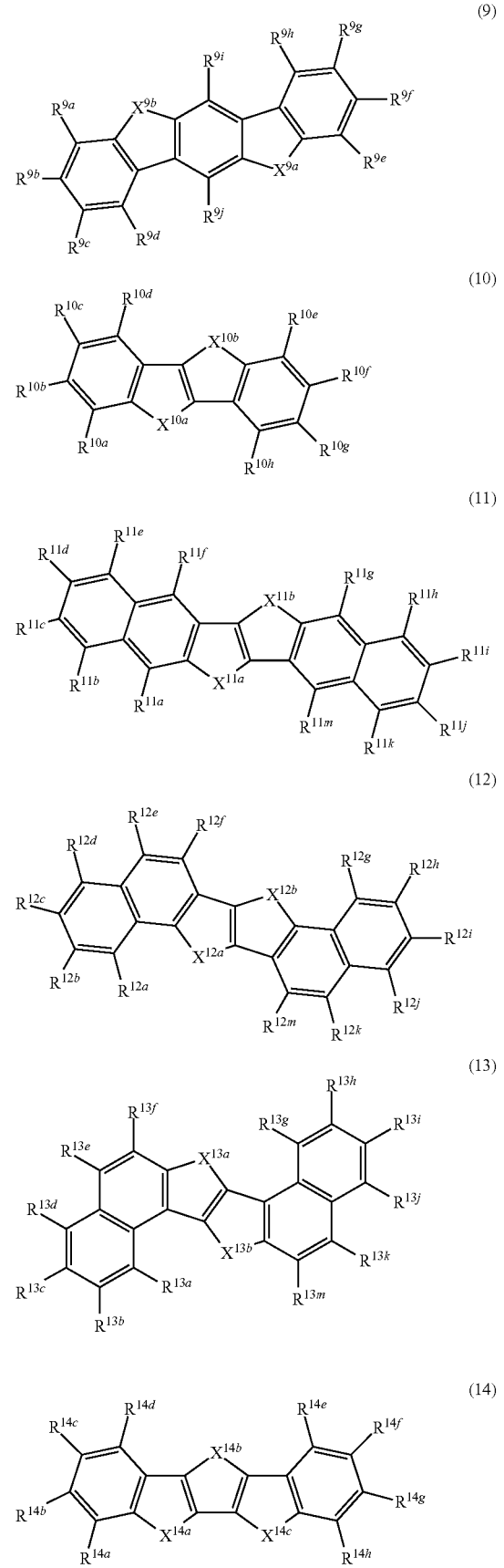

(15)
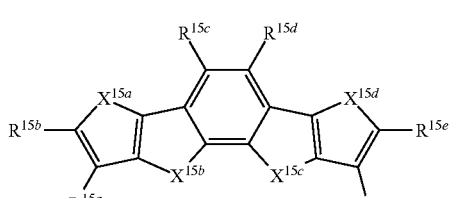

(16)
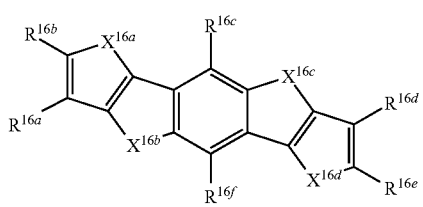

In Formula 1, $A^{1a}$ and $A^{1b}$ each independently represent a S atom, an O atom, or a Se atom, $R^{1a}$ to $R^{1f}$ each independently represent a hydrogen atom or a substituent, and at least one of $R^{1a}$, $R^{1b}$, $R^{1c}$, $R^{1d}$, $R^{1e}$, or $R^{1f}$ is a group represented by the following Formula W.

$$-L^W-R^W \qquad (W)$$

In Formula W, $L^W$ represents a divalent linking group which is represented by any one of the following Formulae L-1 to L-25 or a divalent linking group in which two or more divalent linking groups represented by any one of the following Formulae L-1 to L-25 are bonded to each other, and $R^W$ represents an alkyl group, a cyano group, a vinyl group, an ethynyl group, an oxyethylene group, an oligooxyethylene group in which a repetition number v of an oxyethylene unit is equal to or greater than 2, a siloxane group, an oligosiloxane group having two or more silicon atoms, or a trialkylsilyl group.

(L-1)
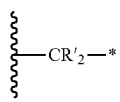

(L-2)
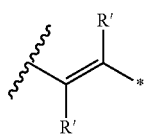

(L-3)
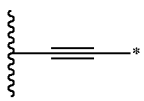

(L-4)
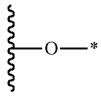

(L-5)
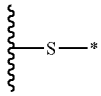

(L-6)
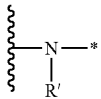

(L-7)
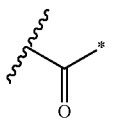

(L-8)
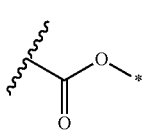

(L-9)
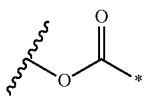

(L-10)
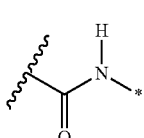

(L-11)
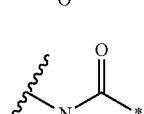

(L-12)
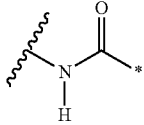

(L-13)
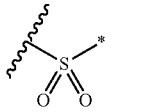

(L-14)
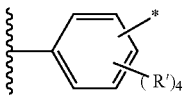

(L-15)
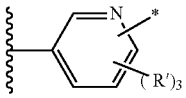

(L-16)
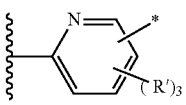

(L-17)
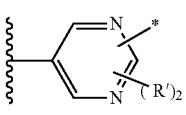

(L-18)
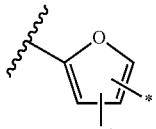

-continued

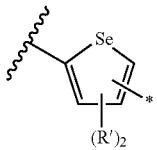 (L-19)

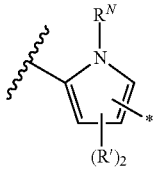 (L-20)

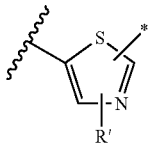 (L-21)

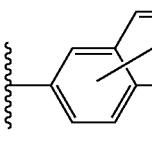 (L-22)

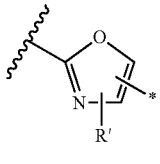 (L-23)

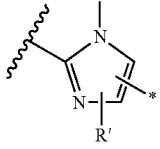 (L-24)

(L-25)

In Formulae L-1 to L-25, * represents a bonding position for $R^W$, the portion of a wavy line represents the other bonding position, each R' in Formulae L-1, L-2, L-6, and L-13 to L-24 independently represents a hydrogen atom or a substituent, $R^N$ in Formulae L-20 and L-24 represents a hydrogen atom or a substituent, and each $R^{si}$ in Formula L-25 independently represents a hydrogen atom, an alkyl group, an alkenyl group, or an alkynyl group.

In Formula 2, $X^{2a}$ and $X^{2b}$ each independently represent $NR^{2i}$, an O atom, or a S atom, $A^{2a}$ represents $CR^{2g}$ or a N atom, $A^{2b}$ represents $CR^{2h}$ or a N atom, $R^{2i}$ represents a hydrogen atom, an alkyl group, an alkenyl group, an alkynyl group, or an acyl group, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ is a group represented by Formula W.

In Formula 3, $X^{3a}$ and $X^{3b}$ each independently represent a S atom, an O atom, or $NR^{3g}$, and $A^{3a}$ and $A^{3b}$ each independently represent $CR^{3h}$ or a N atom. $R^{3a}$ to $R^{3h}$ each independently represent a hydrogen atom or a substituent, and at least one of $R^{3a}$, $R^{3b}$, $R^{3c}$, $R^{3d}$, $R^{3e}$, $R^{3f}$, $R^{3g}$, or $R^{3h}$ is a group represented by Formula W.

In Formula 4, $X^{4a}$ and $X^{4b}$ each independently represent an O atom, a S atom, or a Se atom, 4p and 4q each independently represent an integer of 0 to 2, $R^{4a}$ to $R^{4j}$, $R^{4k}$, and $R^{4m}$ each independently represent a hydrogen atom, a halogen atom, or a group represented by Formula W, and at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W. Here, in a case where at least one of $R^{4e}$ or $R^{4f}$ is a group represented by Formula W, $L^W$ in Formula W represented by $R^{4e}$ and $R^{4f}$ is a divalent linking group represented by Formula L-2 or L-3.

In Formula 5, $X^{5a}$ and $X^{5b}$ each independently represent $NR^{5i}$, an O atom, or a S atom, $A^{5a}$ represents $CR^{5g}$ or a N atom, $A^{5b}$ represents $CR^{5h}$ or a N atom, $R^{5i}$ represents a hydrogen atom, an alkyl group, an alkenyl group, an alkynyl group, an acyl group, an aryl group, or a heteroaryl group, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W.

In Formula 6, $X^{6a}$ to $X^{6d}$ each independently represent $NR^{6g}$, an O atom, or a S atom, $R^{6g}$ represents a hydrogen atom, an alkyl group, an alkenyl group, an alkynyl group, an acyl group, an aryl group, or a heteroaryl group, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ is a group represented by Formula W.

In Formula 7, $X^{7a}$ and $X^{7c}$ each independently represent a S atom, an O atom, a Se atom, or $NR^{7i}$, $X^{7b}$ and $X^{7d}$ each independently represent a S atom, an O atom, or a Se atom, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W.

In Formula 8, $X^{8a}$ and $X^{8c}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W.

In Formula 9, $X^{9a}$ and $X^{9b}$ each independently represent an O atom, a S atom, or a Se atom, $R^{9c}$, $R^{9d}$, and $R^{9g}$ to $R^{9j}$ each independently represent a hydrogen atom, a halogen atom, or a group represented by Formula W, and $R^{9a}$, $R^{9b}$, $R^{9e}$, and $R^{9f}$ each independently represent a hydrogen atom or a substituent.

In Formula 10, $R^{10a}$ to $R^{10h}$ each independently represent a hydrogen atom or a substituent, at least one of $R^{10a}$, $R^{10b}$, $R^{10c}$, $R^{10d}$, $R^{10e}$, $R^{10f}$, $R^{10g}$, or $R^{10h}$ represents a substituent represented by Formula W, $X^{10a}$ and $X^{10b}$ each independently represent a S atom, an O atom, or a Se atom, or $NR^{10i}$, and $R^{10i}$ each independently represents a hydrogen atom or a group represented by Formula W.

In Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ is a group represented by Formula W.

In Formula 12, $X^{12a}$ and $X^{12b}$ each independently represent a S atom, an O atom, a Se atom, or $NR^{12n}$, $R^{12a}$ to $R^{12k}$, $R^{12m}$, and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ is a group represented by Formula W.

In Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ is a group represented by Formula W.

In Formula 14, $X^{14a}$ to $X^{14c}$ each independently represent a S atom, an O atom, a Se atom or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ is a group represented by Formula W.

In Formula 15, $X^{15a}$ to $X^{15d}$ each independently represent a S atom, an O atom, a Se atom, or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ is a group represented by Formula W.

In Formula 16, $X^{16a}$ to $X^{16d}$ each independently represent a S atom, an O atom, a Se atom, or $NR^{16g}$, $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ is a group represented by Formula W.

<8> The composition for forming an organic semiconductor film described in <7>, in which the organic semiconductor contains at least one kind of compound represented by any one of Formulae 1 to 9 and 15, <9> The composition for forming an organic semiconductor film described in any one of <1> to <8>, further comprising at least one kind of compound selected from the group consisting of polystyrene and poly-α-methylstyrene, <10> An organic semiconductor element comprising an organic semiconductor having a condensed polycyclic aromatic group and a polymer, in which the number of rings in the condensed polycyclic aromatic group is equal to or greater than 4, at least two rings in the condensed polycyclic aromatic group contain at least one atom selected from the group consisting of a sulfur atom, a nitrogen atom, a selenium atom, and an oxygen atom, the condensed polycyclic aromatic group contains, as a partial structure, at least any one structure selected from the group consisting of a benzene ring, a naphthalene ring, and a phenanthrene ring, and the polymer has a glass transition temperature of equal to or higher than −100° C. and equal to or less than −30° C. and an elastic recovery of equal to or less than 30%, <11> The organic semiconductor element described in <10>, in which the polymer has a surface energy of equal to or less than 30 mN/m$^2$, <12> The organic semiconductor element described in <10> or <11>, in which the polymer is at least one kind of resin selected from the group consisting of a natural rubber, a synthetic rubber, a silicone resin, a thermoplastic elastomer, and a urea resin, <13> The organic semiconductor element described in any one of <10> to <12>, in which the polymer is at least one kind of polymer selected from the group consisting of ethylene-propylene rubber, acrylonitrile-butadiene rubber, hydrogenated nitrile rubber, fluororubber, a perfluoroelastomer, a tetrafluoroethylene propylene copolymer, an ethylene-propylene-diene copolymer, styrene-butadiene rubber, polychloroprene, polyneoprene, butyl rubber, a methyl phenyl silicone resin, a methyl phenyl vinyl silicone resin, a methyl vinyl silicone resin, a fluorosilicone resin, acryl rubber, ethylene acryl rubber, chlorosulfonated polyethylene, chloropolyethylene, an epichlorohydrin copolymer, a polyisoprene-natural rubber copolymer, polyisoprene rubber, a styrene-isoprene block copolymer, a polyester urethane copolymer, a polyether urethane copolymer, a polyether ester thermoplastic elastomer, and polybutadiene rubber, <14> The organic semiconductor element described in any one of <10> to <13> having a layer of the polymer between the organic semiconductor and a gate insulating film, <15> The organic semiconductor element described in <14> having a layer containing at least one kind of compound selected from the group consisting of polystyrene and poly-α-methylstyrene between the organic semiconductor and the layer of the polymer, <16> The organic semiconductor element described in any one of <10> to <15>, in which the number of rings in the condensed polycyclic aromatic group is 5 or 6, <17> The organic semiconductor element described in any one of <10> to <16>, in which the condensed polycyclic aromatic group contains at least two heterocyclic rings, and the heterocyclic rings each contain one heteroatom, <18> The organic semiconductor element described in any one of <10> to <17>, in which the organic semiconductor contains at least one kind of compound represented by any one of Formulae 1 to 16, <19> The organic semiconductor element described in <18>, in which the organic semiconductor contains at least one kind of compound represented by any one of Formulae 1 to 9 and 15, <20> A method for manufacturing an organic semiconductor element, comprising a coating step of coating a substrate with the composition for forming an organic semiconductor film described in any one of <1> to <9>.

According to the present invention, it is possible to provide a composition for forming an organic semiconductor film that makes it possible to obtain an organic semiconductor film having excellent mobility and heat stability.

Furthermore, according to the present invention, it is possible to provide an organic semiconductor element including an organic semiconductor film having excellent mobility and heat stability and to provide a method for manufacturing the organic semiconductor element.

DESCRIPTION OF THE PREFERRED EMBODIMENTS

Figure 1:
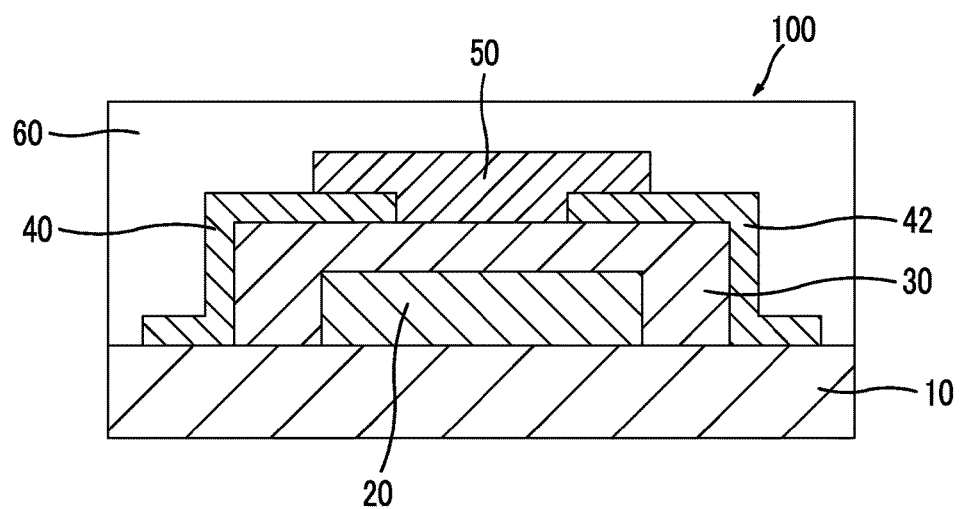
FIG. 1 is a schematic cross-sectional view of an aspect of an organic semiconductor element of the present invention.

Hereinafter, the contents of the present invention will be specifically described. The constituents in the following description will be explained based on typical embodiments of the present invention, but the present invention is not limited to the embodiments. In the specification of the present application, "to" is used to mean that the numerical values listed before and after "to" are a lower limit and an upper limit respectively. Furthermore, in the present invention, an organic EL element refers to an organic electroluminescence element.

In the present specification, in a case where there is no description regarding whether a group (atomic group) is substituted or unsubstituted, the group includes both of a group having a substituent and a group not having a substituent. For example, an "alkyl group" includes not only an alkyl group not having a substituent (unsubstituted alkyl group) but also an alkyl group having a substituent (substituted alkyl group).

In the present specification, in some cases, a chemical structural formula is described as a simplified structural formula in which a hydrogen atom is omitted.

In the present invention, "mobility" refers to "carrier mobility" and means either of both of electron mobility and hole mobility.

In the present invention, "% by mass" and "% by weight" have the same definition, and "part by mass" and "part by weight" have the same definition.

In the present invention, a combination of preferred aspects is more preferable.

(Composition for Forming Organic Semiconductor Film)

A composition for forming an organic semiconductor film (hereinafter, simply referred to as a "composition" as well) of the present invention contains an organic semiconductor having a condensed polycyclic aromatic group and a polymer, in which the number of rings in the condensed polycyclic aromatic group is equal to or greater than 4, at least two rings in the condensed polycyclic aromatic group contain at least one atom selected from the group consisting of a sulfur atom, a nitrogen atom, a selenium atom, and an oxygen atom, the condensed polycyclic aromatic group contains, as a partial structure, at least any one structure selected from the group consisting of a benzene ring, a naphthalene ring, and a phenanthrene ring, and the polymer has a glass transition temperature of equal to or higher than −100° C. and equal to or less than −30° C. and an elastic recovery of equal to or less than 30%.

As a result of repeating intensive investigation, the inventors of the present invention obtained knowledge that by incorporating an organic semiconductor having the aforementioned specific structure and the aforementioned specific polymer into the composition, mobility and heat stability of the obtained organic semiconductor film become excellent. Based on this knowledge, the inventors accomplished the present invention.

The details of mechanism that bring about such effects are unclear. Regarding heat stability, presumably, due to the use of the specific polymer in combination, stress imposed on organic semiconductor crystals in the organic semiconductor film at the time of heating can be relaxed, and hence heat stability becomes excellent. Regarding mobility, presumably, due to the use of the specific polymer, film formability or crystallogenic properties of the organic semiconductor having the specific structure described above are improved, and hence mobility becomes excellent.

<Organic Semiconductor>

The composition for forming an organic semiconductor film of the present invention contains an organic semiconductor (hereinafter, referred to as a "specific organic semiconductor" or a "component A" as well) having a condensed polycyclic aromatic group, in which the number of rings in the condensed polycyclic aromatic group is equal to or greater than 4, at least two rings in the condensed polycyclic aromatic group contain at least 1 atom selected from the group consisting of a sulfur atom, a nitrogen atom, a selenium atom, and an oxygen atom, and the condensed polycyclic aromatic group has, as a partial structure, at least any one structure selected from the group consisting of a benzene ring, a naphthalene ring, and a phenanthrene ring.

Here, the partial structure in the condensed polycyclic aromatic group in the component A does not contain an anthracene ring. In a case where the partial structure contains an anthracene ring, mobility and heat stability of the obtained organic semiconductor film become excellent, although the reason is unclear.

The condensed polycyclic aromatic group is a group obtained by the condensation of a plurality of aromatic rings.

Examples of the aromatic ring include an aromatic hydrocarbon ring (for example, a benzene ring) and an aromatic heterocyclic ring (for example, a thiophene ring, a furan ring, a pyrrole ring, a selenophene ring, or an imidazole ring).

The component A contains a condensed polycyclic aromatic group (condensed polycyclic aromatic structure), and it is preferable that this group is contained as a main component. Herein, being a main component means that a content of the condensed polycyclic aromatic group based on a molecular weight is equal to or greater than 30% of a total molecular weight of the component A. The content is preferably equal to or greater than 40%. An upper limit of the content is not particularly limited. In view of solubility, the upper limit is preferably equal to or less than 80%.

The condensed polycyclic aromatic group is a cyclic structure formed by the condensation of a plurality of rings and exhibits properties of an aromatic group.

The number of rings in the condensed polycyclic aromatic group in the component A is equal to or greater than 4. From the viewpoint of mobility thereof as an organic semiconductor, the number of rings is preferably 4 to 9, more preferably 4 to 7, and even more preferably 5 or 6.

At least two rings in the condensed polycyclic aromatic group contain at least one kind of atom selected from the group consisting of a sulfur atom, a nitrogen atom, a selenium atom, and an oxygen atom. From the viewpoint of mobility thereof as an organic semiconductor, the number of rings containing the aforementioned atom is preferably 2 to 6, and more preferably 2 to 4.

From the viewpoint of mobility thereof as an organic semiconductor, the condensed polycyclic aromatic group preferably contains at least two heterocyclic rings, and the heterocyclic rings preferably each have one heteroatom. The type of the heteroatom is not particularly limited, and examples thereof include an O atom (oxygen atom), a S atom (sulfur atom), a N atom (nitrogen atom), a Se atom (selenium atom), and the like.

The condensed polycyclic aromatic group in the component A contains, as a partial structure, at least one structure selected from the group consisting of a benzene ring, a naphthalene ring, and a phenanthrene ring. The condensed polycyclic aromatic group does not contain an anthracene ring as a partial structure.

From the viewpoint of mobility thereof as an organic semiconductor, the component A preferably has at least a thiophene ring structure and/or a selenophene ring structure, and more preferably has at least a thiophene ring structure. It is even more preferable that all of the heterocyclic structures contained in the component A are thiophene ring structures.

From the viewpoint of mobility thereof as an organic semiconductor, the condensed polycyclic aromatic group is preferably a condensed polycyclic aromatic group which contains, as a partial structure, at least any one structure selected from the group consisting of a benzene ring, a naphthalene ring, and a phenanthrene ring, contains two or more thiophene rings, and has four or more rings. Particularly, the condensed polycyclic aromatic group is more preferably a condensed polycyclic aromatic group which contains a benzene ring as a partial structure and two or more thiophene rings and has four or more rings.

From the viewpoint of mobility thereof as an organic semiconductor, the number of thiophene rings in the condensed polycyclic aromatic group is preferably equal to or greater than 3, more preferably 3 to 5, even more preferably 3 or 4, and particularly preferably 3.

From the viewpoint of mobility thereof as an organic semiconductor, the number of rings in the condensed polycyclic aromatic group is preferably 4 to 6, more preferably 5 or 6, and even more preferably 5. The condensed polycyclic aromatic group is particularly preferably a condensed polycyclic aromatic group which contains two benzene rings and three thiophene rings and has 5 rings.

Preferred examples of the condensed polycyclic aromatic group include a group in which a ring (heterocyclic ring, preferably, a thiophene ring) containing at least one kind of atom selected from the group consisting of a sulfur atom, a nitrogen atom, a selenium atom, and an oxygen atom and a benzene ring are alternately condensed (fused) with each other (a group which is obtained by the alternate condensation of the aforementioned heterocyclic ring and a benzene ring).

From the viewpoint of mobility thereof as an organic semiconductor, the component A preferably contains at least one kind of compound represented by any one of Formulae 1 to 16. The component A is more preferably one or more kinds of compound represented by any one of Formulae 1 to 16.

The composition of the present invention may contain only one kind of component A or two or more kinds of component A.

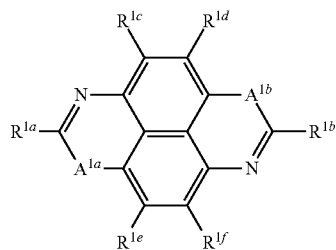
(1)

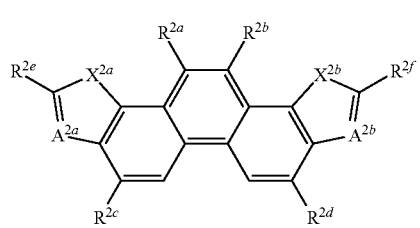
(2)

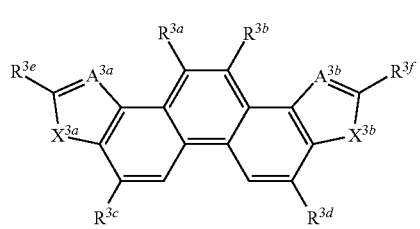
(3)

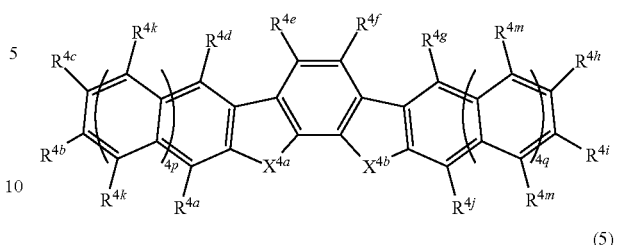
(4)

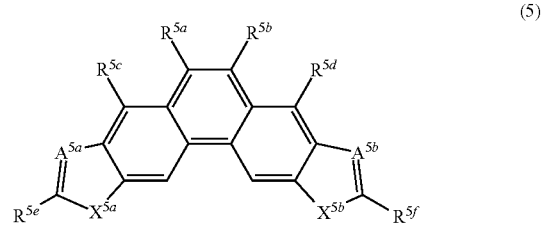
(5)

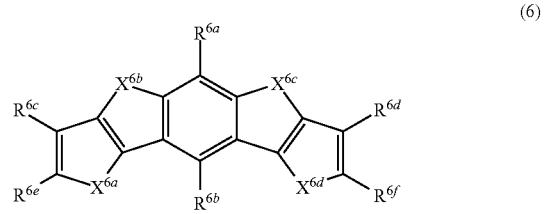
(6)

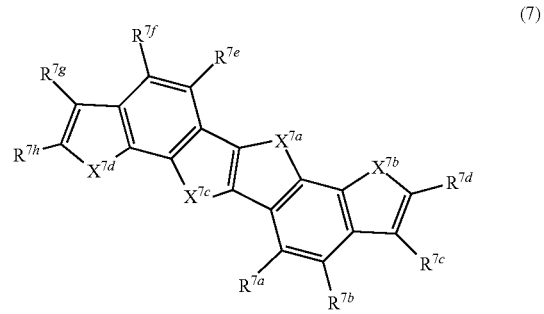
(7)

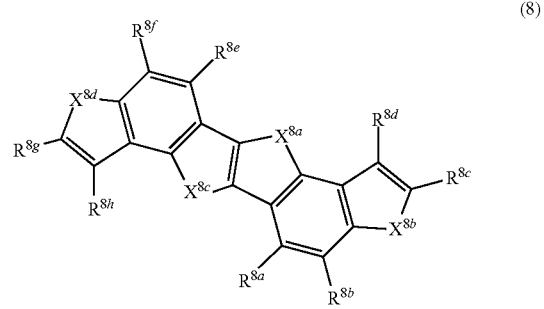
(8)

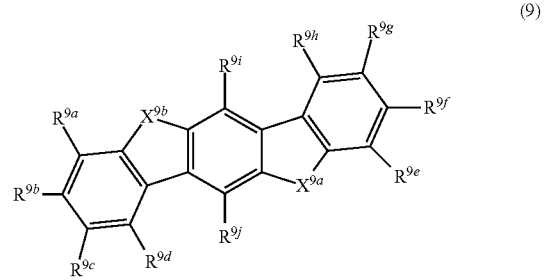
(9)

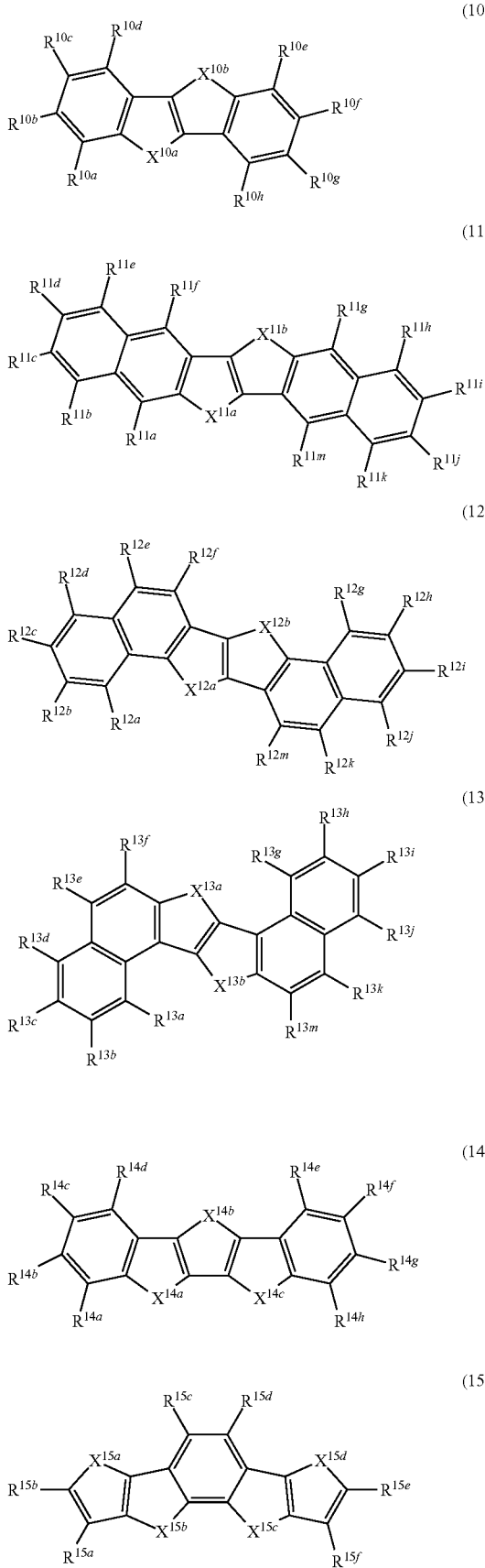

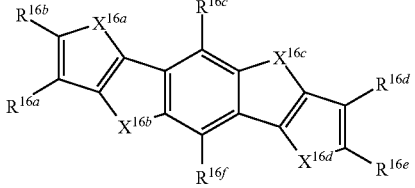

In Formula 1, $A^{1a}$ and $A^{1b}$ each independently represent a S atom, an O atom, or a Se atom, $R^{1a}$ to $R^{1f}$ each independently represent a hydrogen atom or a substituent, and at least one of $R^{1a}$, $R^{1b}$, $R^{1c}$, $R^{1d}$, $R^{1e}$, or $R^{1f}$ is a group represented by the following Formula W.

$$-L^W-R^W \qquad (W)$$

In Formula W, $L^W$ represents a divalent linking group which is represented by any one of the following Formulae L-1 to L-25 or a divalent linking group in which two or more divalent linking groups represented by any one of the following Formulae L-1 to L-25 are bonded to each other, and $R^W$ represents an alkyl group, a cyano group, a vinyl group, an ethynyl group, an oxyethylene group, an oligooxyethylene group in which a repetition number v of an oxyethylene unit is equal to or greater than 2, a siloxane group, an oligosiloxane group having two or more silicon atoms, or a trialkylsilyl group.

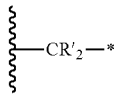 (L-1)

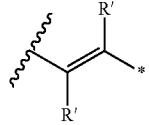 (L-2)

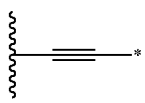 (L-3)

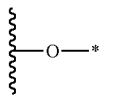 (L-4)

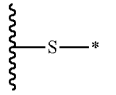 (L-5)

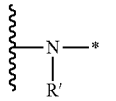 (L-6)

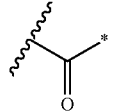 (l-7)

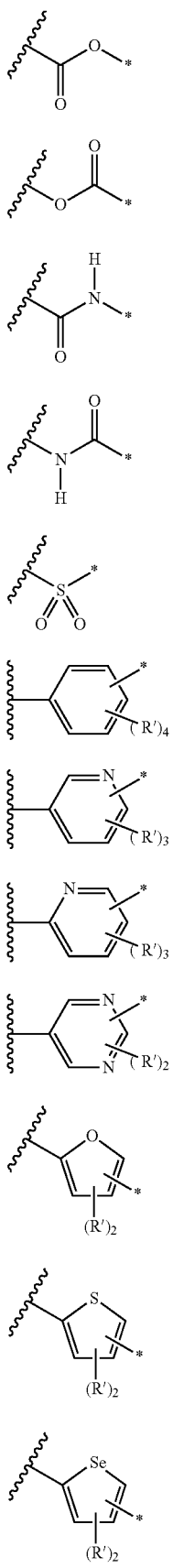

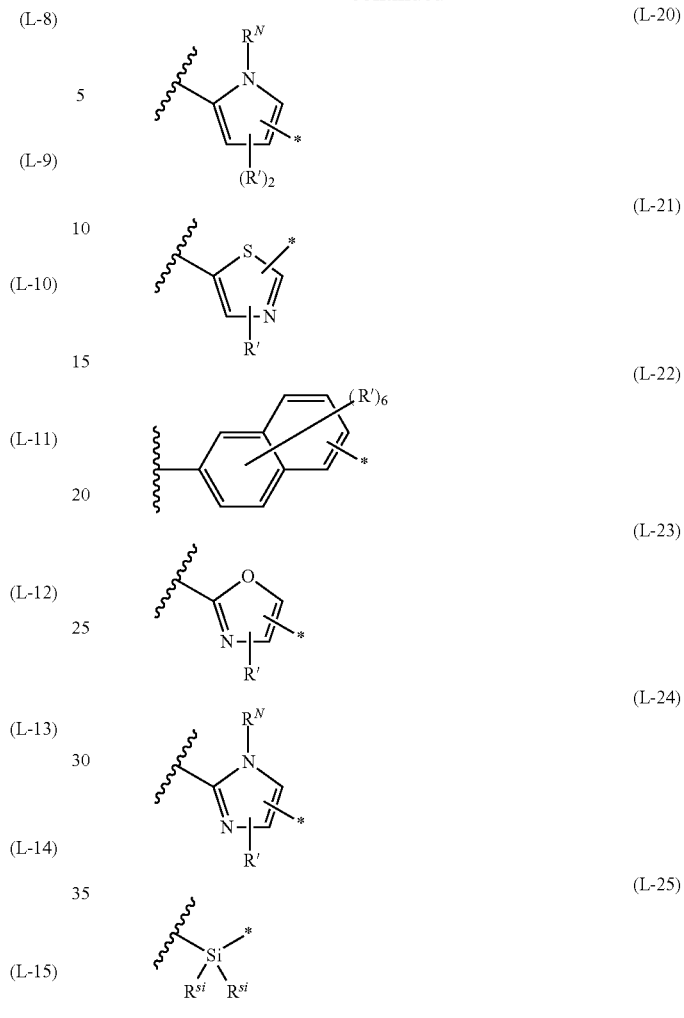

In Formulae L-1 to L-25, * represents a bonding position for R, the portion of a wavy line represents the other bonding position, R' in Formulae L-1, L-2, L-6, and L-13 to L-24 each independently represents a hydrogen atom or a substituent, $R^N$ in Formulae L-20 and L-24 represents a hydrogen atom or a substituent, and $R^{si}$ in Formula L-25 each independently represents a hydrogen atom, an alkyl group, an alkenyl group, or an alkynyl group.

In Formula 2, $X^{2a}$ and $X^{2b}$ each independently represent $NR^{2i}$, an O atom, or a S atom, $A^{2a}$ represents $CR^{2g}$ or a N atom, $A^{2b}$ represents $CR^{2h}$ or a N atom, $R^{2i}$ represents a hydrogen atom, an alkyl group, an alkenyl group, an alkynyl group, or an acyl group, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ is a group represented by Formula W.

In Formula 3, $X^{3a}$ and $X^{3b}$ each independently represent a S atom, an O atom, or $NR^{3g}$, and $A^{3a}$ and $A^{3b}$ each independently represent $CR^{3h}$ or a N atom. $R^{3a}$ to $R^{3h}$ each independently represent a hydrogen atom or a substituent, and at least one of $R^{3a}$, $R^{3b}$, $R^{3c}$, $R^{3d}$, $R^{3e}$, $R^{3f}$, $R^{3g}$, or $R^{3h}$ is a group represented by Formula W.

In Formula 4, $X^{4a}$ and $X^{4b}$ each independently represent an O atom, a S atom, or a Se atom, 4p and 4q each independently represent an integer of 0 to 2, $R^{4a}$ to $R^{4j}$, $R^{4k}$, and $R^{4m}$ each independently represent a hydrogen atom, a halogen atom, or a group represented by Formula W, at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W. Here, in a case where at least one of $R^{4e}$ or $R^{4f}$ is a group represented by Formula W, $L^W$ in Formula W represented by $R^{4e}$ and $R^{4f}$ is a divalent linking group represented by Formula L-2 or L-3.

In Formula 5, $X^{5a}$ and $X^{5b}$ each independently represent $NR^{5i}$, an O atom, or a S atom, $A^{5a}$ represents $CR^{5g}$ or a N atom, $A^{5b}$ represents $CR^{5h}$ or a N atom, $R^{5i}$ represents a hydrogen atom, an alkyl group, an alkenyl group, an alkynyl group, an acyl group, an aryl group, or a heteroaryl group, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W.

In Formula 6, $X^{6a}$ to $X^{6d}$ each independently represent $NR^{6g}$, an O atom, or a S atom, $R^{6g}$ represents a hydrogen atom, an alkyl group, an alkenyl group, an alkynyl group, an acyl group, an aryl group, or a heteroaryl group, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ is a group represented by Formula W.

In Formula 7, $X^{7a}$ and $X^{7c}$ each independently represent a S atom, an O atom, a Se atom, or $NR^{7i}$, $X^{7b}$ and $X^{7d}$ each independently represent a S atom, an O atom, or a Se atom, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W.

In Formula 8, $X^{8a}$ and $X^{8c}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W.

In Formula 9, $X^{9a}$ and $X^{9b}$ each independently represent an O atom, a S atom, or a Se atom, $R^{9c}$, $R^{9d}$, and $R^{9g}$ to $R^{9j}$ each independently represent a hydrogen atom, a halogen atom, or a group represented by Formula W, and $R^{9a}$, $R^{9b}$, $R^{9e}$, and $R^{9f}$ each independently represent a hydrogen atom or a substituent.

In Formula 10, $R^{10a}$ to $R^{10h}$ each independently represent a hydrogen atom or a substituent, at least one of $R^{10a}$, $R^{10b}$, $R^{10c}$, $R^{10d}$, $R^{10e}$, $R^{10f}$, $R^{10g}$, or $R^{10h}$ represents a substituent represented by Formula W, $X^{10a}$ and $X^{10b}$ each independently represent a S atom, an O atom, a Se atom, or $NR^{10i}$, and $R^{10i}$ each independently represents a hydrogen atom or a group represented by Formula W.

In Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ is a group represented by Formula W.

In Formula 12, $X^{12a}$ and $X^{12b}$ each independently represent a S atom, an O atom, a Se atom, or $NR^{12n}$, $R^{12a}$ to $R^{12k}$, $R^{12m}$, and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ is a group represented by Formula W.

In Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ is a group represented by Formula W.

In Formula 14, $X^{14a}$ to $X^{14c}$ each independently represent a S atom, an O atom, a Se atom, or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ is a group represented by Formula W.

In Formula 15, $X^{15a}$ to $X^{15d}$ each independently represent a S atom, an O atom, a Se atom, or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ is a group represented by Formula W.

In Formula 16, $X^{16a}$ to $X^{16d}$ each independently represent a S atom, an O atom, a Se atom, or $NR^{16g}$, $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ is a group represented by Formula W.

—Compound Represented by Formula 1—

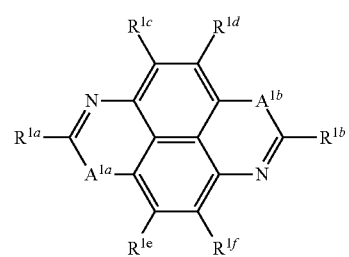

(1)

In Formula 1, $A^{1a}$ and $A^{1b}$ each independently represent a S atom (sulfur atom), an O atom (oxygen atom), or a Se atom (selenium atom). Each of $A^{1a}$ and $A^{1b}$ is preferably a S atom or an O atom. $A^{1a}$ and $A^{1b}$ may be the same as or different from each other, but it is preferable that they are the same as each other.

In Formula 1, $R^{1a}$ to $R^{1f}$ each independently represent a hydrogen atom or a substituent. Here, at least one of $R^{1a}$, $R^{1b}$, $R^{1c}$, $R^{1d}$, $R^{1e}$, or $R^{1f}$ is a group represented by Formula W which will be described later.

The compound represented by Formula 1 may have substituents other than a group represented by Formula W which will be described later.

The type of the substituents which can be adopted as $R^{1a}$ to $R^{1f}$ in Formula 1 is not particularly limited, and examples thereof include a substituent X described below. Examples of the substituent X include a group represented by Formula W which will be described later, a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group (may be referred to as a hetero ring group as well), a cyano group, a hydroxyl group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, alkoxycarbonylamino group, an aryloxycarbonylamino group, a sulfamoylamino group, alkyl- and arylsulfonylamino groups, a mercapto group, an alkylthio group, an arylthio group, a heterocyclic thio group, a sulfamoyl group, a sulfo group, alkyl- and arylsulfinyl groups, alkyl- and arylsulfonyl groups, an acyl group, an aryloxycarbonyl group, an alkoxycarbonyl group, a carbamoyl group, aryl- and heterocyclic azo groups, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents. In Formulae 1 to 16 of the present specification, preferred examples of a "substituent" includes the aforementioned substituent X.

Among these, the groups other than a group represented by Formula W which will be described later are preferably a halogen atom, an alkyl group, an alkynyl group, an alkenyl group, an alkoxy group, an alkylthio group, and an aryl group, more preferably a fluorine atom, a substituted or unsubstituted alkyl group having 1 to 3 carbon atoms, a substituted or unsubstituted alkynyl group having 2 or 3 carbon atoms, a substituted or unsubstituted alkenyl group having 2 or 3 carbon atoms, a substituted or unsubstituted alkoxy group having one or two carbon atoms, a substituted or unsubstituted methylthio group, and a phenyl group, and particularly preferably a fluorine atom, a substituted or unsubstituted alkyl group having 1 to 3 carbon atoms, a substituted or unsubstituted alkynyl group having 2 or 3 carbon atoms, a substituted or unsubstituted alkenyl group having 2 or 3 carbon atoms, a substituted or unsubstituted alkoxy group having one or two carbon atoms, and a substituted or unsubstituted methylthio group.

In the compound represented by Formula 1, among $R^{1a}$ to $R^{1f}$, the number of substituents other than a group represented by Formula W is preferably 0 to 4, more preferably 0 to 2, and particularly preferably 0.

These substituents may further have the above substituent X.

Among the above substituents, $R^{1c}$ to $R^{1f}$ each independently preferably represent a hydrogen atom, a fluorine atom, a substituted or unsubstituted alkyl group having 1 to 3 carbon atoms, a substituted or unsubstituted alkynyl group having 2 or 3 carbon atoms, a substituted or unsubstituted alkenyl group having two or three carbon atoms, a substituted or unsubstituted alkoxy group having one or two carbon atoms, or a substituted or unsubstituted methylthio group.

Next, a group represented by Formula W will be described.

$$-L^W-R^W \quad (W)$$

In Formula W, L represents a divalent linking group which is represented by any one of the following Formulae L-1 to L-25 or a divalent linking group in which two or more divalent linking groups represented by any one of the following Formulae L-1 to L-25 are bonded to each other.

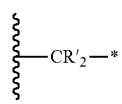
(L-1)

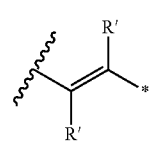
(L-2)

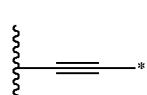
(L-3)

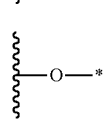
(L-4)

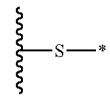
(L-5)

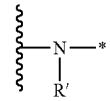
(L-6)

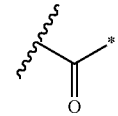
(L-7)

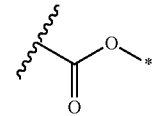
(L-8)

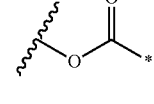
(L-9)

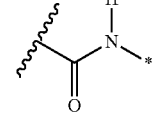
(L-10)

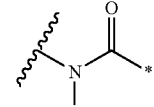
(L-11)

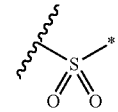
(L-12)

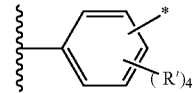
(L-13)

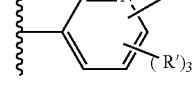
(L-14)

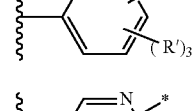
(L-15)

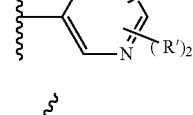
(L-16)

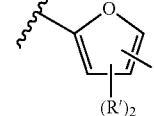
(L-17)

-continued (L-18)
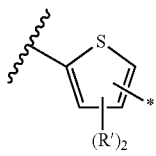

(L-19)
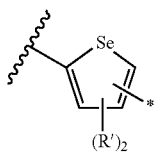

(L-20)
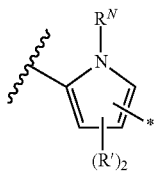

(L-21)
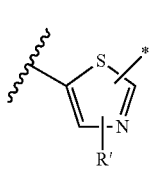

(L-22)
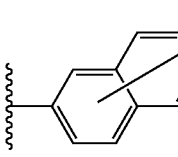

(L-23)
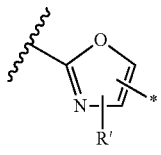

(L-24)
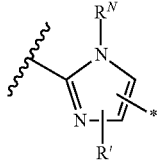

(L-25)
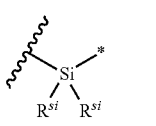

In Formulae L-1 to L-25, * represents a bonding position for $R^W$, and the portion of a wavy line represents the other bonding position. More specifically, in the compound represented by Formula 1, the portion of a wavy line is bonded to a ring forming a skeleton represented by Formula 1. As will be described later, in a case where Formula W is contained in other compounds, the portion of a wavy line is bonded to a ring forming a skeleton of each of the compounds.

In a case where $L^W$ represents a divalent linking group in which two or more divalent linking groups represented by any one of Formulae L-1 to L-25 are bonded to each other, * of one linking group is bonded to the portion of a wavy line of the other linking group.

In Formulae L-13 to L-24, as the bonding position of R' and the bonding position * for $R^W$, any position on an aromatic ring or a heterocyclic aromatic ring can be adopted.

R' in Formulae L-1, L-2, L-6, and L-13 to L-24 each independently represents a hydrogen atom or a substituent. $R^N$ represents a hydrogen atom or a substituent. $R^{si}$ each independently represents a hydrogen atom, an alkyl group, an alkenyl group, or an alkynyl group.

Each R' in Formulae L-1 and L-2 may form a fused ring by being bonded to $R^W$ adjacent to $L^W$.

Among these, the divalent linking group represented by any one of Formulae L-17 to L-21, L-23, and L-24 is more preferably a divalent linking group represented by one of the following Formulae L-17A to L-21A, L-23A, and L-24A.

(L-17A)
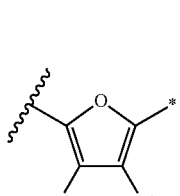

(L-18A)
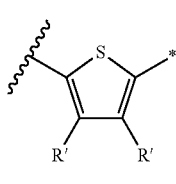

(L-19A)
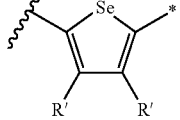

(L-20A)
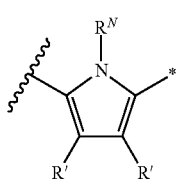

(L-21A)
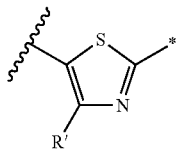

(L-23A)
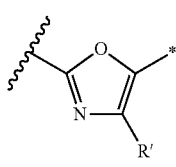

(L-24A)
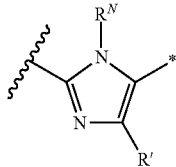

In a case where a substituted or unsubstituted alkyl group, an oxyethylene group, an oligo-oxyethylene group in which a repetition number v of an oxyethylene unit is equal to or greater than 2, a siloxane group, an oligosiloxane group having two or more silicon atoms, or a substituted or unsubstituted trialkylsilyl group is present on the terminal of a substituent, the substituent can be interpreted as a substituent consisting only of —$R^W$ in Formula W or a substituent consisting of -$L^W$-$R^W$ in Formula W.

In the present invention, in a case where a substituted or unsubstituted alkyl group having a main chain consisting of N carbon atoms is present on the terminal of a substituent, the substituent is interpreted as -$L^W$-$R^W$ in Formula W including as many linking groups as possible from the terminal of the substituent. Specifically, the substituent is interpreted as a substituent in which "one group represented by Formula L-1 corresponding to $L^W$ in Formula W" and "a substituted or unsubstituted alkyl group which corresponds to $R^W$ in Formula W and has a main chain consisting of (N−1) carbon atoms" are bonded to each other. For example, in a case where a n-octyl group which is an alkyl group having eight carbon atoms is present on the terminal of a substituent, the substituent is interpreted as a substituent in which one group represented by Formula L-1, in which two R's represent hydrogen atoms, and a n-pentyl group having 7 carbon atoms are bonded to each other.

In contrast, in the present invention, in a case where an oxyethylene group, an oligo-oxyethylene group in which a repetition number v of an oxyethylene unit is equal to or greater than 2, a siloxane group, an oligosiloxane group having two or more silicon atoms, or a substituted or unsubstituted trialkylsilyl group is present on the terminal of a substituent, the substituent is interpreted as a substituent consisting only of $R^W$ in Formula W including as many linking groups as possible from the terminal of the substituent. For example, in a case where a —($OCH_2CH_2$)—($OCH_2CH_2$)—($OCH_2CH_2$)—$OCH_3$ group is present on the terminal of a substituent, the substituent is interpreted as a substituent consisting only of an oligo-oxyethylene group in which a repetition number v of an oxyethylene unit is 3.

In a case where $L^W$ forms a linking group in which divalent linking groups represented by any one of Formulae L-1 to L-25 are bonded to each other, the number of bonded divalent linking groups represented by any one of Formulae L-1 to L-25 is preferably 2 to 4, and more preferably 2 or 3.

Examples of the substituent R' in Formulae L-1, L-2, L-6, and L-13 to L-24 include those exemplified as substituents that can be adopted as $R^{1a}$ to $R^{1f}$ in Formula 1. The substituent R' in Formula L-6 among the above formulae is preferably an alkyl group. In a case where R' in Formula L-6 is an alkyl group, the number of carbon atoms of the alkyl group is preferably 1 to 9, more preferably 4 to 9 from the viewpoint of chemical stability and carrier transport properties, and even more preferably 5 to 9. In a case where R' in Formula L-6 is an alkyl group, the alkyl group is preferably a linear alkyl group, because then carrier mobility can be improved.

$R^N$ in Formulae L-20 and L-24 represents a hydrogen atom or a substituent. Examples of $R^N$ include those exemplified as substituents that can be adopted as $R^{1a}$ to $R^{1f}$ in Formula 1. $R^N$ is preferably a hydrogen atom or a methyl group among the substituents.

$R^{si}$ in Formula L-25 each independently represents a hydrogen atom, an alkyl group, an alkenyl group, or an alkynyl group, and preferably represents an alkyl group. The alkyl group that can be adopted as $R^{si}$ is not particularly limited. A preferred range of the alkyl group that can be adopted as $R^{si}$ is the same as a preferred range of an alkyl group that can be adopted in a trialkylsilyl group in a case where R represents a trialkylsilyl group. The alkenyl group that can be adopted as $R^{si}$ is not particularly limited. The alkenyl group is preferably a substituted or unsubstituted alkenyl group and more preferably a branched alkenyl group, and the alkenyl group preferably has 2 or 3 carbon atoms. The alkynyl group that can be adopted as $R^{si}$ is not particularly limited. The alkynyl group is preferably a substituted or unsubstituted alkynyl group and more preferably a branched alkynyl group, and the alkynyl group preferably has 2 or 3 carbon atoms.

$L^W$ is preferably a divalent linking group which is represented by any one of Formulae L-1 to L-5, L-13, L-17, and L-18 or a divalent linking group in which two or more divalent linking groups represented by any one of Formulae L-1 to L-5, L-13, L-17, and L-18 are bonded to each other, more preferably a divalent linking group which is represented by any one of Formulae L-1, L-3, L-13, and L-18 or a divalent linking group in which two or more divalent linking groups represented by any one of Formulae L-1, L-3, L-13, and L-18 are bonded to each other, and particularly preferably a divalent linking group which is represented by any one of Formulae L-1, L-3, L-13, and L-18 or a divalent linking group in which a divalent linking group represented by any one of Formulae L-3, L-13, and L-18 and a divalent linking group represented by Formula L-1 are bonded to each other.

Regarding the divalent linking group, in which a divalent linking group represented by any one of Formulae L-3, L-13, and L-18 and a divalent linking group represented by Formula L-1 are bonded to each other, it is preferable that the divalent linking group represented by Formula L-1 is bonded to the $R^W$ side.

From the viewpoint of chemical stability and carrier transport properties, $L^W$ is particularly preferably a divalent linking group containing a divalent linking group represented by Formula L-1, and more particularly preferably a divalent linking group represented by Formula L-1. It is the most preferable that $L^W$ is a divalent linking group represented by Formula L-1 and $R^W$ is a substituted or unsubstituted alkyl group.

In Formula W, $R^W$ represents a substituted or unsubstituted alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having two or more silicon atoms, or a substituted or unsubstituted trialkylsilyl group.

In Formula W, in a case where $L^W$ adjacent to $R^W$ is a divalent linking group which is represented by Formula L-1, $R^W$ is preferably a substituted or unsubstituted alkyl group, an oxyethylene group, an oligo-oxyethylene group in which a repetition number v of an oxyethylene unit is equal to or greater than 2, a siloxane group, or an oligosiloxane group having two or more silicon atoms, and more preferably a substituted or unsubstituted alkyl group.

In Formula W, in a case where $L^W$ adjacent to $R^W$ is a divalent linking group which is represented by any one of Formula L-2 and Formulae L-4 to L-25, $R^W$ is more preferably a substituted or unsubstituted alkyl group.

In Formula W, in a case where $L^W$ adjacent to $R^W$ is a divalent linking group which is represented by Formula L-3, $R^W$ is preferably a substituted or unsubstituted alkyl group or a substituted or unsubstituted trialkylsilyl group.

In a case where $R^W$ is a substituted or unsubstituted alkyl group, the number of carbon atoms thereof is preferably 4 to 17, more preferably 6 to 14 from the viewpoint of chemical stability and carrier transport properties, and even more preferably 6 to 12. It is preferable that R is a long-chain alkyl group having carbon atoms within the above range, particularly, a long-chain linear alkyl group, because then linearity of the molecule is improved, and hence carrier mobility can be improved.

In a case where $R^W$ represents an alkyl group, the alkyl group may be linear, branched, or cyclic. It is preferable that the alkyl group is a linear alkyl group, because then linearity of the molecule is improved, and hence carrier mobility can be improved.

Particularly, from the viewpoint of improving carrier mobility, $R^W$ and $L^W$ in Formula W preferably form a combination in which $L^W$ in Formula 1 is a divalent linking group represented by Formula L-1 and $R^W$ is a linear alkyl group having 7 to 17 carbon atoms or a combination in which $L^W$ is a divalent linking group, in which a divalent linking group represented by any one of Formulae L-3, L-13, and L-18 and a divalent linking group represented by Formula L-1 are bonded to each other, and $R^W$ is a linear alkyl group.

In a case where $L^W$ is a divalent linking group represented by Formula L-1 and $R^W$ is a linear alkyl group having 7 to 17 carbon atoms, $R^W$ is more preferably a linear alkyl group having 7 to 14 carbon atoms from the viewpoint of improving carrier mobility, and particularly preferably a linear alkyl group having 7 to 12 carbon atoms.

In a case where $L^W$ is a divalent linking group, in which a divalent linking group represented by any one of Formulae L-3, L-13, and L-18 and a divalent linking group represented by Formula L-1 are bonded to each other, and $R^W$ is a linear alkyl group, $R^W$ is more preferably a linear alkyl group having 4 to 17 carbon atoms, even more preferably a linear alkyl group having 6 to 14 carbon atoms from the viewpoint of chemical stability and carrier transport properties, and particularly preferably a linear alkyl group having 6 to 12 carbon atoms from the viewpoint of improving carrier mobility.

In contrast, from the viewpoint of improving solubility in an organic solvent, $R^W$ is preferably a branched alkyl group.

In a case where $R^W$ is an alkyl group having a substituent, examples of the substituent include a halogen atom and the like, and the halogen atom is preferably a fluorine atom. In a case where $R^W$ is an alkyl group having a fluorine atom, all of the hydrogen atoms of the alkyl group may be substituted with fluorine atoms such that a perfluoroalkyl group is formed. Here, $R^W$ is preferably an unsubstituted alkyl group.

In the present specification, in a case where $R^W$ is an oligo-oxyethylene group in which a repetition number v of an oxyethylene group is equal to or greater than 2, the "oligo-oxyethylene group" represented by R refers to a group represented by —(OCH$_2$CH$^2$)$_v$—OY (the repetition number v of an oxyethylene unit represents an integer of equal to or greater than 2, and Y on the terminal represents a hydrogen atom or a substituent). In a case where Y on the terminal of the oligo-oxyethylene group is a hydrogen atom, the terminal becomes a hydroxyl group. The repetition number v of the oxyethylene unit is preferably 2 to 4, and more preferably 2 or 3.

It is preferable that the hydroxyl group on the terminal of the oligo-oxyethylene group is sealed. That is, it is preferable that Y represents a substituent. In this case, the hydroxyl group is preferably sealed with an alkyl group having 1 to 3 carbon atoms. That is, Y is preferably an alkyl group having 1 to 3 carbon atoms, more preferably a methyl group or an ethyl group, and particularly preferably a methyl group.

In a case where $R^W$ is a siloxane group or an oligosiloxane group having two or more silicon atoms, a repetition number of the siloxane unit is preferably 2 to 4, and more preferably 2 or 3. Furthermore, it is preferable that a hydrogen atom or an alkyl group is bonded to each silicon atom (Si atom). In a case where an alkyl group is bonded to the silicon atom, the number of carbon atoms of the alkyl group is preferably 1 to 3. For example, it is preferable that a methyl group or an ethyl group is bonded to the silicon atom. The same alkyl groups may be bonded to the silicon atoms, or different alkyl groups or hydrogen atoms may be bonded to the silicon atoms. All of the siloxane units constituting the oligosiloxane group may be the same as or different from each other, but it is preferable that all of them are the same as each other.

In a case where $L^W$ adjacent to $R^W$ is a divalent linking group represented by Formula L-3, $R^W$ is a substituted or unsubstituted trialkylsilyl group. In a case where $R^W$ is a substituted or unsubstituted trialkylsilyl group, a substituent of the silyl group in the trialkylsilyl group is not particularly limited as long as the substituent is a substituted or unsubstituted alkyl group, but the substituent is more preferably a branched alkyl group. The number of carbon atoms of the alkyl group bonded to each silicon atom is preferably 1 to 3. For example, it is preferable that a methyl group, an ethyl group, or an isopropyl group is bonded to the silicon atoms. The same alkyl groups or different alkyl groups may be bonded to the silicon atom. In a case where $R^W$ is a trialkylsilyl group further having a substituent on an alkyl group, the substituent is not particularly limited.

In Formula W, a total number of carbon atoms contained in $L^W$ and $R^W$ is preferably 5 to 18. If the total number of carbon atoms contained in $L^W$ and $R^W$ is equal to or greater than the lower limit of the above range, carrier mobility is improved, and driving voltage is lowered. If the total number of the carbon atoms contained in $L^W$ and $R^W$ is equal to or less than the upper limit of the above range, solubility in an organic solvent is improved.

The total number of carbon atoms contained in $L^W$ and $R^W$ is preferably 5 to 14, more preferably 6 to 14, even more preferably 6 to 12, and particularly preferably 8 to 12.

In the compound represented by Formula 1, among $R^{1a}$ to $R^f$, the number of groups represented by Formula W is preferably 1 to 4, more preferably 1 or 2, and particularly preferably 2.

In the present invention, at least one of $R^{1a}$ or $R^{1b}$ in Formula 1 is preferably a group represented by Formula W. It is considered that from the viewpoint of excellent chemical stability of the compound, the highest occupied molecular orbital (HOMO) level, and packing in a film of molecules, the positions of $R^{1a}$ and $R^{1b}$ are suitable as substitution positions in Formula 1. Particularly, in Formula 1, if a substituent is on the two sites of $R^{1a}$ and $R^{1b}$, high carrier density can be obtained.

In Formula 1, $R^{1c}$ to $R^{1f}$ each independently preferably represent a hydrogen atom, a fluorine atom, a substituted or unsubstituted alkyl group having 1 to 3 carbon atoms, a substituted or unsubstituted alkynyl group having two or three carbon atoms, a substituted or unsubstituted alkenyl group having two or three carbon atoms, a substituted or unsubstituted alkoxy group having one or two carbon atoms, or a substituted or unsubstituted methylthio group.

—Compound Represented by Formula 2—

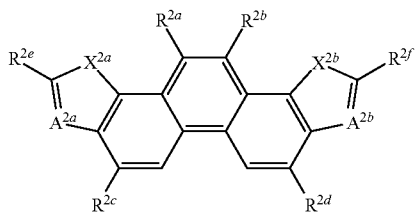

(2)

In Formula 2, $X^{2a}$ and $X^{2b}$ each independently represent $NR^{2i}$ (>N—$R^{2i}$), an O atom, or a S atom. From the viewpoint of ease of synthesis, $X^{2a}$ and $X^{2b}$ each independently preferably represent an O atom or a S atom. In contrast, from the viewpoint of improving carrier mobility, at least one of $X^{2a}$ or $X^{2b}$ preferably represents a S atom.

$X^{2a}$ and $X^{2b}$ are preferably the same linking groups. It is more preferable that both of $X^{2a}$ and $X^{2b}$ are S atoms.

$R^{2i}$ represents a hydrogen atom, an alkyl group, an alkenyl group, an alkynyl group, or an acyl group. $R^{2i}$ is preferably a hydrogen atom or an alkyl group, more preferably an alkyl group having 1 to 14 carbon atoms, and particularly preferably an alkyl group having 1 to 4 carbon atoms.

In a case where $R^{2i}$ represents an alkyl group, the alkyl group may be linear, branched, or cyclic. It is preferable that the alkyl group is a linear alkyl group, because then linearity of the molecule is improved, and hence carrier mobility can be improved.

In Formula 2, $A^{2a}$ represents $CR^{2g}$ or a N atom, $A^{2b}$ represents $CR^{2h}$ or a N atom, and $R^{2g}$ and $R^{2h}$ each independently represent a hydrogen atom or a substituent. It is preferable that $A^{2a}$ represents $CR^{2g}$, or $A^{2b}$ represents $CR^{2h}$. It is more preferable that $A^{2a}$ represents $CR^{2g}$, and $A^{2b}$ represents $CR^{2h}$. $A^{2a}$ and $A^{2b}$ may be the same as or different from each other, but it is preferable that they are the same as each other.

In Formula 2, $R^{2e}$ and $R^{2g}$ may or may not for a ring by being bonded to each other, but it is preferable that they do not form a ring by being bonded to each other.

In Formula 2, $R^{2f}$ and $R^{2h}$ may or may not for a ring by being bonded to each other, but it is preferable that they do not form a ring by being bonded to each other.

In Formula 2, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ represents a substituent represented by Formula W.

Examples of the substituent that $R^{2a}$ to $R^{2h}$ can each independently represent include the substituent X described above. The definition of the substituent represented by Formula W is as described above.

The substituent that $R^{2a}$ to $R^{2h}$ can each independently represent is preferably an alkyl group, an aryl group, an alkenyl group, an alkynyl group, a heterocyclic group, an alkoxy group, an alkylthio group, or a substituent represented by Formula W, more preferably an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, or a group represented by Formula W, particularly preferably a group having a chain length of a linking group, which will be described later, of equal to or less than 3.7 Å or a group represented by Formula W, and more particularly preferably a group represented by Formula W.

In the compound represented by Formula 2, among $R^{2a}$ to $R^{2h}$, the number of groups represented by Formula W is preferably 1 to 4 from the viewpoint of improving carrier mobility and improving solubility in an organic solvent, more preferably 1 or 2, and particularly preferably 2.

A group represented by Formula W can be positioned in any of $R^{2a}$ to $R^{2h}$ without particular limitation. From the viewpoint of improving mobility and improving solubility in an organic solvent, the group represented by Formula W is preferably positioned in $R^{2e}$ or $R^{2f}$.

Among $R^{2a}$ to $R^{2h}$, the number of substituents other than a group represented by Formula W is preferably 0 to 4, more preferably 0 to 2, even more preferably 0 or 1, and particularly preferably 0.

In a case where $R^{2a}$ to $R^{2h}$ each represent a substituent other than a group represented by W, the substituent is preferably a group having a chain length of a linking group of equal to or less than 3.7 Å (=0.37 nm), more preferably a group having a chain length of a linking group of 1.0 to 3.7 Å, and even more preferably a group having a chain length of a linking group of 1.0 to 2.1 Å.

The chain length of a linking group refers to a length from a C atom to the terminal of a substituent R in a C (carbon atom)-R bond. The calculation for structural optimization can be performed using a density functional method (Gaussian 03 (Gaussian, Inc)/basis function: 6-31G*, exchange-correlation functional: B3LYP/LANL2DZ). Regarding a molecular length of typical substituents, a propyl group has a molecular length of 4.6 Å, a pyrrole group has a molecular length of 4.6 Å, a propynyl group has a molecular length of 4.5 Å, a propenyl group has a molecular length of 4.6 Å, an ethoxy group has a molecular length of 4.5 Å, a methylthio group has a molecular length of 3.7 Å, an ethenyl group has a molecular length of 3.4 Å, an ethyl group has a molecular length of 3.5 Å, an ethynyl group has a molecular length of 3.6 Å, a methoxy group has a molecular length of 3.3 Å, a methyl group has a molecular length of 2.1 Å, and a hydrogen atom has a molecular length of 1.0 Å.

In a case where $R^{2a}$ to $R^{2h}$ represent substituents other than a group represented by Formula W, the substituents each independently preferably represent a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, and more preferably represent a substituted or unsubstituted alkyl group having two or less carbon atoms.

In a case where $R^{2a}$ to $R^{2h}$ represent substituents other than a group represented by Formula W, and the substituents each independently represent a substituted alkyl group having two or less carbon atoms, examples of substituents that the alkyl group can have include a cyano group, a fluorine atom, a deuterium atom, and the like. Among these, a cyano group is preferable. In a case where $R^{2a}$ to $R^{2h}$ represent substituents other than a group represented by Formula W, the substituted or unsubstituted alkyl group having two or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{2a}$ to $R^{2h}$ represent substituents other than a group represented by Formula W, and the substituents each independently represent a substituted alkynyl group having two or less carbon atoms, examples of substituents that the alkynyl group can have include a deuterium atom and the like. In a case where $R^{2a}$ to $R^{2h}$ represent substituents other than a group represented by Formula W, examples of the substituted or unsubstituted alkynyl group having two or less carbon atoms that is represented by each of the substituents include an ethynyl group and an acetylene group substituted with a deuterium atom. Between these, an ethynyl group is preferable.

In a case where $R^{2a}$ to $R^{2h}$ represent substituents other than a group represented by Formula W, and the substituents each independently represent a substituted alkenyl group having two or less carbon atoms, examples of substituents that the alkenyl group can have include a deuterium atom and the like. In a case where $R^{2a}$ to $R^{2h}$ represent substituents other than a group represented by Formula W, examples of the substituted or unsubstituted alkenyl group having two or less carbon atoms that is represented by each of the substituents include an ethenyl group and an ethenyl group substituted with a deuterium atom. Between these, an ethenyl group is preferable.

In a case where $R^{2a}$ to $R^{2h}$ represent substituents other than a group represented by Formula W, and the substituents each independently represent a substituted acyl group having two or less carbon atoms, examples of substituents that the acyl group can have include a fluorine atom and the like. In a case where $R^{2a}$ to $R^{2h}$ represent substituents other than a group represented by Formula W, examples of the substituted or unsubstituted acyl group having two or less carbon atoms that is represented by each of the substituents include a formyl group, an acetyl group, and an acetyl group substituted with fluorine. Among these, a formyl group is preferable.

—Compound Represented by Formula 3—

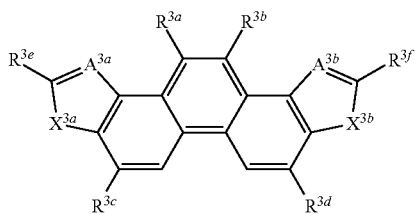

(3)

In Formula 3, $R^{3a}$ to $R^{3f}$ and $R^{3g}$ and $R^{3h}$, which will be described later, each independently represent a hydrogen atom or a substituent. Here, at least one of $R^{3a}$, $R^{3b}$, $R^{3c}$, $R^{3d}$, $R^{3e}$, $R^{3f}$, $R^{3g}$, or $R^{3h}$ represents a group represented by Formula W.

Examples of the substituent represented by $R^{3a}$ to $R^{3h}$ include the substituent X described above. The definition of a group represented by Formula W is as described above.

The substituent that $R^{3a}$ to $R^{3f}$ can each independently represent is preferably an alkyl group, an aryl group, an alkenyl group, an alkynyl group, a heterocyclic group, an alkoxy group, an alkylthio group, or a substituent represented by Formula W, and more preferably an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 14 carbon atoms, a heterocyclic group having 5 to 12 carbon atoms, an alkylthio group having 1 to 12 carbon atoms, or a group represented by Formula W.

In Formula 3, $X^{3a}$ and $X^{3b}$ each independently represent a S atom, an O atom, or $NR^{3g}$ (>N—$R^{3g}$), and $R^{3g}$ represents a hydrogen atom or a substituent. X is preferably a S atom or an O atom. In Formula 3, $X^{3a}$ and $X^{3b}$ are preferably the same as each other.

$R^{3g}$ is preferably a hydrogen atom, an alkyl group, or an aryl group, more preferably an alkyl group having 1 to 14 carbon atoms, and particularly preferably an alkyl group having 4 to 12 carbon atoms. It is preferable that $R^{3g}$ is a long-chain alkyl group having carbon atoms within the above range, particularly, a long-chain linear alkyl group, because then linearity of the molecule is improved, and hence carrier mobility can be improved.

In a case where $R^{3g}$ is an alkyl group, the alkyl group may be linear, branched, or cyclic. It is preferable that the alkyl group is a linear alkyl group, because then linearity of the molecule is improved, and hence carrier mobility can be improved.

In Formula 3, $A^{3a}$ and $A^{3b}$ each independently represent $CR^{3h}$ or a N atom. It is preferable that $A^{3a}$ and $A^{3b}$ each independently represent $CR^{3h}$. In Formula 3, $A^{3a}$ and $A^{3b}$ may be the same as or different from each other, but it is preferable that they are the same as each other.

$R^{3h}$ is a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

$R^{3h}$ is preferably a hydrogen atom, a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, more preferably a hydrogen atom or a substituted or unsubstituted alkyl group having two or less carbon atoms, and particularly preferably a hydrogen atom.

In a case where $R^{3h}$ represents a substituted alkyl group having two or less carbon atoms, examples of substituents that the alkyl group can have include a cyano group, a fluorine atom, a deuterium atom, and the like. Among these, a cyano group is preferable. The substituted or unsubstituted alkyl group having two or less carbon atoms that is represented by $R^{3h}$ is preferably a methyl group, an ethyl group, or a methyl group substituted with a cyano group, more preferably a methyl group or a methyl group substituted with a cyano group, and particularly preferably a methyl group substituted with a cyano group.

In a case where $R^{3h}$ represents a substituted alkynyl group having two or less carbon atoms, examples of substituents that the alkynyl group can have include a deuterium atom and the like. Examples of the substituted or unsubstituted alkynyl group having two or less carbon atoms that is represented by $R^{3h}$ include an ethynyl group and an acetylene group substituted with a deuterium atom. Between these, an ethynyl group is preferable.

In a case where $R^{3h}$ represents a substituted alkenyl group having two or less carbon atoms, examples of substituents that the alkenyl group can have include a deuterium atom and the like. Examples of the substituted or unsubstituted alkenyl group having two or less carbon atoms that is represented by $R^{3h}$ include an ethenyl group and an ethenyl group substituted with a deuterium atom. Between these, an ethenyl group is preferable.

In a case where $R^{3h}$ represents a substituted acyl group having two or less carbon atoms, examples of substituents that the acyl group can have include a fluorine atom and the like. Examples of the substituted or unsubstituted acyl group having two or less carbon atoms that is represented by $R^{3h}$ include a formyl group, an acetyl group, and an acetyl group substituted with a fluorine atom. Among these, a formyl group is preferable.

—Compound Represented by Formula 4—

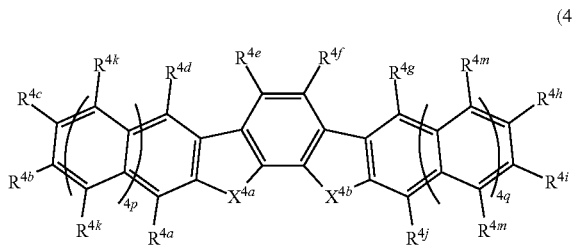

(4)

In Formula 4, $X^{4a}$ and $X^{4b}$ each independently represent an O atom, a S atom, or a Se atom.

It is preferable that $X^{4a}$ and $X^{4b}$ each independently represent an O atom or a S atom. From the viewpoint of improving carrier mobility, it is more preferable that at least one of $X^{4a}$ or $X^{4b}$ is a S atom. It is preferable that $X^{4a}$ and $X^{4b}$ are the same linking groups. It is particularly preferable that both of $X^{4a}$ and $X^{4b}$ are S atoms.

In Formula (4), 4p and 4q each independently represent an integer of 0 to 2. It is preferable that 4p and 4q each independently represent 0 or 1, because then mobility and solubility can be achieved at the same time. It is more preferable that 4p=4q=0 or 4p=4q=1.

In Formula 4, $R^{4a}$ to $R^{4k}$ and $R^{4m}$ each independently represent a hydrogen atom, a halogen atom, or a group represented by Formula W, and at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W. Here, in a case where at least one of $R^{4e}$ or $R^{4f}$ is a group represented by Formula W, in W represented by $R^{4e}$ and $R^{4f}$, $L^W$ is a divalent linking group represented by Formula L-2 or L-3. The definition of a group represented by Formula W is as described above.

The case where at least one of $R^{4e}$ or $R^{4f}$ is a group represented by Formula W corresponds to a case where none of $R^{4e}$ and $R^{4f}$ are a hydrogen atom or a halogen atom.

In a case where at least one of $R^{4e}$ or $R^{4f}$ is a group represented by Formula W, in W represented by $R^{4e}$ or $R^{4f}$, $L^W$ is preferably a divalent linking group represented by Formula L-3.

In a case where at least one of $R^{4e}$ or $R^{4f}$ is a group represented by Formula W, both of $R^{4e}$ and $R^{4f}$ preferably represent a group represented by Formula W.

In a case where both of $R^{4e}$ and $R^{4f}$ represent a hydrogen atom or a halogen atom, $R^{4a}$ to $R^{4d}$, $R^{4g}$ to $R^{4k}$, and $R^{4m}$ each independently represent a hydrogen atom, a halogen atom, or a group represented by Formula W, and at least one or more out of $R^{4a}$, $R^{4b}$, $R^{4c}$, $R^{4d}$, $R^{4g}$, $R^{4h}$, $R^{4i}$, $R^{4j}$, $R^{4k}$, or $R^{4m}$ is a group represented by Formula W.

Examples of the halogen atom represented by $R^{4a}$ to $R^{4k}$ and $R^{4m}$ in Formula 4 include a fluorine atom, a chlorine atom, a bromine atom, and an iodine atom. The halogen atom is preferably a fluorine atom, a chlorine atom, or a bromine atom, more preferably a fluorine atom or a chlorine atom, and particularly preferably a fluorine atom.

In $R^{4a}$ to $R^{4k}$ and $R^{4m}$ in the compound represented by Formula 4, the number of halogen atoms is preferably 0 to 4, more preferably 0 to 2, even more preferably 0 or 1, and particularly preferably 0.

In the compound represented by Formula 4, among $R^{4a}$ to $R^{4k}$ and $R^{4m}$, the number of groups represented by Formula W is preferably 1 to 4 from the viewpoint of improving carrier mobility and improving solubility in an organic solvent, more preferably 1 or 2, and particularly preferably 2.

A group represented by Formula W can be positioned in any of $R^{4a}$ to $R^{4k}$ and $R^{4m}$ without particular limitation. In the present invention, from the viewpoint of improving carrier mobility and improving solubility in an organic solvent, it is preferable that, in Formula 4, $R^{4a}$, $R^{4d}$ to $R^{4g}$, $R^{4j}$, $R^{4k}$, and $R^{4m}$ each independently represent a hydrogen atom or a halogen atom, $R^{4b}$, $R^{4c}$, $R^{4h}$, and $R^{4i}$ each independently represent a hydrogen atom, a halogen atom, or a group represented by Formula W, and at least one of $R^{4b}$, $R^{4c}$, $R^{4h}$, or $R^{4i}$ is a group represented by Formula W.

In the present invention, it is more preferable that $R^{4a}$, $R^{4c}$ to $R^{4h}$, and $R^{4j}$ each independently represent a hydrogen atom or a halogen atom, $R^{4b}$ and $R^{4i}$ each independently represent a hydrogen atom, a halogen atom, or a group represented by Formula W, and at least one of $R^{4b}$ or $R^{4i}$ is a group represented by Formula W.

In the present invention, it is even more preferable that both of $R^{4b}$ and $R^{4i}$ represent a group represented by Formula W, both of $R^{4c}$ and $R^{4h}$ represent a hydrogen atom or a halogen atom, or both of $R^{4c}$ and $R^{4h}$ represent a group represented by Formula W, and both of $R^{4b}$ and $R^{4i}$ represent a hydrogen atom or a halogen atom.

In the present invention, it is particularly preferable that both of $R^{4b}$ and $R^{4i}$ represent a group represented by Formula W and both of $R^{4c}$ and $R^{4h}$ represent a hydrogen atom or a halogen atom, or both of $R^{4c}$ and $R^{4h}$ represent a group represented by Formula W and both of $R^{4b}$ and $R^{4i}$ represent a hydrogen atom and a halogen atom.

In Formula 4, two or more groups among $R^{4a}$ to $R^{4k}$ and $R^{4m}$ may or may not form a ring by being bonded to each other, but it is preferable that they do not form a ring by being bonded to each other.

—Compound Represented by Formula 5—

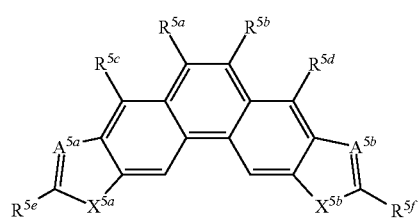

(5)

In Formula 5, $X^{5a}$ and $X^{5b}$ each independently represent $NR^{5i}$, an O atom, or a S atom. From the viewpoint of ease of synthesis, it is preferable that $X^{5a}$ and $X^{5b}$ each independently represent an O atom or a S atom. In contrast, from the viewpoint of improving carrier mobility, it is preferable that at least one of $X^{5a}$ or $X^{5b}$ is a S atom. It is preferable that $X^{5a}$ and $X^{5b}$ are the same linking groups. It is more preferable that both of $X^{5a}$ and $X^{5b}$ are S atoms.

$R^{5i}$ represents a hydrogen atom, an alkyl group, an alkenyl group, an alkynyl group, an acyl group, an aryl group, or a heteroaryl group. $R^{5i}$ is preferably a hydrogen atom, an alkyl group, an alkenyl group, an alkynyl group, or an acyl group, more preferably a hydrogen atom or an alkyl group, even more preferably an alkyl group having 1 to 14 carbon atoms, and preferably an alkyl group having 1 to 4 carbon atoms.

In a case where $R^{5i}$ is an alkyl group, the alkyl group may be linear, branched, or cyclic. It is preferable that $R^{5i}$ is a linear alkyl group, because then linearity of the molecule is improved, and hence carrier mobility can be improved.

In Formula 5, $A^{5a}$ represents $CR^{5g}$ or a N atom, $A^{5b}$ represents $CR^{5h}$ or a N atom, and $R^{5g}$ and $R^{5h}$ each independently represent a hydrogen atom or a substituent. It is preferable that $A^{5a}$ represents $CR^{5g}$ or $A^{5b}$ represents $CR^{5h}$. It is more preferable that $A^{5a}$ represents $CR^{5g}$ and $A^{5b}$ represents $CR^{5h}$. $A^{5a}$ and $A^{5b}$ may be the same as or different from each other, but it is preferable that they are the same as each other.

In Formula 5, $R^{5e}$ and $R^{5g}$ may or may not form a ring by being bonded to each other, but it is preferable that they do not form a ring by being bonded to each other.

In Formula 5, $R^{5e}$ and $R^{5i}$ may or may not form a ring by being bonded to each other, but it is preferable that they do not form a ring by being bonded to each other.

In Formula 5, $R^{5f}$ and $R^{5h}$ may or may not form a ring by being bonded to each other, but it is preferable that they do not form a ring by being bonded to each other.

In Formula 5, $R^{5f}$ and $R^{5i}$ may or may not form a ring by being bonded to each other, but it is preferable that they do not form a ring by being bonded to each other.

In Formula 5, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W.

Examples of the substituent represented by $R^{5a}$ to $R^{5h}$ include the substituent X described above. The definition of a group represented by Formula W is as described above.

In the compound represented by Formula 5, among $R^{5a}$ to $R^{5h}$, the number of groups represented by Formula W is preferably 1 to 4 from the viewpoint of improving carrier mobility and improving solubility in an organic solvent, more preferably 1 or 2, and particularly preferably 2.

A group represented by Formula W can be positioned in any of $R^{5a}$ to $R^{5h}$ without particular limitation. From the viewpoint of improving carrier mobility and improving solubility in an organic solvent, the group represented by Formula W is preferably positioned in $R^{5e}$ or $R^{5f}$.

Among $R^{5a}$ to $R^{5h}$, the number of substituents other than a group represented by Formula W is preferably 0 to 4, more preferably 0 to 2, particularly preferably 0 or 1, and more particularly preferably 0.

In a case where $R^{5a}$ to $R^{5h}$ represent substituents other than a group represented by Formula W, each of the substituents is preferably a group having a chain length of a linking group of equal to or less than 3.7 Å, more preferably a group having a chain length of a linking group of 1.0 to 3.7 Å, even more preferably a group having a chain length of a linking group of 1.0 to 2.1 Å. The definition of a chain length of a linking group is as described above.

In a case where $R^{5a}$ to $R^{5h}$ represent substituents other than a group represented by Formula W, the substituents each independently preferably represent a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, and more preferably represent a substituted or unsubstituted alkyl group having two or less carbon atoms.

In a case where $R^{5a}$ to $R^{5h}$ represent substituents other than a group represented by Formula W, and the substituents each independently represent a substituted alkyl group having two or less carbon atoms, examples of substituents that the alkyl group can have include a cyano group, a fluorine atom, a deuterium atom, and the like. Among these, a cyano group is preferable. In a case where $R^{5a}$ to $R^{5h}$ represent substituents other than a group represented by Formula W, the substituted or unsubstituted alkyl group having two or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{5a}$ to $R^{5h}$ represent substituents other than a group represented by Formula W, and the substituents each independently represent a substituted alkynyl group having two or less carbon atoms, examples of substituents that the alkynyl group can have include a deuterium atom and the like. In a case where $R^{5a}$ to $R^{5h}$ represent substituents other than a substituent represented by Formula W, examples of the substituted or unsubstituted alkynyl group having two or less carbon atoms that is represented by each of the substituents include an ethynyl group or an acetylene group substituted with a deuterium atom. Between these, an ethynyl group is preferable.

In a case where $R^{5a}$ to $R^{5h}$ represent substituents other than a group represented by Formula W, and the substituents each independently represent a substituted alkenyl group having two or less carbon atoms, examples of substituents that the alkenyl group can have include deuterium atom and the like. In a case where $R^{5a}$ to $R^{5h}$ represent substituents other than a group represented by Formula W, examples of the substituted or unsubstituted alkenyl group having two or less carbon atoms that is represented by each of the substituents include an ethenyl group and an ethenyl group substituted with a deuterium atom. Between these, an ethenyl group is preferable.

In a case where $R^{5a}$ to $R^{5h}$ represent substituents other than a group represented by Formula W, and the substituents each independently represent a substituted acyl group having two or less carbon atoms, examples of substituents that the acyl group can have include a fluorine atom and the like. In a case where $R^{5a}$ to $R^{5h}$ represent substituents other than a group represented by Formula W, examples of the substituted or unsubstituted acyl group having two or less carbon atoms that is represented by each of the substituents include a formyl group, an acetyl group, and an acetyl group substituted with a fluorine atom. Among these, a formyl group is preferable.

—Compound Represented by Formula 6—

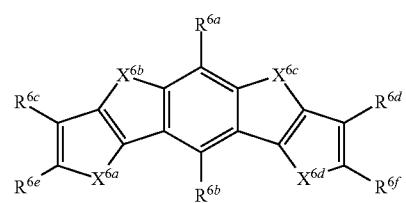

(6)

In Formula 6, $X^{6a}$ to $X^{6d}$ each independently represent $NR^{6g}$, an O atom, or a S atom, and $R^{6g}$ represents a hydrogen atom, an alkyl group, an alkenyl group, an alkynyl group, an acyl group, an aryl group, or a heteroaryl group.

From the viewpoint of ease of synthesis, it is preferable that $X^{6a}$ to $X^{6d}$ each independently represent an O atom or a S atom. In contrast, from the viewpoint of improving carrier mobility, at least one of $X^{6a}$, $X^{6b}$, $X^{6c}$, or $X^{6d}$ is a S atom. It is preferable that $X^{6a}$ to $X^{6d}$ are the same linking groups. It is more preferable that all of $X^{6a}$ to $X^{6d}$ are S atoms.

$R^{6g}$ represents a hydrogen atom, an alkyl group, an alkenyl group, an alkynyl group, an acyl group, an aryl group, or a heteroaryl group. $R^{6g}$ is preferably a hydrogen atom, an alkyl group, an alkenyl group, an alkynyl group, or an acyl group, more preferably a hydrogen atom or an alkyl group, even more preferably an alkyl group having 1 to 14 carbon atoms, and particularly preferably an alkyl group having 1 to 4 carbon atoms.

In a case where $R^{6g}$ represents an alkyl group, the alkyl group may be linear, branched, or cyclic. However, it is preferable that $R^{6g}$ is a linear alkyl group, because then linearity of the molecule is improved, and hence carrier mobility can be improved.

In Formula 6, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ represents a group represented by Formula W.

Examples of the substituents represented by $R^{6a}$ to $R^{6f}$ include the substituent X described above. The definition of a group represented by Formula W is as described above.

Among the substituents, the substituent that $R^{6a}$ to $R^{6f}$ can each independently represent is preferably an alkyl group, an aryl group, an alkenyl group, an alkynyl group, a heterocyclic group, an alkoxy group, an alkylthio group, or a group represented by Formula W, more preferably an alkyl group having 1 to 12 carbon atoms, an aryl group having 6 to 20 carbon atoms, an alkenyl group having 2 to 12 carbon atoms, an alkynyl group having 2 to 12 carbon atoms, an alkoxy group having 1 to 11 carbon atoms, a heterocyclic group having 5 to 12 carbon atoms, an alkylthio group having 1 to 12 carbon atoms, or a group represented by Formula W, even more preferably a group, which will be described later, having a chain length of a linking group of equal to or less than 3.7 Å or a group represented by Formula W, and particularly preferably a group represented by Formula W.

In the compound represented by Formula 6, among $R^{6a}$ to $R^{6f}$, the number of groups represented by Formula W is preferably 1 to 4 from the viewpoint of improving carrier mobility and improving solubility in an organic solvent, more preferably 1 or 2, and particularly preferably 2.

A group represented by Formula W can be positioned in any of $R^{6a}$ to $R^{6f}$ without particular limitation, but the group represented by Formula W is preferably positioned in $R^{6c}$ to $R^{6f}$. From the viewpoint of improving carrier mobility and improving solubility in an organic solvent, the group represented by Formula W is more preferably positioned in $R^{6e}$ or $R^{6f}$.

Among $R^{6a}$ to $R^{6f}$, the number of substituents other than a group represented by Formula W is preferably 0 to 4, more preferably 0 to 2, even more preferably 0 or 1, and particularly preferably 0.

In a case where $R^{6a}$ to $R^{6f}$ represent substituents other than a group represented by Formula W, each of the substituents is preferably a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

In a case where $R^{6a}$ to $R^{6f}$ represent substituents other than a group represented by Formula W, the substituents each independently preferably represent a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, and more preferably a substituted or unsubstituted alkyl group having two or less carbon atoms.

In a case where $R^{6a}$ to $R^{6f}$ represent substituents other than a group represented by Formula W, and the substituents each independently represent a substituted alkyl group having two or less carbon atoms, examples of substituents that the alkyl group can have include a cyano group, a fluorine atom, a deuterium atom, and the like. Among these, a cyano group is preferable. In a case where $R^{6a}$ to $R^{6f}$ represent substituents other than a group represented by Formula W, the substituted or unsubstituted alkyl group having two or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{6a}$ to $R^{6f}$ represent substituents other than a group represented by Formula W, and the substituents each independently represent a substituted alkynyl group having two or less carbon atoms, examples of substituents that the alkynyl group can have include a deuterium atom and the like. In a case where $R^{6a}$ to $R^{6f}$ represent substituents other than a group represented by Formula W, examples of the substituted or unsubstituted alkynyl group having two or less carbon atoms that is represented by each of the substituents include an ethynyl group and an acetylene group substituted with a deuterium atom. Between these, an ethynyl group is preferable.

In a case where $R^{6a}$ to $R^{6f}$ represent substituents other than a group represented by Formula W, and the substituents each independently represent a substituted alkenyl group having two or less carbon atoms, examples of substituents that the alkenyl group can have include a deuterium atom and the like. In a case where $R^{6a}$ to $R^{6f}$ represent substituents other than a group represented by Formula W, examples of the substituted or unsubstituted alkenyl group having two or less carbon atoms that is represented by each of the substituents include ethenyl group and an ethenyl group substituted with a deuterium atom. Among these, an ethenyl group is preferable.

In a case where $R^{6a}$ to $R^{6f}$ represent substituents other than a group represented by Formula W, and the substituents each independently represent a substituted acyl group having two or less carbon atoms, examples of substituents that the acyl group can have include a fluorine atom and the like. In a case where $R^{6a}$ to $R^{6f}$ represent substituents other than a group represented by Formula W, examples of the substituted or unsubstituted acyl group having two or less carbon atoms that is represented by each of the substituents include a formyl group, an acetyl group, and an acetyl group substituted with a fluorine atom. Among these, a formyl group is preferable.

—Compound Represented by Formula 7—

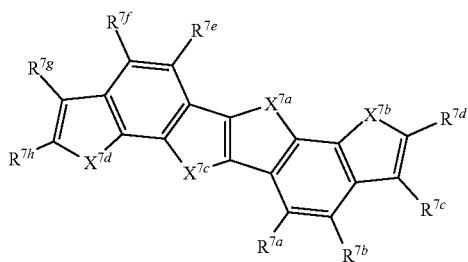

(7)

In Formula 7, $X^{7a}$ and $X^{7c}$ each independently represent a S atom, an O atom, a Se atom, or $NR^{7i}$ (>N—$R^{7i}$), and $X^{7b}$ and $X^{7d}$ each independently represent a S atom, an O atom, or a Se atom. From the viewpoint of ease of synthesis, it is preferable that $X^{7a}$ to $X^{7d}$ each independently represent an O atom or a S atom. In contrast, from the viewpoint of improving carrier mobility, it is preferable that at least one of $X^{7a}$, $X^{7b}$, $X^{7c}$, or $X^{7d}$ is a S atom. It is preferable that $X^{7a}$ to $X^{7d}$ are the same linking groups. It is more preferable that all of $X^{7a}$ to $X^{7d}$ are S atoms.

In Formula 7, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W.

Examples of the substituent represented by $R^{7a}$ to $R^{7i}$ include the substituent X described above. The definition of a group represented by Formula W is as described above.

$R^{7i}$ is preferably a hydrogen atom or an alkyl group, more preferably an alkyl group having 5 to 12 carbon atoms, and particularly preferably an alkyl group having 8 to 10 carbon atoms.

In a case where $R^{7i}$ represents an alkyl group, the alkyl group may be linear, branched, or cyclic. However, from the viewpoint of overlapping of HOMO, it is preferable that $R^{7i}$ is a linear alkyl group.

In $R^{7a}$ to $R^{7i}$ in the compound represented by Formula 7, the number of substituents represented by Formula W is preferably 1 to 4 from the viewpoint of improving mobility and improving solubility in an organic solvent, more preferably 1 or 2, and particularly preferably 2.

A group represented by Formula W can be positioned in any of $R^{7a}$ to $R^{7i}$ without particular limitation. The group represented by Formula W is preferably positioned in $R^{7d}$ or $R^{7h}$ from the viewpoint of improving mobility and improving solubility in an organic solvent, and more preferably positioned in $R^{7d}$ and $R^{7h}$.

Among $R^{7a}$ to $R^{7i}$ of Formula 7, the number of substituents other than a group represented by Formula W is preferably 0 to 4, more preferably 0 to 2, even more preferably 0 or 1, and particularly preferably 0.

In a case where $R^{7a}$ to $R^{7i}$ are substituents other than a group represented by Formula W, each of the substituents is preferably a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

In a case where $R^{7a}$ to $R^{7i}$ are substituents other than a group represented by Formula W, the substituents each independently preferably represent a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, and more preferably represent a substituted or unsubstituted alkyl group having two or less carbon atoms.

In a case where $R^{7a}$ to $R^{7i}$ are substituents other than a group represented by Formula W, and the substituents each independently represent a substituted alkyl group having two or less carbon atoms, examples of substituents that the alkyl group can have include a cyano group, a fluorine atom, a deuterium atom, and the like. Among these, a cyano group is preferable. In a case where $R^{7a}$ to $R^{7i}$ are substituents other than a group represented by Formula W, the substituted or unsubstituted alkyl group having two or less carbon atoms that is represented by each of the substituents is preferably a methyl group, an ethyl group, or a methyl group substituted with a cyano group, more preferably a methyl group or a methyl group substituted with a cyano group, and particularly preferably a methyl group substituted with a cyano group.

In a case where $R^{7a}$ to $R^{7i}$ are substituents other than a group represented by Formula W, and the substituents each independently represent a substituted alkynyl group having two or less carbon atoms, examples of substituents that the alkynyl group can have include a deuterium atom and the like. In a case where $R^{7a}$ to $R^{7i}$ are substituents other than a substituent represented by Formula W, examples of the substituted or unsubstituted alkynyl group having two or less carbon atoms that is represented by each of the substituents include an ethynyl group and an acetylene group substituted with a deuterium atom. Between these, an ethynyl group is preferable.

In a case where $R^{7a}$ to $R^{7i}$ are substituents other than a group represented by Formula W, and the substituents each independently represent a substituted alkenyl group having two or less carbon atoms, examples of substituents that the alkenyl group can have include a deuterium atom and the like. In a case where $R^{7a}$ to $R^{7i}$ are substituents other than a substituent represented by Formula W, examples of the substituted or unsubstituted alkenyl group having two or less carbon atoms that is represented by each of the substituents include an ethenyl group and an ethenyl group substituted with a deuterium atom. Between these, an ethenyl group is preferable.

In a case where $R^{7a}$ to $R^{7i}$ are substituents other than a group represented by Formula W, and the substituents each independently represent a substituted acyl group having two or less carbon atoms, examples of substituents that the acyl group can have include a fluorine atom and the like. In a case where $R^{7a}$ to $R^{7i}$ are substituents other than a substituent represented by Formula W, examples of the substituted or unsubstituted acyl group having two or less carbon atoms that is represented by each of the substituents include a formyl group, an acetyl group, and an acetyl group substituted with a fluorine atom. Among these, a formyl group is preferable.

—Compound Represented by Formula 8—

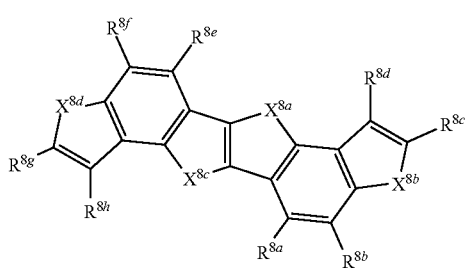

(8)

In Formula 8, $X^{8a}$ and $X^{8c}$ each independently represent a S atom, an O atom, a Se atom, or $NR^{8i}$, and $X^{8b}$ and $X^{8d}$ each independently represent a S atom, an O atom, or a Se atom. From the viewpoint of ease of synthesis, it is preferable that $X^{8a}$ to $X^{8d}$ each independently represent an O atom or a S atom. In contrast, from the viewpoint of improving carrier mobility, it is preferable that at least one of $X^{8a}$, $X^{8b}$, $X^{8c}$, or $X^{8d}$ is a S atom. It is preferable that $X^{8a}$ to $X^{8d}$ are the same linking groups. It is more preferable that all of $X^{8a}$ to $X^{8d}$ are S atoms.

In Formula 8, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W.

Examples of the substituent represented by $R^{8a}$ to $R^{8i}$ include the substituent X described above. The definition of a group represented by Formula W is as described above.

$R^{8i}$ is preferably a hydrogen atom or an alkyl group, more preferably an alkyl group having 5 to 12 carbon atoms, and particularly preferably an alkyl group having 8 to 10 carbon atoms.

In a case where $R^{8i}$ is an alkyl group, the alkyl group may be linear, branched, or cyclic. From the viewpoint of the overlapping of HOMO, $R^{8i}$ is preferably a linear alkyl group.

In the compound represented by Formula 8, among $R^{8a}$ to $R^{8i}$, the number of substituents represented by Formula W is preferably 1 to 4 from the viewpoint of improving carrier mobility and improving solubility in an organic solvent, more preferably 1 or 2, and particularly preferably 2.

A group represented by Formula W can be positioned in any of $R^{8a}$ to $R^{8i}$ without particular limitation. The group represented by Formula W is preferably positioned in $R^{8c}$ or $R^{8g}$ from the viewpoint of improving carrier mobility and improving solubility in an organic solvent, and more preferably positioned in $R^{8c}$ and $R^{8g}$.

Among $R^{8a}$ to $R^{8i}$ of Formula 8, the number of substituents other than a group represented by Formula W is preferably 0 to 4, more preferably 0 to 2, even more preferably 0 or 1, and particularly preferably 0.

In a case where $R^{8a}$ to $R^{8i}$ are substituents other than a group represented by Formula W, each of the substituents is preferably a group having a chain length of a linking group of equal to or less than 3.7 Å, more preferably a group having a chain length of a linking group of 1.0 to 3.7 Å, and even more preferably a group having a chain length of a linking group of 1.0 to 2.1 Å. The definition of a chain length of a linking group is as described above.

In a case where $R^{8a}$ to $R^{8i}$ are substituents other than a group represented by Formula W, the substituents each independently preferably represent a substituted or unsubstituted alkyl group having two or less carbon atoms, a substituted or unsubstituted alkynyl group having two or less carbon atoms, a substituted or unsubstituted alkenyl group having two or less carbon atoms, or a substituted or unsubstituted acyl group having two or less carbon atoms, and more preferably represent a substituted or unsubstituted alkyl group having two or less carbon atoms.

In a case where $R^{8a}$ to $R^{8i}$ are substituents other than a group represented by Formula W, and the substituents each independently represent a substituted alkyl group having two or less carbon atoms, examples of substituents that the alkyl group can have include a cyano group, a fluorine atom, a deuterium atom, and the like. Among these, a cyano group is preferable. In a case where $R^{8a}$ to $R^{8i}$ are substituents other than a group represented by Formula W, the substituted or unsubstituted alkyl group having two or less carbon atoms that is represented by each of the substituents is preferably methyl group, an ethyl group, or a methyl group substituted with a cyano group, more preferably a methyl group or a methyl group substituted with a cyano group, and particularly preferably a methyl group substituted with a cyano group.

In a case where $R^{8a}$ to $R^{8i}$ are substituents other than a group represented by Formula W, and the substituents each independently represent a substituted alkynyl group having two or less carbon atoms, examples of substituents that the alkynyl group can have include a deuterium atom and the like. In a case where $R^{8a}$ to $R^{8i}$ are substituents other than a group represented by Formula W, examples of the substituted or unsubstituted alkynyl group having two or less carbon atoms that is represented by each of the substituents include an ethynyl group and an acetylene group substituted with a deuterium atom. Between these, an ethynyl group is preferable.

In a case where $R^{8a}$ to $R^{8i}$ are substituents other than a group represented by Formula W, and the substituents each independently represent a substituted alkenyl group having two or less carbon atoms, examples of substituents that the alkenyl group can have include a deuterium atom and the like. In a case where $R^{8a}$ to $R^{8i}$ are substituents other than a group represented by Formula W, examples of the substituted or unsubstituted alkenyl group having two or less carbon atoms that is represented by each of the substituents include an ethenyl group and an ethenyl group substituted with a deuterium atom. Between these, an ethenyl group is preferable.

In a case where $R^{8a}$ to $R^{8i}$ are substituents other than a group represented by Formula W, and the substituents each independently represent a substituted acyl group having two or less carbon atoms, examples of substituents that the acyl group can have include a fluorine atom and the like. In a case where $R^{8a}$ to $R^{8i}$ are substituents other than a group represented by Formula W, examples of the substituted or unsubstituted acyl group having two or less carbon atoms that is represented by each of the substituents include a formyl group, an acetyl group, and an acetyl group substituted with a fluorine atom. Among these, a formyl group is preferable.

—Compound Represented by Formula 9—

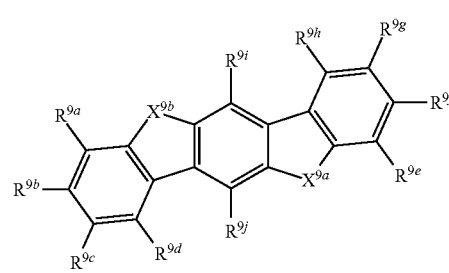

(9)

In Formula 9, $X^{9a}$ and $X^{9b}$ each independently represent an O atom, a S atom, or a Se atom. Among these, a S atom is preferable.

$R^{9c}$, $R^{9d}$, and $R^{9g}$ to $R^{9j}$ each independently represent a hydrogen atom, a halogen atom, or a substituent represented by Formula W. The definition of a group represented by Formula W is as described above.

$R^{9a}$, $R^{9b}$, $R^{9e}$, and $R^{9f}$ each independently represent a hydrogen atom or a substituent. Examples of the substituent represented by $R^{9a}$, $R^{9b}$, $R^{9e}$, and $R^{9f}$ include the substituent X described above.

It is preferable that $R^{9c}$, $R^{9d}$, and $R^{9g}$ to $R^{9j}$ each independently represent a hydrogen atom, a halogen atom, or a group represented by Formula W (here, $L^W$ is a group represented by any one of Formulae L-3, L-5, L-7 to L-9, and L-12 to L-24). Among these, $R^{9c}$, $R^{9d}$, and $R^{9g}$ to $R^{9j}$ are more preferably represent a hydrogen atom.

$L^W$ is preferably a group represented by any one of Formulae L-3, L-5, L-13, L-17, and L-18.

It is preferable that at least one of $R^{9a}$, $R^{9b}$, $R^{9c}$, $R^{9d}$, $R^{9e}$, $R^{9f}$, $R^{9g}$, $R^{9h}$, or $R^{9i}$ is a group represented by Formula W.

In the compound represented by Formula 9, among $R^{9a}$ to $R^{9i}$, the number of substituents represented by Formula W is preferably 1 to 4 from the viewpoint of improving carrier mobility and improving solubility in an organic solvent, more preferably 1 or 2, and particularly preferably 2.

A group represented by Formula W can be positioned in any of $R^{9a}$ to $R^{9i}$ without particular limitation. The group represented by Formula W is preferably positioned in $R^{9b}$ or $R^{9f}$ from the viewpoint of improving carrier mobility and improving solubility in an organic solvent, and more preferably positioned in $R^{9b}$ and $R^{9f}$.

Among $R^{9a}$ to $R^{9i}$ of Formula 9, the number of substituents other than a group represented by Formula W is preferably 0 to 4, more preferably 0 to 2, particularly preferably 0 or 1, and more particularly preferably 0.

—Compound Represented by Formula 10—

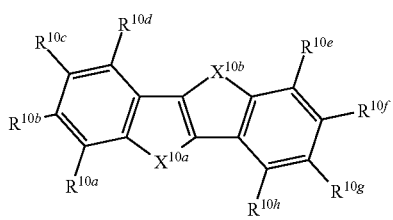

(10)

In Formula 10, $R^{10a}$ to $R^{10h}$ each independently represent a hydrogen atom or a substituent, and at least one of $R^{10a}$, $R^{10b}$, $R^{10c}$, $R^{10d}$, $R^{10e}$, $R^{10f}$, $R^{10g}$, or $R^{10h}$ represents a group represented by Formula W. Examples of the substituent represented by $R^{10a}$ to $R^{10h}$ include the substituent X described above. The definition of a substituent represented by Formula W is as described above.

It is preferable that $R^{10a}$ to $R^{10h}$ each independently represent a hydrogen atom, a halogen atom, or a substituent, and at least one of $R^{10a}$, $R^{10b}$, $R^{10c}$, $R^{10d}$, $R^{10e}$, $R^{10f}$, $R^{10g}$, or $R^{10h}$ is a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group.

Among $R^{10a}$ to $R^{10h}$ of Formula 10, at least one of $R^{10b}$ or $R^{10f}$ is preferably a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, and more preferably a substituted or unsubstituted arylthio group or a substituted or unsubstituted heteroaryl group. It is even more preferable that both of $R^{10b}$ and $R^{10f}$ represent a substituted or unsubstituted arylthio group or a substituted or unsubstituted heteroarylthio group. It is particularly preferable that both of $R^{10b}$ and $R^{10f}$ represent a substituted or unsubstituted phenylthio group or a heteroarylthio group selected from the following group A. It is the most preferable that both of $R^{10b}$ and $R^{10f}$ represent a substituted or unsubstituted phenylthio group or a heteroarylthio group represented by the following Formula A-17, A-18, or A-20.

The arylthio group is preferably a group in which a sulfur atom is linked to an aryl group having 6 to 20 carbon atoms, more preferably a naphthylthio group or a phenylthio group, and particularly preferably a phenylthio group.

The heteroarylthio group is preferably a group in which a sulfur atom is linked to a 3- to 10-membered heteroaryl group, more preferably a group in which a sulfur atom is linked to a 5- or 6-membered heteroaryl group, and particularly preferably the following group A.

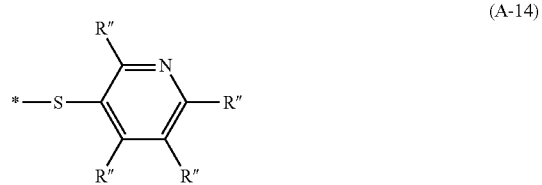

(A-14)

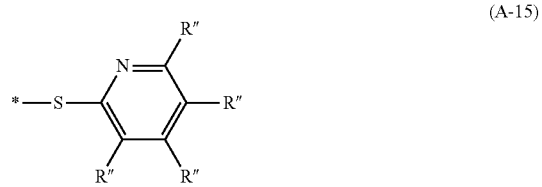

(A-15)

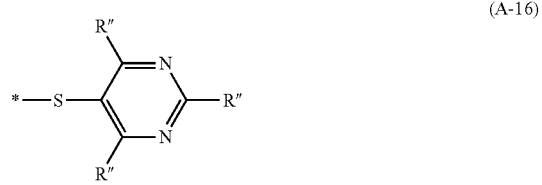

(A-16)

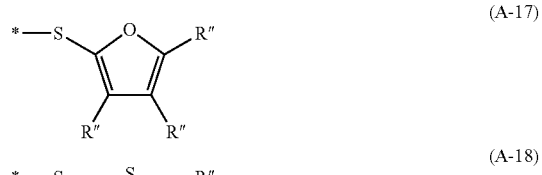

(A-17)

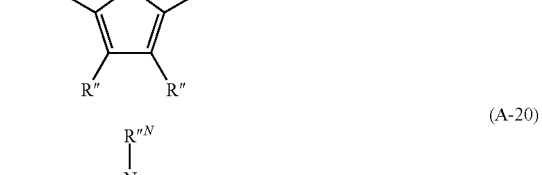

(A-18)

(A-20)

-continued

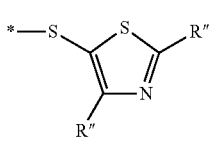
(A-21)

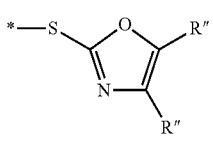
(A-23)

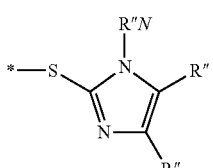
(A-24)

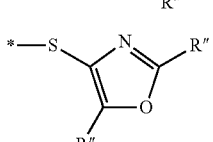
(A-26)

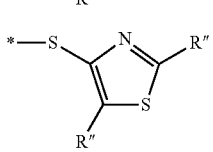
(A-27)

In the group A, R″ and R″$^N$ each independently represent a hydrogen atom or a substituent.

It is preferable that R′ in the group A each independently represents a hydrogen atom or a group represented by Formula W.

R″$^N$ in the group A preferably represents a substituent, more preferably represents an alkyl group, an aryl group, or a heteroaryl group, even more preferably represents an alkyl group, an aryl group substituted with an alkyl group, or a heteroaryl group substituted with an alkyl group, and particularly preferably represents an alkyl group having 1 to 4 carbon atoms, a phenyl group substituted with an alkyl group having 1 to 4 carbon atoms, or a 5-membered heteroaryl group substituted with an alkyl group having 1 to 4 carbon atoms.

As the alkyloxycarbonyl group, a group in which a carbonyl group is linked to an alkyl group having 1 to 20 carbon atoms is preferable. The number of carbon atoms of the alkyl group is more preferably 2 to 15, and particularly preferably 5 to 10.

As the aryloxycarbonyl group, a group in which a carbonyl group is linked to an aryl group having 6 to 20 carbon atoms is preferable. The number of carbon atoms of the aryl group is more preferably 6 to 15, and particularly preferably 8 to 12.

As the alkylamino group, a group in which an amino group is linked to an alkyl group having 1 to 20 carbon atoms is preferable. The number of carbon atoms of the alkyl group is more preferably 2 to 15, and particularly preferably 5 to 10.

Among $R^{10a}$ to $R^{10h}$, the number of substituents (hereinafter, referred to as other substituents as well) other than a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group is preferably 0 to 4, more preferably 0 to 2, particularly preferably 0 or 1, and more particularly preferably 0.

$X^{10a}$ and $X^{10b}$ each independently represent a S atom, an O atom, a Se atom, or NR$^x$ (>N—R$^x$). From the viewpoint of improving carrier mobility, it is preferable that at least one of $X^{10a}$ or $X^{10b}$ is a S atom. It is preferable that $X^{10a}$ and $X^{10b}$ are the same linking groups. It is more preferable that both of $X^{10a}$ and $X^{10b}$ are S atoms.

$R^x$ each independently represents a hydrogen atom or a group represented by Formula W. The definition of a group represented by Formula W is as described above.

—Compound Represented by Formula 11—

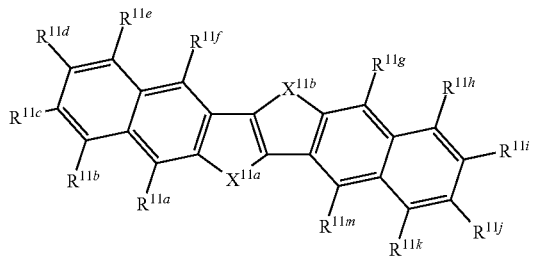

(11)

In Formula 11, $X^{11a}$ from and $X^{11b}$ each independently represent a S atom, an O atom, a Se atom, or NR$^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ represents a group represented by Formula W. Examples of the substituent include the substituent X described above. The definition of a substituent represented by Formula W is as described above.

In Formula 11, from the viewpoint of improving carrier mobility, at least one of $X^{11a}$ or $X^{11b}$ is a S atom. It is preferable that $X^{11a}$ and $X^{11b}$ are the same linking groups. It is more preferable that both of $X^{11a}$ and $X^{11b}$ are S atoms.

Among $R^{11a}$ to $R^{11k}$ and $R^{11m}$ of Formula 11, at least one of $R^{11c}$ or $R^{11i}$ is preferably a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group and more preferably a substituted or unsubstituted alkyl group. It is even more preferable that both of $R^{11c}$ and $R^{11i}$ represent a substituted or unsubstituted alkyl group.

—Compound Represented by Formula 12—

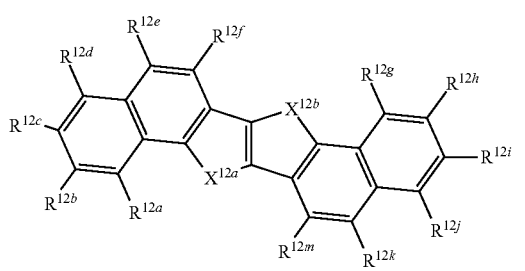

(12)

In Formula 12, $X^{12a}$ and $X^{12b}$ each independently represent a S atom, an O atom, a Se atom, or $NR^{12n}$, $R^{12a}$ to $R^{12k}$, $R^{12m}$ and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ represents a group represented by Formula W. Examples of the substituent include the substituent X described above. The definition of a substituent represented by Formula W is as described above.

In Formula 12, from the viewpoint of improving mobility, at least one of $X^{12a}$ or $X^{12b}$ is preferably a S atom. It is preferable that $X^{12a}$ and $X^{12b}$ are the same linking groups. It is more preferable that both of $X^{12a}$ and $X^{12b}$ are S atoms.

Among $R^{12a}$ to $R^{12k}$ and $R^{12m}$ of Formula 12, at least one of $R^{12c}$ or $R^{12i}$ is preferably a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, and more preferably a substituted or unsubstituted alkyl group. It is even more preferable that both of $R^{12c}$ and $R^{12i}$ represent a substituted or unsubstituted alkyl group.

—Compound Represented by Formula 13—

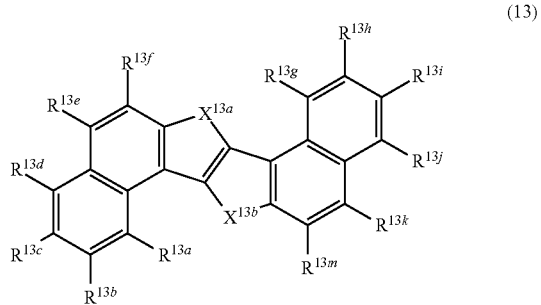

(13)

In Formula 13, $X^{13a}$ and $X^{13b}$ each independently represent a S atom, an O atom, a Se substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ represents a group represented by Formula W. Examples of the substituent include the substituent X described above. The definition of a group represented by Formula W is as described above.

In Formula 13, from the viewpoint of improving carrier mobility, at least one of $X^{13a}$ or $X^{13b}$ is preferably a S atom. It is preferable that $X^{13a}$ and $X^{13b}$ are the same linking groups. It is more preferable that both of $X^{13a}$ and $X^{13b}$ are S atoms.

Among $R^{13a}$ to $R^{13k}$ and $R^{13m}$ of Formula 13, at least one of $R^{13c}$ or $R^{13i}$ is preferably a substituted or unsubstituted alkyl group, a substituted or unsubstituted arylthio group, a substituted or unsubstituted heteroarylthio group, a substituted or unsubstituted alkyloxycarbonyl group, a substituted or unsubstituted aryloxycarbonyl group, or a substituted or unsubstituted alkylamino group, and more preferably a substituted or unsubstituted alkyl group. It is even more preferable that both of $R^{13c}$ and $R^{13i}$ represent a substituted or unsubstituted alkyl group.

—Compound Represented by Formula 14—

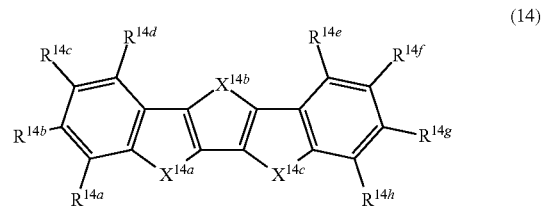

(14)

In Formula 14, $X^{14a}$ to $X^{14}$ each independently represent a S atom, an O atom, a Se atom, or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ represents a group represented by Formula W. Examples of the substituent include the substituent X described above. The definition of a group represented by Formula W is as described above.

In a case where at least one of $R^{14a}$, $R^{14b}$, $R^{14c}$, $R^{14d}$, $R^{14e}$, $R^{14f}$, $R^{14g}$, or $R^{14h}$ is a group represented by Formula W, and $R^W$ is an alkyl group, $L^W$ is preferably a group represented by any one of Formulae L-2 to L-25.

In Formula 14, from the viewpoint of improving carrier mobility, it is preferable that at least one of $X^{14a}$, $X^{14b}$, or $X^{14c}$ is a S atom. It is preferable that $X^{14a}$ to $X^{14c}$ are the same linking groups. It is more preferable that all of $X^{14a}$ to $X^{14c}$ are S atoms.

In a case where $R^W$ is an alkyl group, $L^W$ is preferably a group represented by any one of Formulae L-2 to L-5, L-13, L-17, and L-18, and more preferably a group represented by any one of Formulae L-3, L-13, and L-18.

Among $R^{14a}$ to $R^{14h}$ of Formula 14, at least one of $R^{14b}$ or $R^{14g}$ is preferably a group represented by Formula W. It is more preferable that both of $R^{14b}$ and $R^{14g}$ represent a group represented by Formula W.

—Compound Represented by Formula 15—

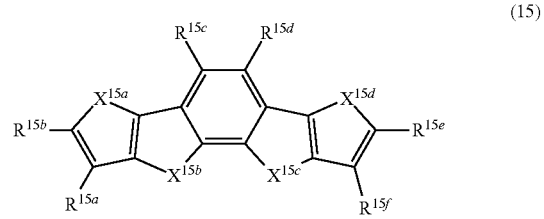

(15)

In Formula 15, $X^{15a}$ to $X^{15d}$ each independently represent a S atom, an O atom, a Se atom, or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ represents a group represented by Formula W. Examples of the substituent include the substituent X described above. The definition of a group represented by Formula W is as described above.

In Formula 15, from the viewpoint of improving carrier mobility, at least one of $X^{15a}$, $X^{15b}$, $X^{15c}$, or $X^{15d}$ is preferably a S atom. It is preferable that $X^{15a}$ to $X^{15d}$ are the same linking groups. It is more preferable that all of $X^{15a}$ to $X^{15d}$ are S atoms.

Among $R^{15a}$ to $R^{15f}$ of Formula 15, at least one of $R^{15b}$ or $R^{15e}$ is preferably a group represented by Formula W. It is more preferable that both of $R^{15b}$ and $R^{15e}$ represent a group represented by Formula W.

—Compound Represented by Formula 16—

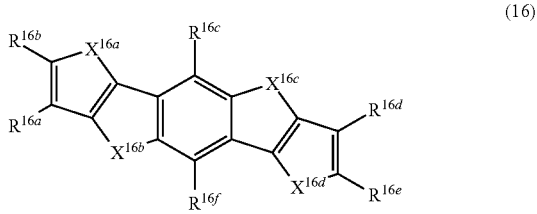

(16)

In Formula 16, $X^{16a}$ to $X^{16d}$ each independently represent a S atom, an O atom, a Se atom, or $NR^{16g}$. $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ represents a group represented by Formula W. Examples of the substituent include the substituent X described above. The definition of a group represented by Formula W is as described above.

$R^{16c}$ and $R^{16f}$ preferably represent a hydrogen atom, a halogen atom, or a group represented by Formula W (here, $L^W$ is a group represented by any one of Formulae L-3, L-5, L-7 to L-9, and L-12 to L-24). It is preferable that $R^{16a}$, $R^{16b}$, $R^{16d}$, $R^{16e}$, and $R^{16g}$ each independently represent a hydrogen atom or a substituent.

In Formula 16, $L^W$ is a group represented by any one of Formulae L-3, L-5, L-7 to L-9, and L-12 to L-24. In a case where $R^{16c}$ and $R^{16f}$ each independently represent a group represented by Formula W, $L^W$ is preferably a group represented by any one of Formulae L-3, L-5, L-13, L-17, and L-18.

In Formula 16, from the viewpoint of improving carrier mobility, at least one of $X^{16a}$, $X^{16b}$, $X^{16c}$, or $X^{16d}$ is a S atom. It is preferable that $X^{16a}$ to $X^{16d}$ are the same linking groups. It is more preferable that all of $X^{16a}$ to $X^{16d}$ are S atoms.

It is preferable that at least one of $R^{16a}$ or $R^{16d}$ among $R^{16a}$ to $R^{16f}$ of Formula 16 represents a group represented by Formula W. It is more preferable that both of $R^{16a}$ and $R^{16d}$ represent a group represented by Formula W.

Furthermore, it is preferable that $R^{16c}$ and $R^{16f}$ represent a hydrogen atom.

The component A preferably has an alkyl group, more preferably has an alkyl group having 6 to 20 carbon atoms, and even more preferably has an alkyl group having 7 to 14 carbon atoms, on a condensed polycyclic aromatic ring in the aforementioned condensed polycyclic aromatic group. If the above aspect is adopted, mobility and heat stability of the obtained organic semiconductor are further improved.

The component A preferably has one or more alkyl groups, more preferably has 2 to 4 alkyl groups, and even more preferably has 2 alkyl groups, on a condensed polycyclic aromatic ring in the aforementioned condensed polycyclic aromatic group. If the above aspect is adopted, mobility and heat stability of the obtained organic semiconductor are further improved.

A molecular weight of the component A is not particularly limited, but is preferably equal to or less than 3,000, more preferably equal to or less than 2,000, even more preferably equal to or less than 1,000, and particularly preferably equal to or less than 850. If the molecular weight is equal to or less than the upper limit described above, solubility in an organic solvent can be improved. In contrast, from the viewpoint of film quality stability of a thin film, the molecular weight is preferably equal to or greater than 300, more preferably equal to or greater than 350, and even more preferably equal to or greater than 400.

A method for synthesizing the component A is not particularly limited, and the component A can be synthesized with reference to known methods. Examples of methods for synthesizing the compounds represented by Formulae 1 to 16 include the methods disclosed in Journal of American Chemical Society, 116, 925 (1994), Journal of Chemical Society, 221 (1951), Org. Lett., 2001, 3, 3471, Macromolecules, 2010, 43, 6264, Tetrahedron, 2002, 58, 10197, JP2012-513459A, JP2011-46687A, Journal of Chemical Research. Miniprint, 3, 601-635 (1991), Bull. Chem. Soc. Japan, 64, 3682-3686 (1991), Tetrahedron Letters, 45, 2801-2803 (2004), EP2251342A, EP2301926A, EP2301921A, KR10-2012-0120886A, J. Org. Chem., 2011, 696, Org. Lett., 2001, 3, 3471, Macromolecules, 2010, 43, 6264, J. Org. Chem., 2013, 78, 7741, Chem. Eur. J., 2013, 19, 3721, Bull. Chem. Soc. Jpn., 1987, 60, 4187, J. Am. Chem. Soc., 2011, 133, 5024, Chem. Eur. J. 2013, 19, 3721, Macromolecules, 2010, 43, 6264-6267, J. Am. Chem. Soc., 2012, 134, 16548-16550, and the like.

From the viewpoint of mobility in an organic semiconductor, the component A preferably contains at least one kind of compound represented by any one of Formulae 1 to 9, 14, and 15.

Specific preferred examples of the component A will be shown below, but it goes without saying that the present invention is not limited thereto.

OSC-1

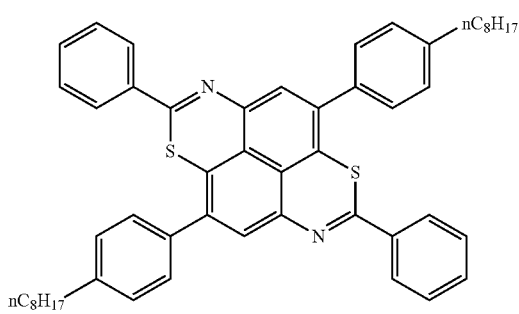

OSC-2

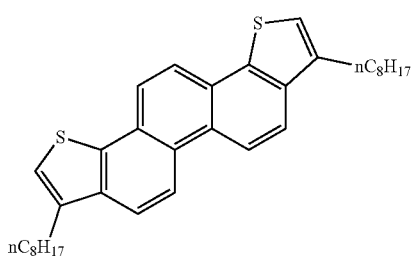

-continued
OSC-3
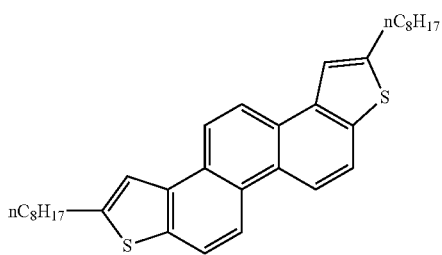
OSC-4
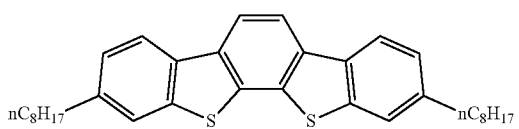
OSC-5
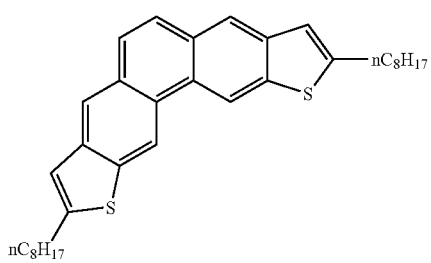
OSC-6
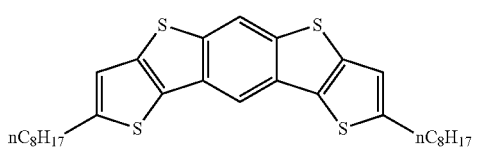
OSC-7
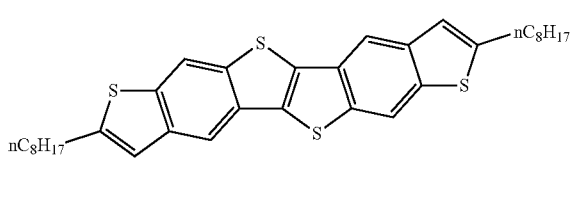
OSC-8
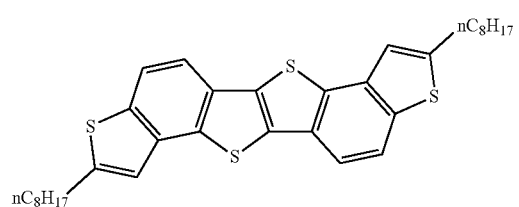
OSC-9
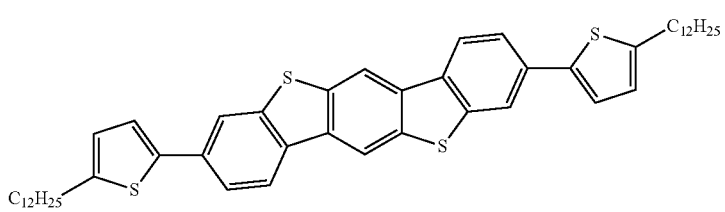
OSC-10
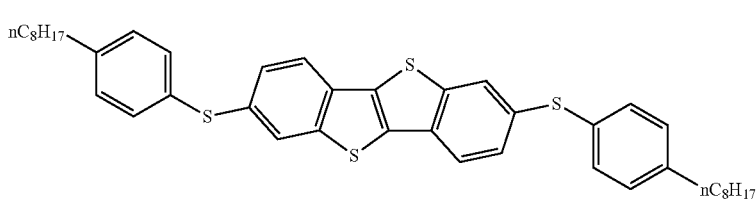
OSC-11
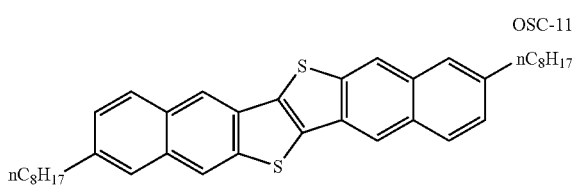
OSC-12
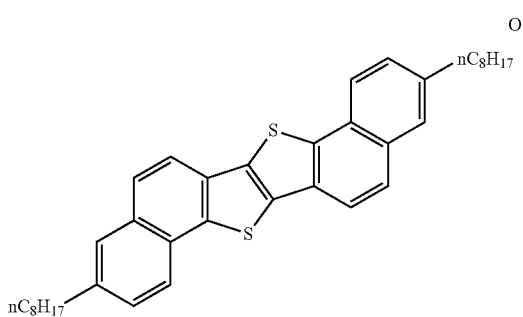

-continued
OSC-13
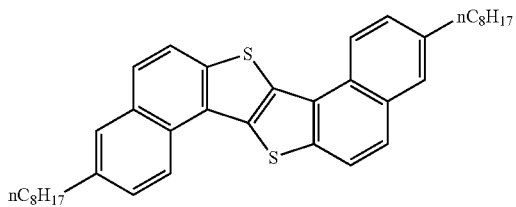
OSC-14
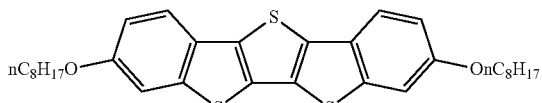
OSC-15
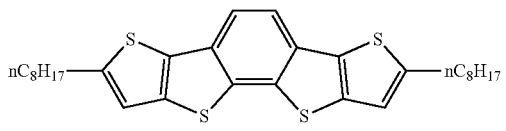
OSC-16
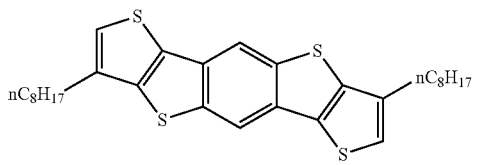
OSC-17
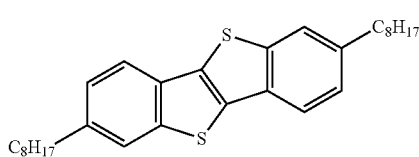
OSC-19
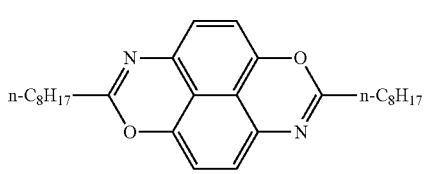
OSC-20
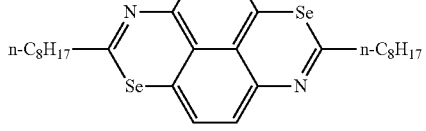
OSC-21
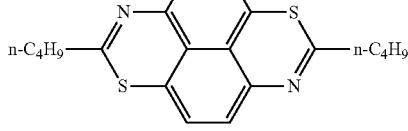
OSC-22
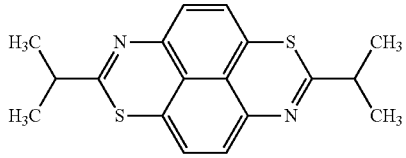
OSC-23
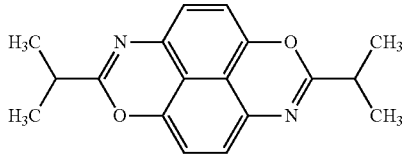
OSC-24
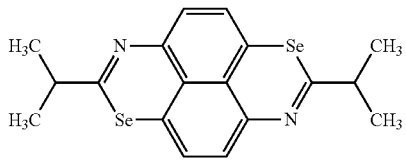
OSC-25
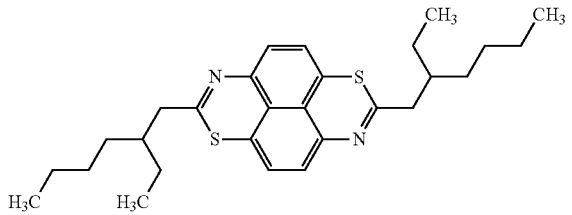
OSC-26
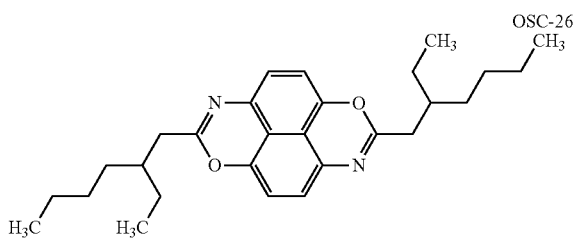
OSC-27
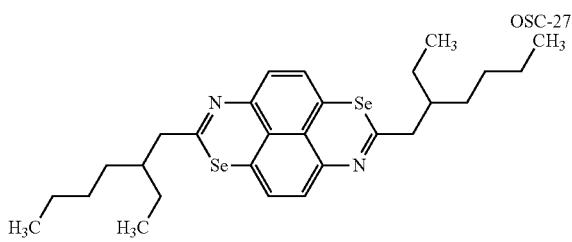
OSC-28
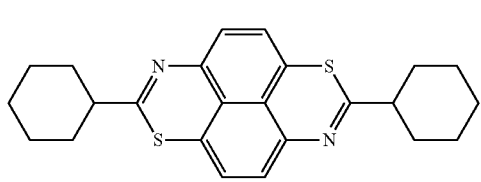
OSC-29
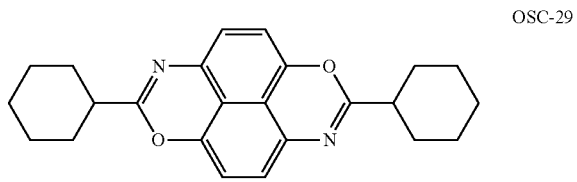

-continued
OSC-30
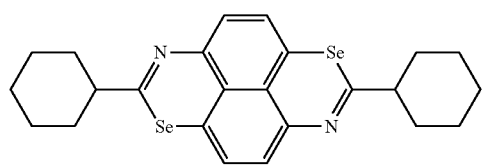
OSC-31
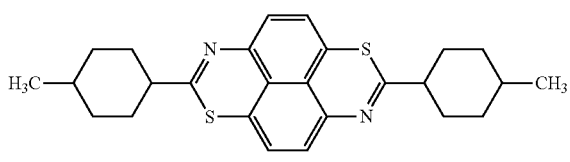
OSC-32
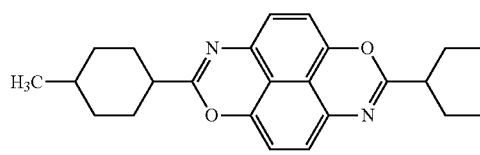
OSC-33
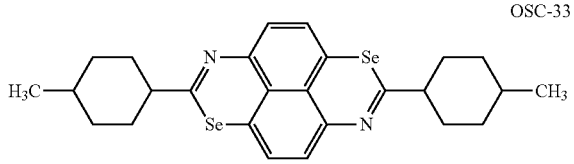
OSC-34
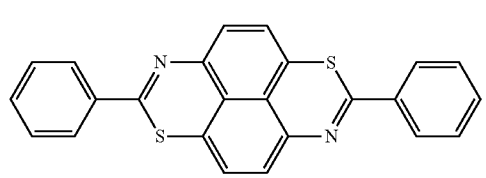
OSC-35
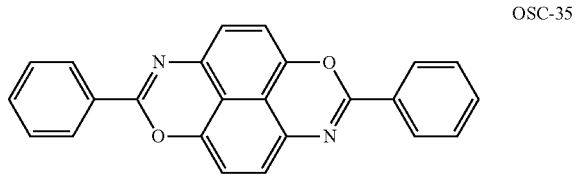
OSC-36
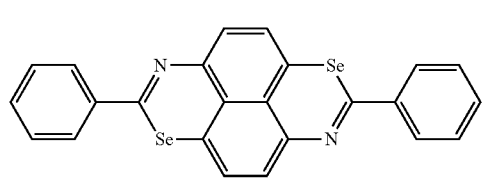
OSC-37
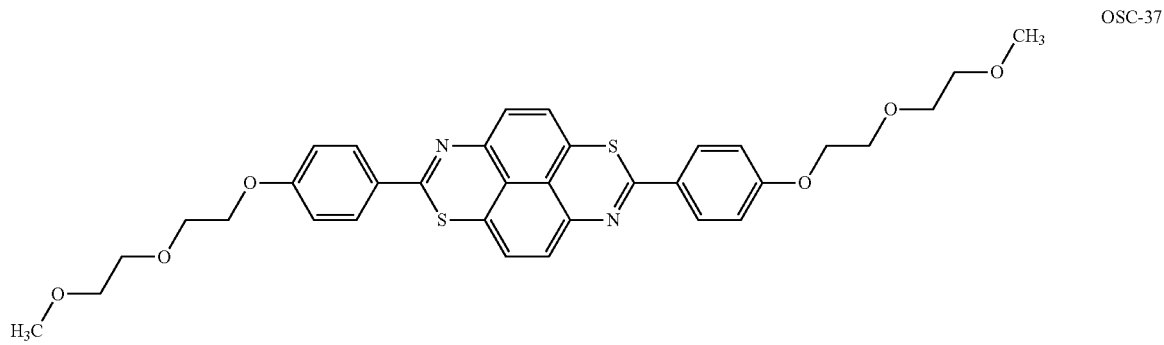
OSC-38
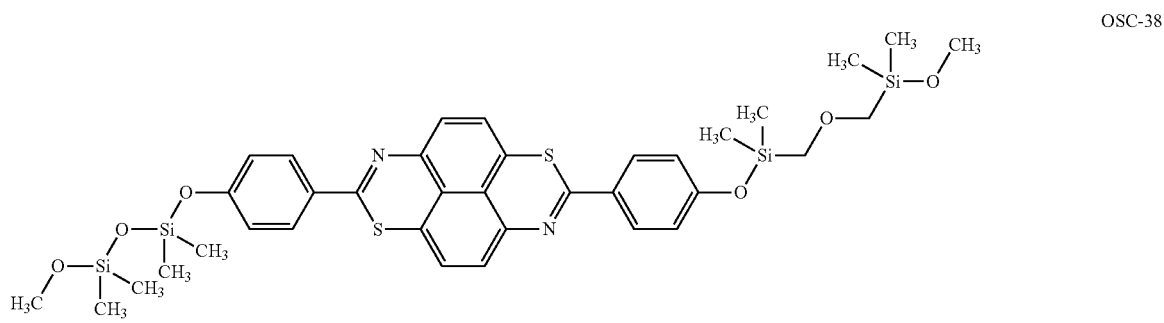
OSC-39
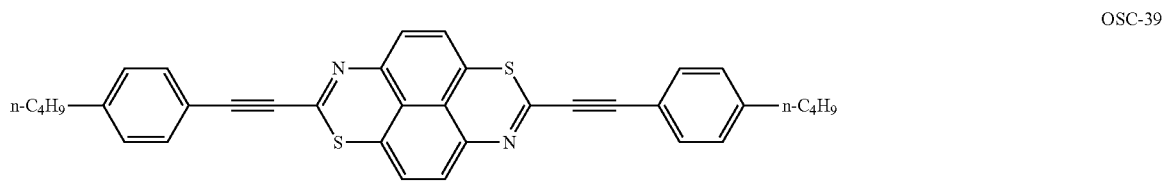

OSC-40
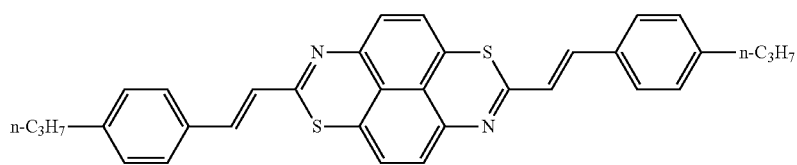
OSC-41
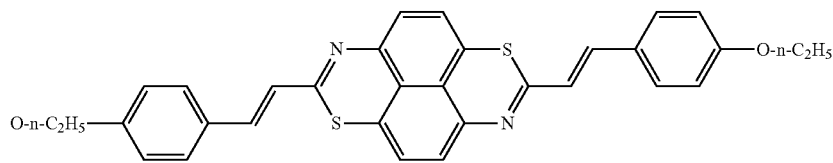
OSC-42
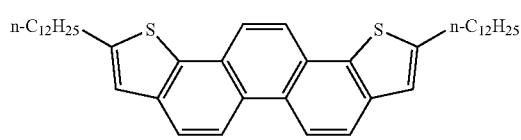
OSC-43
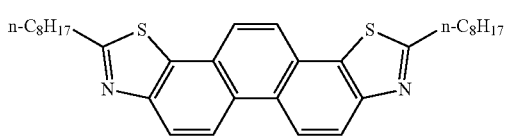
OSC-44
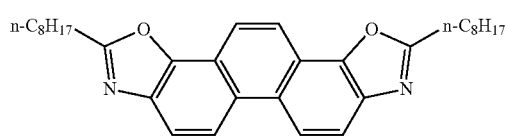
OSC-45
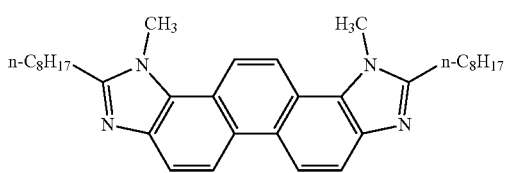
OSC-46
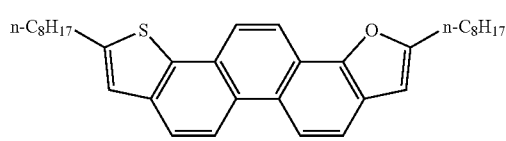
OSC-47
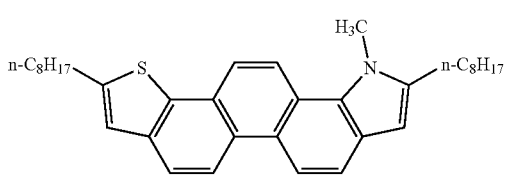
OSC-48
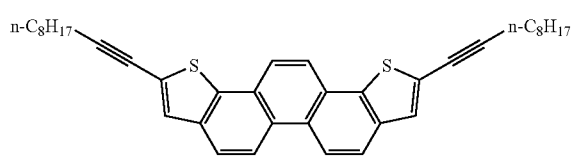
OSC-49
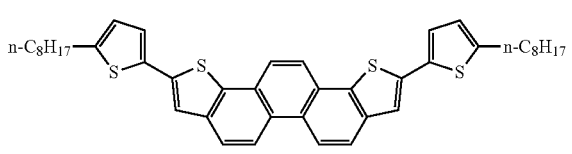
OSC-50
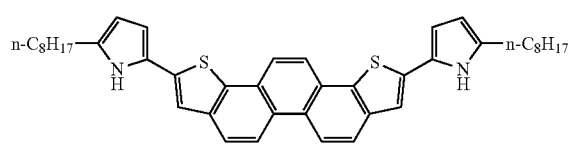
OSC-51
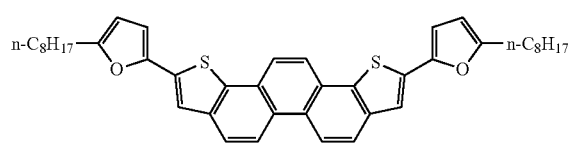
OSC-52
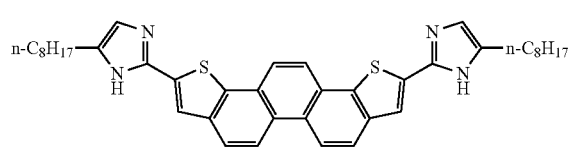
OSC-53
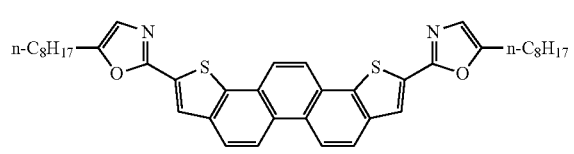
OSC-54
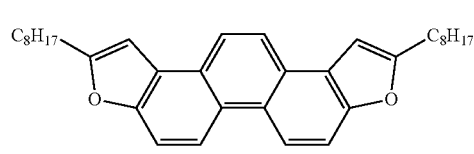
OSC-55
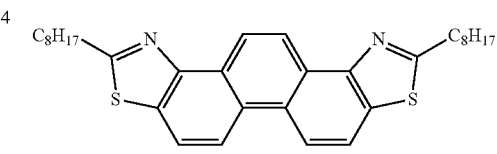

-continued
OSC-56
OSC-57
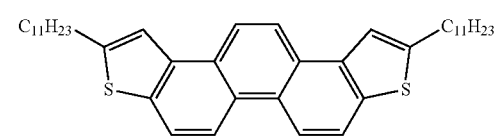
OSC-58
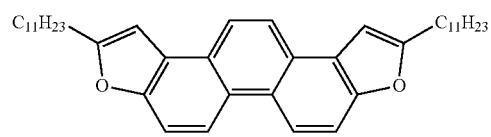
OSC-59
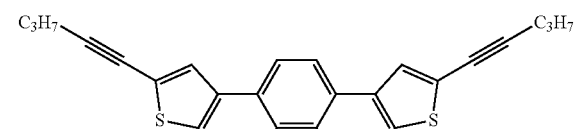
OSC-60
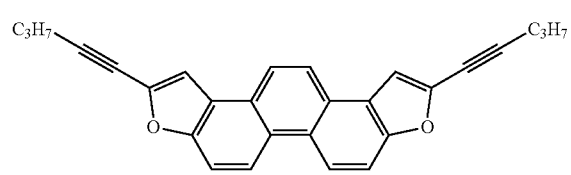
OSC-61
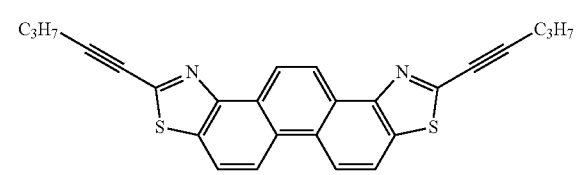
OSC-62
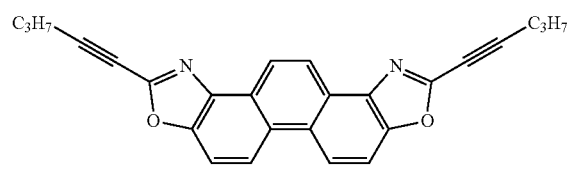
OSC-63
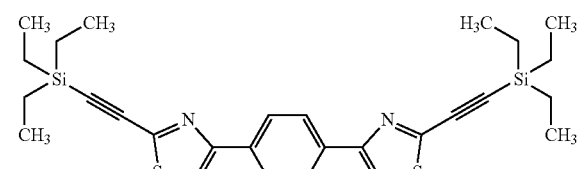
OSC-64
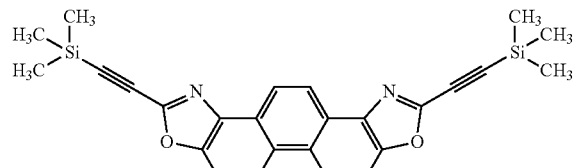
OSC-65
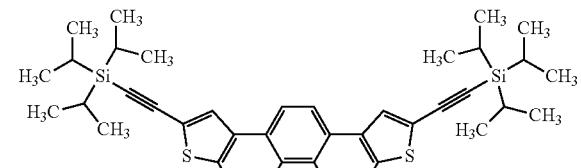
OSC-66
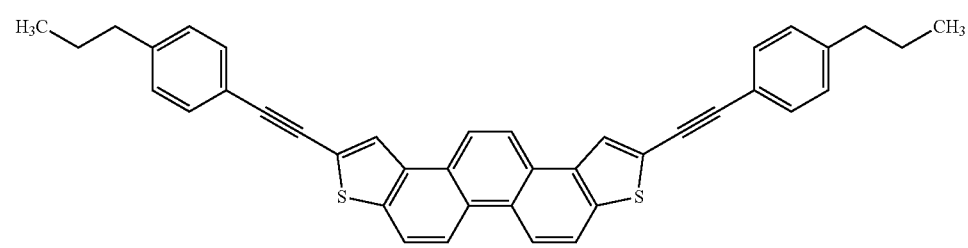
OSC-67
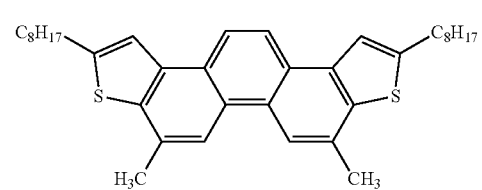
OSC-68
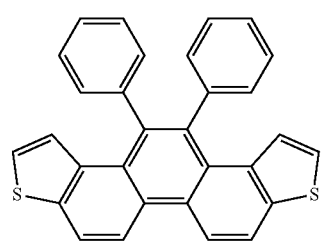

-continued
OSC-69
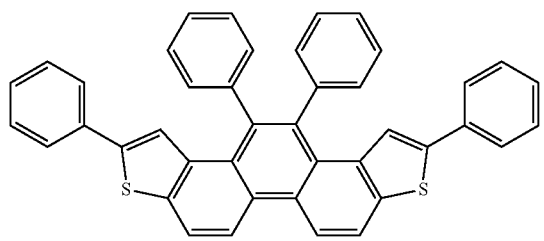
OSC-70
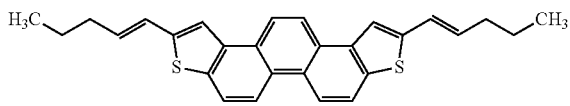
OSC-71
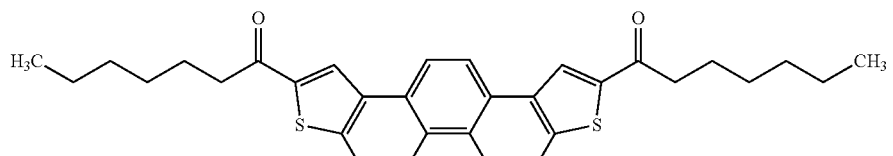
OSC-72
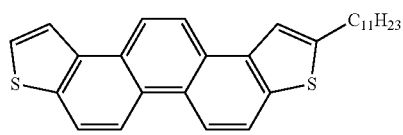
OSC-73
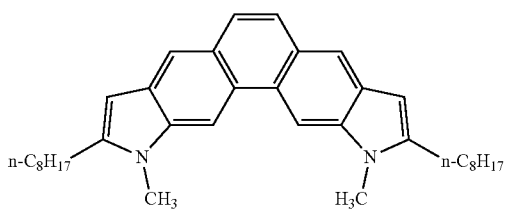
OSC-74
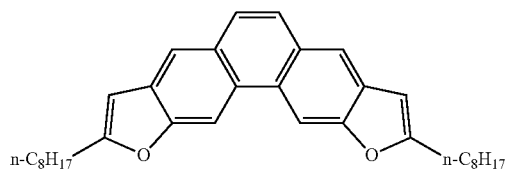
OSC-75
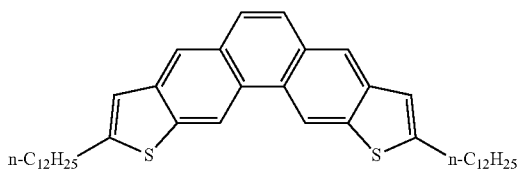
OSC-76
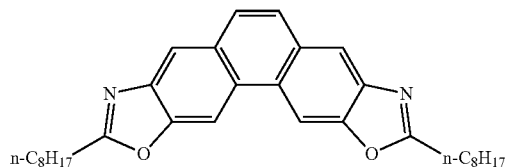
OSC-77
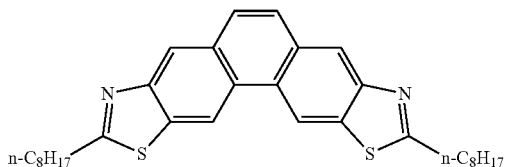
OSC-78
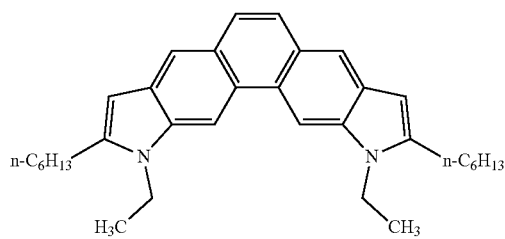
OSC-79
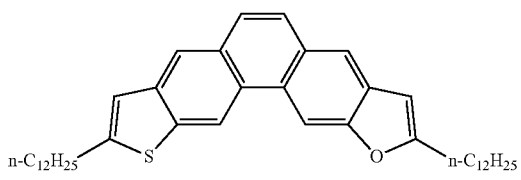
OSC-80
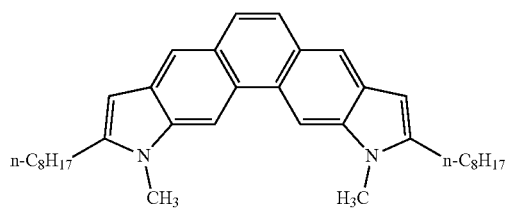
OSC-81
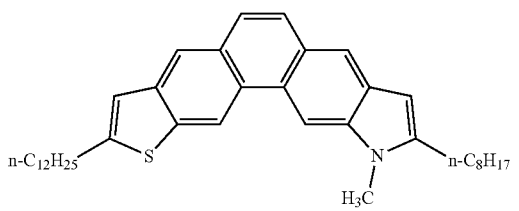

-continued

OSC-82

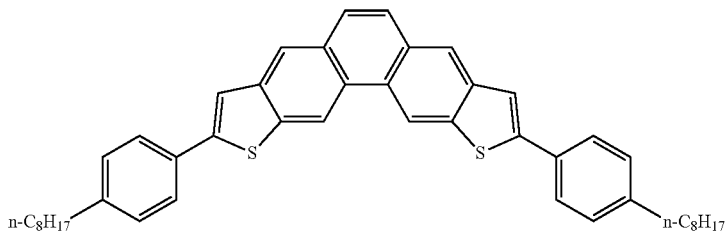

OSC-83

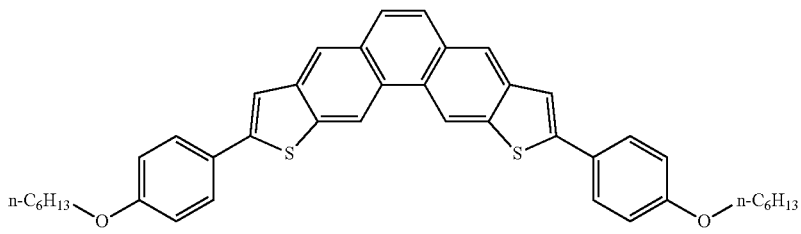

OSC-84      OSC-85

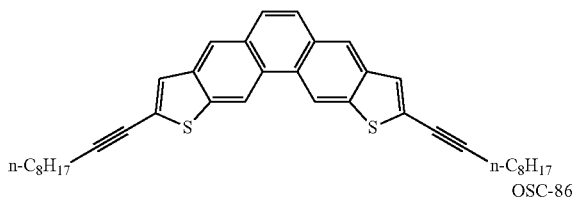 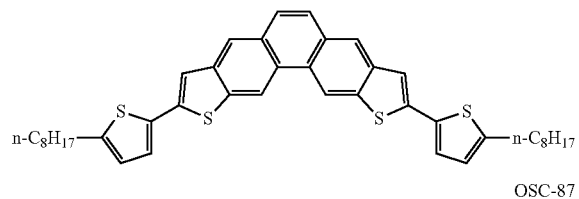

OSC-86      OSC-87

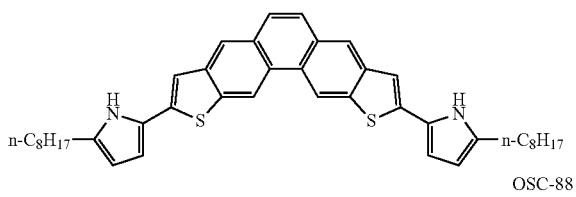 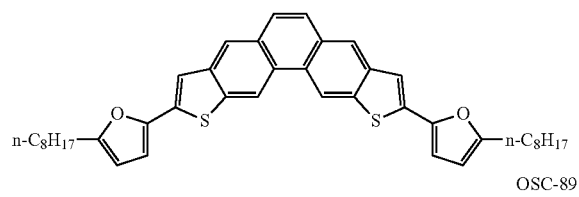

OSC-88      OSC-89

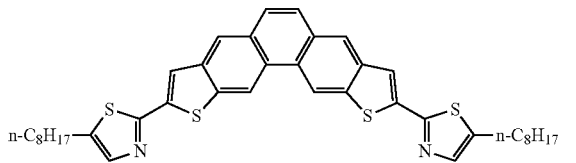 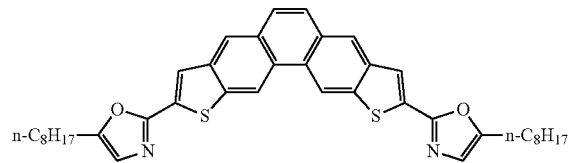

<Polymer>

The composition for forming an organic semiconductor film of the present invention contains a polymer having a glass transition temperature (Tg) of equal to or higher than −100° C. and equal to or less than −30° C. and an elastic recovery of equal to or less than 30% (hereinafter, the polymer will be simply referred to as a "specific polymer" or a "component B" as well).

The component B is not particularly limited as long as it is a polymer having Tg and an elastic recovery satisfying the above range, and various polymers can be used.

The component B is preferably at least one kind of resin selected from the group consisting of natural rubber, synthetic rubber, a silicone resin, a thermoplastic elastomer, and a urea resin, more preferably at least one kind of resin selected from the group consisting of ethylene-propylene rubber, acrylonitrile-butadiene rubber, hydrogenated nitrile rubber, fluororubber, a perfluoroelastomer, a tetrafluoroethylene propylene copolymer, an ethylene-propylene-diene copolymer, styrene-butadiene rubber, polychloroprene, polyneoprene, butyl rubber, a methyl phenyl silicone resin, a methyl phenyl vinyl silicone resin, a methyl vinyl silicone resin, a fluorosilicone resin, acryl rubber, ethylene acryl rubber, chlorosulfonated polyethylene, chloropolyethylene, an epichlorohydrin copolymer, a polyisoprene-natural rubber copolymer, polyisoprene rubber, a styrene-isoprene block copolymer, a polyester urethane copolymer, a polyether urethane copolymer, a polyether ester thermoplastic elastomer, and polybutadiene rubber, even more preferably at least one kind of resin selected from the group consisting of ethylene-propylene rubber, an ethylene-propylene-diene copolymer, a polyether ester thermoplastic elastomer, a styrene-isoprene block copolymer, styrene-butadiene rubber, and butyl rubber, still more preferably ethylene-propylene rubber, an ethylene-propylene-diene copolymer, or a polyether ester thermoplastic elastomer, particularly preferably ethylene-propylene rubber or an ethylene-propylene-diene copolymer, and most preferably ethylene-propylene rubber. If the above aspect is adopted, mobility and heat stability of the obtained organic semiconductor are further improved.

The diene used for synthesizing an ethylene-propylene-diene copolymer is not particularly limited, and preferred examples thereof include 5-ethylidene-2-norbornene (ENB), dicyclopentadiene (DCPD), and 1,4-hexadiene (HD). Among these, 5-ethylidene-2-norbornene is more preferable.

A glass transition temperature (Tg) of the component B is equal to or higher than −100° C. and equal to or less than −30° C. The glass transition temperature is preferably equal to or higher than −90° C. and equal to or less than −35° C., more preferably equal to or higher than −80° C. and equal to or less than −40° C., even more preferably equal to or higher than −70° C. and equal to or less than −45° C., and particularly preferably equal to or higher than −70° C. and equal to or less than −50° C. If the glass transition temperature is within the above range, mobility and heat stability of the obtained organic semiconductor are further improved.

In the present invention, a glass transition temperature (Tg) of a polymer is a value measured by Differential Scanning Calorimetry (DSC).

For example, by using a differential scanning calorimeter (manufactured by Mac Science Co., Ltd: DSC 3110, thermal analysis system 001), a glass transition temperature is measured under the condition of a heating rate of 5° C./min, and a temperature of a shoulder of a low temperature side of an endothermic point corresponding to a Tg of the obtained chart can be taken as a Tg.

An elastic recovery of the component B is equal to or less than 30%. The elastic recovery is preferably equal to or greater than 1% and equal to or less than 25%, more preferably equal to or greater than 1% and equal to or less than 22%, and even more preferably equal to or greater than 1% and equal to or less than 20%. If the elastic recovery is within the above range, heat stability of the obtained organic semiconductor film is further improved. Presumably, if a polymer having an elastic recovery within the above range is used, although the polymer expands as well due to the thermal expansion of the organic semiconductor at the time of heating, the polymer does not contract at the time of cooling, and hence the stress is relaxed.

In the present invention, an elastic recovery of a polymer means a value obtained as below.

An elastic recovery is measured by an indentation hardness test. As an indenter, a triangular pyramidal indenter made of diamond (Berkovich indenter) having an included angle of 115° C. is pressed on a surface of a sample, and a relationship between a load applied at this time and displacement is investigated. As a specific measurement technique, by using an HM-2000 type hardness tester manufactured by Fischer Instruments K.K., a sample applied onto glass is subjected to indentation for 10 seconds under a maximum load of up to 5 mN and then kept as it is for 5 seconds. A total work of indentation at this time is denoted by Wt (N·m). Then, the load is removed for 10 seconds, and a work at which the sample is restored due to elastic deformation is denoted by We (N·m). A ratio of work We/Wt is taken as an elastic recovery (%).

A surface energy of the component B is preferably equal to or less than 30 mN/m$^2$, more preferably equal to or greater than 10 mN/m$^2$ and equal to or less than 30 mN/m$^2$, even more preferably equal to or greater than 15 mN/m$^2$ and equal to or less than 30 mN/m$^2$, and particularly preferably equal to or greater than 20 mN/m$^2$ and equal to or less than 30 mN/m$^2$. If the surface energy is within the above range, heat stability of the obtained organic semiconductor film is further improved.

The mechanism that brings about the above effect is unclear. Presumably, if the surface energy is within the above range, both of the adhesiveness between the organic semiconductor and the substrate and the adhesiveness between the organic semiconductor and an electrode become excellent.

In the present invention, a surface energy of a polymer means a value obtained as below.

First, a 1% polymer solution is added dropwise onto a glass substrate, and the substrate is coated with the solution by spin coating (1,000 rpm, 120 seconds), followed by heating for 30 minutes at 150° C., thereby obtaining a polymer film.

Then, as a contact angle measurement process (for example, a contact angle meter DM-501 manufactured by Kyowa Interface Science Co., LTD. can be used), a contact angle between a surface of the polymer film and water as well as diiodomethane is measured.

By using the obtained contact angle and a value of surface tension of the liquid, from an Owens equation and a Young's equation extended from a Fowkes equation shown in the following equation B', a dispersive component ($\gamma_S^d$) and a polar component ($\gamma_S^h$) of a surface energy are determined, and a sum of the components is taken as a surface energy ($\gamma_S$).

$$\gamma_L(1+\cos\theta)=2(\gamma_S^d\gamma_L^d)^{1/2}+2(\gamma_S^h\gamma_L^h)^{1/2} \quad (B')$$

$$\gamma_S=\gamma_S^d+\gamma_S^h$$

$\gamma_L$: surface tension of contact medium
$\gamma_L^d$: dispersive component of surface tension of contact medium
$\gamma_L^h$: polar component of surface tension of contact medium
$\gamma_S$: surface energy
$\gamma_S^d$: dispersive component of surface energy
$\gamma_S^h$: polar component of surface energy A weight-average molecular weight of the component B is not particularly limited, but is preferably 1,000 to 2,000,000, more preferably 3,000 to 1,000,000, and even more preferably 5,000 to 600,000.

In the present invention, the weight-average molecular weight of a polymer is a weight-average molecular weight expressed in terms of polystyrene that is measured by gel permeation chromatography (GPC) by using tetrahydrofuran (THF) as a solvent.

An organic semiconductor film obtained from the composition for forming an organic semiconductor film of the present invention preferably has a portion in which at least the component A and the component B are mixed together, and more preferably has a portion which has a crystal structure of the component A and a portion in which at least the component A and the component B are mixed together.

It is preferable that the component B exhibits solubility higher than the solubility of the component A in a used solvent. If the above aspect is adopted, mobility and heat stability of the obtained organic semiconductor are further improved.

A content of the component B in the composition for forming an organic semiconductor film of the present invention is, with respect to 100 parts by mass of the content of the component A, preferably 1 to 200 parts by mass, more preferably 10 to 150 parts by mass, and even more preferably 20 to 120 parts by mass. If the content is within the above range, mobility and heat stability of the obtained organic semiconductor are further improved.

<Solvent>

The composition for forming an organic semiconductor film of the present invention preferably contains a solvent, and more preferably contains an organic solvent.

As the solvent, a known solvent can be used.

Specific examples of the solvent include a hydrocarbon-based solvent such as hexane, octane, decane, toluene, xylene, mesitylene, ethylbenzene, decalin, or 1-methylnaphthalene, a ketone-based solvent such as acetone, methyl ethyl ketone, methyl isobutyl ketone, or cyclohexanone, a halogenated hydrocarbon-based solvent such as dichloromethane, chloroform, tetrachloromethane, dichloroethane, trichloroethane, tetrachloroethane, chlorobenzene, dichlorobenzene, or chlorotoluene, an ester-based solvent such as ethyl acetate, butyl acetate, or amyl acetate, an alcohol-based solvent such as methanol, propanol, butanol, pentanol, hexanol, cyclohexanol, methyl cellosolve, ethyl cellosolve, or ethylene glycol, an ether-based solvent such as dibutyl ether, tetrahydrofuran, dioxane, or anisole, an amide- or imide-based solvent such as N,N-dimethylformamide, N,N-dimethylacetamide, 1-methyl-2-pyrrolidone, or 1-methyl-2-imidazolidinone, a sulfoxide-based solvent such as dimethyl sulfoxide, and a nitrile-based solvent such as acetonitrile.

One kind of solvent may be used singly, or plural kinds thereof may be used in combination.

Among the solvents, a hydrocarbon-based solvent, a halogenated hydrocarbon-based solvent and/or ether-based solvent are preferable, toluene, xylene, mesitylene, tetralin, dichlorobenzene, or anisole is more preferable, and o-dichlorobenzene is particularly preferable.

In a case where the composition contains a solvent, a content of the component A in the composition for forming an organic semiconductor film of the present invention is preferably 0.01% to 80% by mass, more preferably 0.05% to 10% by mass, and even more preferably 0.1% to 5% by mass, and a content of the component B is preferably 0.01% to 80% by mass, more preferably 0.05% to 10% by mass, and even more preferably 0.1% to 5% by mass. If the content of each of the components A and B is within the above range, coating properties become excellent, and an organic semiconductor film can be easily formed.

The viscosity of the composition for forming an organic semiconductor film according to the present invention is not particularly limited. In view of further improving coating properties, the viscosity is preferably 3 to 100 mPa·s, more preferably 5 to 50 mPa·s, and even more preferably 9 to 40 mPa·s. The viscosity in the present invention is viscosity at 25° C. As a method for measuring viscosity, a method based on JIS Z8803 is preferable.

<Polystyrene or Polystyrene Derivative>

It is preferable that the composition for forming an organic semiconductor film of the present invention contains polystyrene or a polystyrene derivative (hereinafter, referred to as a "component C" in some cases) having a constitutional repeating unit shown below, because then coating properties of the composition for forming an organic semiconductor film is improved, and mobility and heat stability of the obtained organic semiconductor film are further improved.

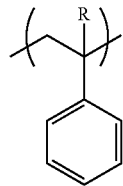

(PS)

In Formula (PS), R represents a hydrogen atom or a methyl group.

The component C may have other constitutional repeating units in addition to the constitutional repeating unit represented by Formula (PS), but it is preferable that the component C is composed only of the constitutional repeating unit represented by Formula (PS). That is, the component C is preferably polystyrene or poly-α-methylstyrene.

A weight-average molecular weight of the component C is not particularly limited, but is preferably 10,000 to 10,000,000, more preferably 500,000 to 8,000,000, and even more preferably 1,000,000 to 6,000,000.

In the composition for forming an organic semiconductor film of the present invention, a content of the component C is, with respect to 100 parts by mass of the component A (organic semiconductor), preferably 10 to 500 parts by mass, more preferably 50 to 200 parts by mass, and even more preferably 80 to 150 parts by mass.

<Other Components>

The composition for forming an organic semiconductor film of the present invention may contain components other than the components A, B, and C and a solvent.

As other components, known additives and the like can be used.

In the composition for forming an organic semiconductor film of the present invention, a content of the components other than the components A, B, and C and a solvent is preferably equal to or less than 10% by mass, more preferably equal to or less than 5% by mass, even more preferably equal to or less than 1% by mass, and particularly preferably equal to or less than 0.1% by mass. If the content of other components is within the above range, film formability is improved, and mobility and heat stability of the obtained organic semiconductor are further improved.

A method for manufacturing the composition for forming an organic semiconductor film of the present invention is not particularly limited, and known methods can be adopted. For example, by simultaneously or sequentially adding a predetermined amount of the components A and B to a solvent and appropriately stirring the mixture, a desired composition can be obtained.

(Organic Semiconductor Film and Organic Semiconductor Element)

An organic semiconductor film of the present invention contains an organic semiconductor having a condensed polycyclic aromatic group and a polymer, the number of rings in the condensed polycyclic aromatic group is equal to or greater than 4, at least two rings in the condensed polycyclic aromatic group contain at least one atom selected from the group consisting of a sulfur atom, a nitrogen atom, a selenium atom, and an oxygen atom, the condensed polycyclic aromatic group contains, as a partial structure, at least any one structure selected from the group consisting of a benzene ring, a naphthalene ring, and a phenanthrene ring, and the polymer has a glass transition temperature of equal to or higher than −100° C. and equal to or less than −30° C. and an elastic recovery of equal to or greater than 30 mN/m² and equal to or less than 45 mN/m².

Here, the condensed polycyclic aromatic group does not contain an anthracene ring as a partial structure.

An organic semiconductor element of the present invention contains an organic semiconductor having a condensed polycyclic aromatic group and a polymer, the number of rings in the condensed polycyclic aromatic group is equal to or greater than 4, at least two rings in the condensed polycyclic aromatic group contain at least one atom selected from the group consisting of a sulfur atom, a nitrogen atom, a selenium atom, and an oxygen atom, the condensed polycyclic aromatic group contains, as a partial structure, at least any one structure selected from the group consisting of a benzene ring, a naphthalene ring, and a phenanthrene ring, and the polymer has a glass transition temperature of equal to or higher than −100° C. and equal to or less than −30° C. and an elastic recovery of equal to or greater than 30 mN/m$^2$ and equal to or less than 45 mN/m$^2$.

Here, the condensed polycyclic aromatic group does not contain an anthracene ring as a partial structure.

The organic semiconductor element in the first embodiment of the present invention is an organic semiconductor element having an organic semiconductor film formed using the composition for forming an organic semiconductor film of the present invention. According to the first embodiment, film formability is improved, and mobility and heat stability of the obtained organic semiconductor are further improved.

The organic semiconductor element in the second embodiment of the present invention is an organic semiconductor element having a layer containing the aforementioned polymer between a layer containing the aforementioned organic semiconductor and an insulating layer. According to the second embodiment, productivity and costs are further improved.

The organic semiconductor element in the third embodiment of the present invention is an organic semiconductor element having a layer containing the component C between a layer containing the aforementioned organic semiconductor and a layer containing the aforementioned polymer. According to the third embodiment, mobility and heat stability of the obtained organic semiconductor are further improved.

In the second and third embodiments, the layer containing the organic semiconductor is preferably a layer composed of the aforementioned organic semiconductor.

Furthermore, in the second and third embodiments, the insulating film is preferably a gate insulating film.

In addition, in the second and third embodiments, the layer containing the aforementioned polymer is preferably a layer composed of the aforementioned polymer.

The organic semiconductor film and the organic semiconductor element of the present invention are preferably manufactured using the composition for forming an organic semiconductor film of the present invention.

A method for manufacturing an organic semiconductor film or an organic semiconductor element by using the composition for forming an organic semiconductor film of the present invention is not particularly limited, and known methods can be adopted. Examples thereof include a method for manufacturing an organic semiconductor film by applying the composition onto a predetermined substrate and, if necessary, performing a drying treatment.

The method of applying the composition onto a substrate is not particularly limited, and known methods can be adopted. Examples thereof include an ink jet printing method, a flexographic printing method, a bar coating method, a spin coating method, a knife coating method, a doctor blade method, and the like. Among these, an ink jet printing method and a flexographic printing method are preferable.

Preferred examples of the flexographic printing method include an aspect in which a photosensitive resin plate is used as a flexographic printing plate. By printing the composition onto a substrate according to the aspect, a pattern can be easily formed.

Among the above methods, the method for manufacturing an organic semiconductor film of the present invention and the method for manufacturing an organic semiconductor element of the present invention preferably include a coating step of coating a substrate with the composition for forming an organic semiconductor film of the present invention. The composition for forming an organic semiconductor film of the present invention more preferably contains a solvent, and the method for manufacturing an organic semiconductor film of the present invention and the method for manufacturing an organic semiconductor element of the present invention more preferably includes a coating step of coating a substrate with the composition for forming an organic semiconductor film of the present invention and a removing step of removing the solvent from the composition with which the substrate is coated.

The drying treatment in the removing step is a treatment performed if necessary, and the optimal treatment conditions are appropriately selected according to the type of the components A and B used and the solvent. In view of further improving mobility and heat stability of the obtained organic semiconductor and improving productivity, a heating temperature is preferably 30° C. to 100° C. and more preferably 40° C. to 80° C., and a heating time is preferably 10 to 300 minutes and more preferably 30 to 180 minutes.

A film thickness of the formed organic semiconductor film is not particularly limited. From the viewpoint of mobility and heat stability of the obtained organic semiconductor, the film thickness is preferably 10 to 500 nm and more preferably 30 to 200 nm.

The organic semiconductor film manufactured from the composition of the present invention can be suitably used in an organic semiconductor element, and can be particularly suitably used in an organic transistor (organic thin film transistor).

The organic semiconductor element is not particularly limited, but is preferably an organic semiconductor element having 2 to 5 terminals, and more preferably an organic semiconductor element having 2 or 3 terminals.

Furthermore, the organic semiconductor element is preferably an element which does not use a photoelectric function.

Examples of a 2-terminal element include a rectifier diode, a constant voltage diode, a PIN diode, a Schottky barrier diode, a surge protection diode, a diac, a varistor, a tunnel diode, and the like.

Examples of a 3-terminal element include a bipolar transistor, a Darlington transistor, a field effect transistor, insulated gate bipolar transistor, a uni-junction transistor, a static induction transistor, a gate turn thyristor, a triac, a static induction thyristor, and the like.

Among these, a rectifier diode and transistors are preferable, and a field effect transistor is more preferable.

An aspect of the organic thin film transistor of the present invention will be described with reference to a drawing.

FIG. 1 is a schematic cross-sectional view of an aspect of an organic semiconductor element (organic thin film transistor (TFT)) of the present invention.

In FIG. 1, an organic thin film transistor 100 includes a substrate 10, a gate electrode 20 disposed on the substrate 10, a gate insulating film 30 covering the gate electrode 20, a source electrode 40 and a drain electrode 42 which contact a surface of the gate insulating film 30 that is on the side opposite to the gate electrode 20 side, an organic semiconductor film 50 covering a surface of the gate insulating film 30 between the source electrode 40 and the drain electrode 42, and a sealing layer 60 covering each member. The organic thin film transistor 100 is a bottom gate-bottom contact type organic thin film transistor.

In FIG. 1, the organic semiconductor film 50 corresponds to a film formed of the composition described above.

Hereinafter, the substrate, the gate electrode, the gate insulating film, the source electrode, the drain electrode, the organic semiconductor film, the sealing layer, and methods for forming each of these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoint of applicability to each device and costs, a glass substrate or a plastic substrate is preferable.

Examples of materials of the plastic substrate include a thermosetting resin (for example, an epoxy resin, a phenol resin, a polyimide resin, or a polyester resin (for example, polyethylene terephthalate (PET) or polyethylene naphthalate (PEN)) and a thermoplastic resin (for example, a phenoxy resin, a polyethersulfone, polysulfone, or polyphenylene sulfone).

Examples of materials of the ceramic substrate include alumina, aluminum nitride, zirconia, silicon, silicon nitride, silicon carbide, and the like.

Examples of materials of the glass substrate include soda lime glass, potash glass, borosilicate glass, quartz glass, aluminosilicate glass, lead glass, and the like.

<Gate Electrode, Source Electrode, and Drain Electrode>

Examples of materials of the gate electrode, the source electrode, and the drain electrode include a metal such as gold (Au), silver, aluminum (Al), copper, chromium, nickel, cobalt, titanium, platinum, tantalum, magnesium, calcium, barium, or sodium; a conductive oxide such as $InO_2$, $SnO_2$, or indium tin oxide (ITO); a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, or graphite; and the like. Among these, a metal is preferable, and silver and aluminum are more preferable.

A thickness of each of the gate electrode, the source electrode, and the drain electrode is not particularly limited, but is preferably 20 to 200 nm.

A method for forming the gate electrode, the source electrode, and the drain electrode is not particularly limited, but examples thereof include a method of vacuum vapor-depositing or sputtering an electrode material onto a substrate, a method of coating a substrate with a composition for forming an electrode, a method of printing a composition for forming an electrode onto a substrate, and the like. Furthermore, in a case where the electrode is patterned, examples of the patterning method include a photolithography method; a printing method such as ink jet printing, screen printing, offset printing, or relief printing; a mask vapor deposition method; and the like.

<Gate Insulating Film>

Examples of materials of the gate insulating film include a polymer such as polymethyl methacrylate, polystyrene, polyvinylphenol, polyimide, polycarbonate, polyester, polyvinylalcohol, polyvinyl acetate, polyurethane, polysulfone, polybenzoxazole, polysilsesquioxane, an epoxy resin, or a phenol resin; an oxide such as silicon dioxide, aluminum oxide, or titanium oxide; a nitride such as silicon nitride; and the like. Among these materials, in view of the compatibility with the organic semiconductor film, a polymer is preferable.

In a case where a polymer is used as the material of the gate insulating film, it is preferable to use a cross-linking agent (for example, melamine) in combination. If the cross-linking agent is used in combination, the polymer is cross-linked, and durability of the formed gate insulating film is improved.

A film thickness of the gate insulating film is not particularly limited, but is preferably 100 to 1,000 nm.

A method for forming the gate insulating film is not particularly limited, but examples thereof include a method of coating a substrate, on which the gate electrode is formed, with a composition for forming a gate insulating film, a method of vapor-depositing or sputtering the material of the gate insulating film onto a substrate on which the gate electrode is formed, and the like. A method for coating the aforementioned substrate with the composition for forming a gate insulating film is not particularly limited, and it is possible to use a known method (a bar coating method, a spin coating method, a knife coating method, or a doctor blade method).

In a case where the gate insulating film is formed by coating the substrate with the composition for forming a gate insulating film, for the purpose of removing the solvent, causing cross-linking, or the like, the composition may be heated (baked) after coating.

<Organic Semiconductor Film>

The organic semiconductor film of the present invention is a film formed of the composition for forming an organic semiconductor film of the present invention.

A method for forming the organic semiconductor film is not particularly limited. By applying the aforementioned composition onto the source electrode, the drain electrode, and the gate insulating film and, if necessary, performing a drying treatment, a desired organic semiconductor film can be formed.

<Polymer Layer>

The organic semiconductor element of the present invention preferably has a layer of the aforementioned polymer between a layer containing the aforementioned organic semiconductor and an insulating film, and more preferably has a layer of the aforementioned polymer between the aforementioned organic semiconductor and the gate insulating film. A film thickness of the polymer layer is not particularly limited, but is preferably 20 to 500 nm. The polymer layer should be a layer containing the aforementioned polymer, and is preferably a layer composed of the aforementioned polymer.

A method for forming the polymer layer is not particularly limited, and a known method (a bar coating method, a spin coating method, a knife coating method, a doctor blade method, or an ink jet method) can be used.

In a case where the polymer layer is formed by performing coating by using a composition for forming a polymer layer, for the purpose of removing a solvent, causing cross-linking, or the like, the composition may be heated (baked) after coating.

<Layer Containing Component C>

The organic semiconductor element of the present invention preferably has a layer containing the component C between a layer containing the aforementioned organic semiconductor and the aforementioned polymer layer. A film thickness of the layer containing the component C is not particularly limited, but is preferably 1 to 500 nm. The layer containing the component C should be a layer containing the component C, and is preferably a layer composed of the component C.

It is preferable that the layer containing the component C is formed between a layer containing the organic semiconductor and the aforementioned polymer layer by adding the component C to the composition for forming an organic semiconductor film, applying the composition for forming an organic semiconductor film onto a source electrode, a drain electrode, and a gate insulating film, and, if necessary, performing a drying treatment and causing phase separation occurs between the layer containing the organic semiconductor and the layer containing the component C.

<Sealing Layer>

From the viewpoint of durability, the organic thin film transistor of the present invention preferably includes a sealing layer as an outermost layer. In the sealing layer, a known sealant can be used.

A thickness of the sealing layer is not particularly limited, but is preferably 0.2 to 10 µm.

A method for forming the sealing layer is not particularly limited, but examples thereof include a method of coating a substrate, on which the gate electrode, the gate insulating film, the source electrode, the drain electrode, and the organic semiconductor film are formed, with a composition for forming a sealing layer, and the like. Specific examples of the method of coating the substrate with the composition for forming a sealing layer are the same as the examples of the method of coating the substrate with the composition for forming a gate insulating film. In a case where the organic semiconductor film is formed by coating the substrate with the composition for forming a sealing layer, for the purpose of removing the solvent, causing cross-linking, or the like, the composition may be heated (baked) after coating.

Figure 2:
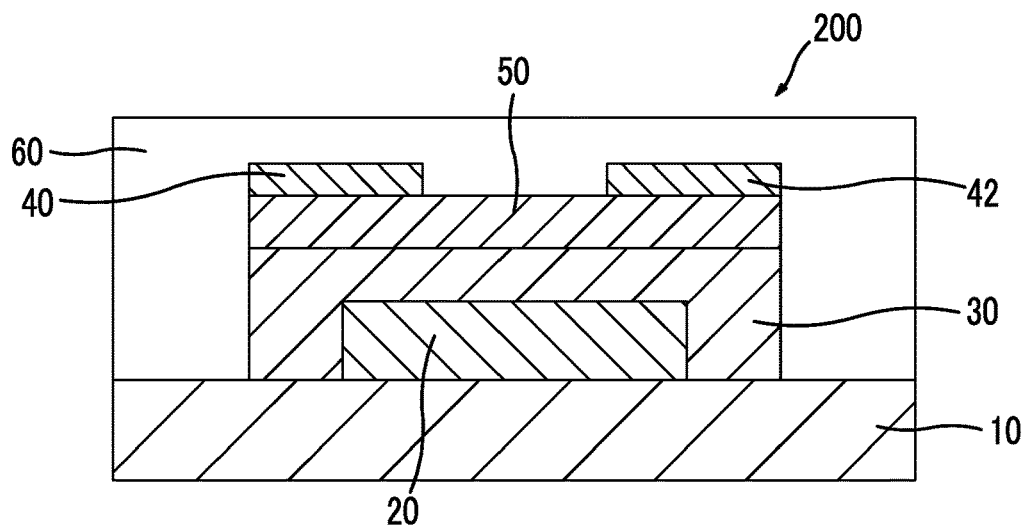
FIG. 2 is a schematic cross-sectional view of another aspect of the organic semiconductor element of the present invention.

FIG. 2 is a schematic cross-sectional view of another aspect of the organic semiconductor element (organic thin film transistor) of the present invention.

In FIG. 2, an organic thin film transistor 200 includes the substrate 10, the gate electrode 20 disposed on the substrate 10, the gate insulating film 30 covering the gate electrode 20, the organic semiconductor film 50 disposed on the gate insulating film 30, the source electrode 40 and the drain electrode 42 disposed on the organic semiconductor film 50, and the sealing layer 60 covering each member. Herein, the source electrode 40 and the drain electrode 42 are formed using the aforementioned composition of the present invention. The organic thin film transistor 200 is a top contact-type organic thin film transistor.

The substrate, the gate electrode, the gate insulating film, the source electrode, the drain electrode, the organic semiconductor film, and the sealing layer are as described above.

In FIGS. 1 and 2, the aspects of the bottom gate-bottom contact type organic thin film transistor and the bottom gate-top contact type organic thin film transistor were specifically described. However, the composition of the present invention can also be applied to a top gate-bottom contact type organic thin film transistor and a top gate-top contact type organic thin film transistor.

The aforementioned organic thin film transistor can be suitably used in electronic paper, a display device, and the like.

EXAMPLES

Hereinafter, the present invention will be more specifically described based on examples. The materials and the amount thereof used, the proportion of the materials, the content and procedure of treatments, and the like described in the following examples can be appropriately changed within a scope that does not depart from the gist of the present invention. Accordingly, the scope of the present invention is not limited to the following specific examples. Herein, unless otherwise specified, "part" and "%" are based on mass.

For determining a glass transition temperature (Tg), by using a differential scanning calorimeter (manufactured by Mac Science Co., Ltd: DSC 3110, thermal analysis system 001), a glass transition temperature was measured under the condition of a heating rate of 5° C./min, and a temperature of a shoulder of a low temperature side of an endothermic point corresponding to a Tg of the obtained chart was be taken as a Tg.

A surface energy was measured by the following method. A 1% solution of each polymer was added dropwise onto a glass substrate, and the substrate was coated with the solution by spin coating (1,000 rpm, 120 seconds), followed by heating for 30 minutes at 150° C., thereby obtaining a polymer film. Then, by using a contact angle meter DM-501 manufactured by Kyowa Interface Science Co., LTD, a contact angle between a surface of each polymer film and water as well as diiodomethane was measured. By using the obtained contact angle and a value of surface tension of the liquid, from an Owens equation and a Young's equation extended from a Fowkes equation, a dispersive component ($\gamma_S^d$) and a polar component ($\gamma_S^h$) of a surface energy were determined, and a sum of the components was taken as a surface energy ($\gamma_S$).

An elastic recovery was measured by the following method by using an HM-2000 hardness tester (manufactured by Fischer Instruments K.K). A sample applied onto glass was subjected to indentation for 10 seconds under a maximum load of up to 5 mN and then kept as it was for 5 seconds. A total work of indentation at this time was denoted by Wt (N·m). Then, the load was removed for 10 seconds, and a work at which the sample was restored due to elastic deformation was denoted by We (N·m). A ratio of work We/Wt was taken as an elastic recovery (%).

Examples 1 to 27 and Comparative Examples 1 to 7

<Preparation of Composition for Forming an Organic Semiconductor Film>

An organic semiconductor compound, o-dichlorobenzene (solvent), and a polymer of the types shown in the following Table 1 were weighed out in a glass vial at a predetermined ratio and stirred and mixed together for 10 minutes by using MIX ROTOR (manufactured by AS ONE Corporation). The mixture was filtered through a 0.5 µm membrane filter, thereby obtaining a composition for forming an organic semiconductor film.

<Formation of TFT Element>

A bottom gate-bottom contact type TFT element was formed in the following manner.

—Formation of Gate Electrode—

A silver nanoink (H-1, manufactured by Mitsubishi Materials Corporation) was printed on an alkali-free glass substrate (5 cm×5 cm) by an ink jet method using DMP 2831 (1 pL head, ink jet printer manufactured by Fujifilm Graphic Systems), thereby forming a wiring pattern having a width of 100 µm and a film thickness of 100 nm. Then, the wiring pattern was fired in the atmosphere on a hot plate for 90 minutes at 200° C., thereby forming gate electrode wiring.

—Formation of Gate Insulating Film—

5 parts by mass of polyvinyl phenol (Mw: 25,000, manufactured by Sigma-Aldrich Co. LLC.), 5 parts by mass of melamine, and 90 parts by mass of polyethylene glycol monomethyl ether acetate were stirred and mixed together and filtered through a 0.2 µm membrane filter, thereby preparing a solution. The obtained solution was added dropwise onto the glass substrate on which a gate electrode was prepared, and the substrate was coated with the solution by spin coating (1,000 rpm, 120 seconds), followed by heating for 30 minutes at 150° C., thereby forming a gate insulating film.

—Formation of Source-Drain Electrode (SD Electrode)—

Figure 3:
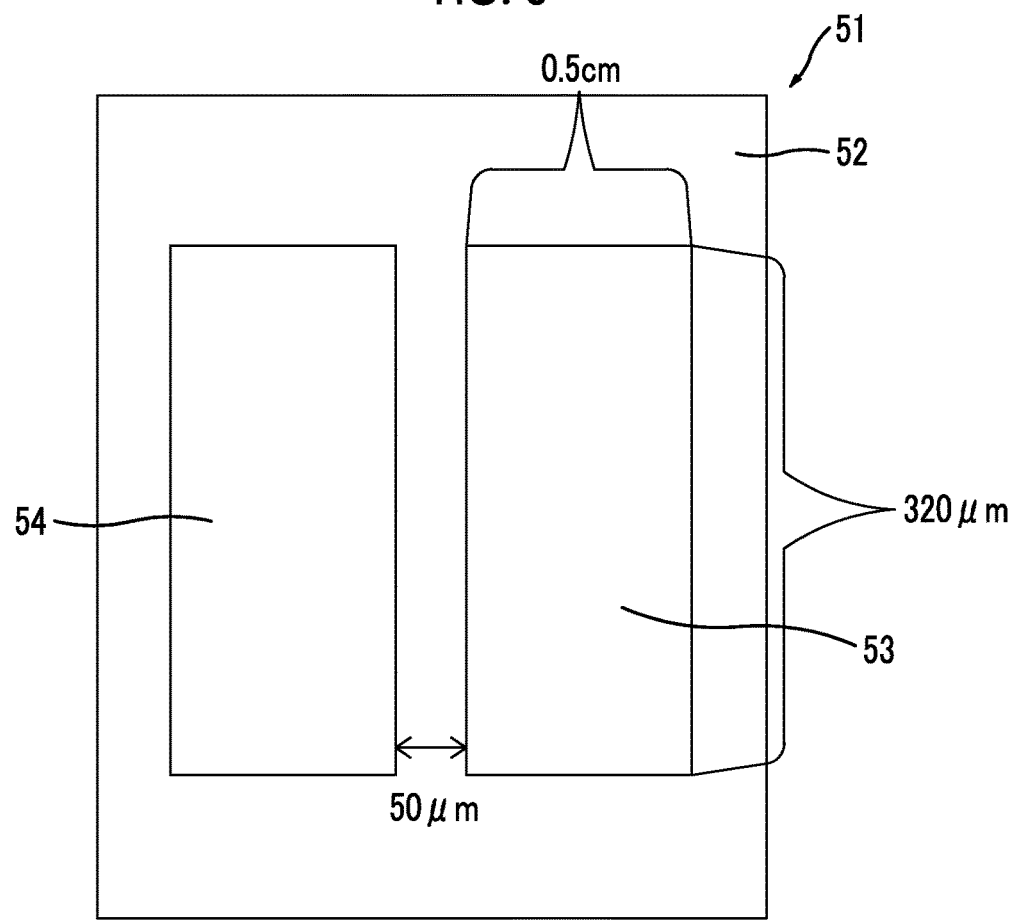
FIG. 3 is a plan view of a metal mask used in examples.

A metal mask having a plurality of patterns shown in FIG. 3 was loaded on the center of the substrate coated with the aforementioned insulating film and irradiated with UV ozone for 30 minutes. In this way, opening portions of the mask were modified and became a hydrophilic processed surface. In the periphery of the modified portions, through ink jet printing using DMP 2831 (1 pL head), patterns of a source-drain electrode having a channel length of 50 μm and a channel width of 320 μm were formed. The obtained substrate was fired for 90 minutes at 200° C. on a hot plate in a $N_2$ atmosphere (in a glove box, an environment having an oxygen concentration of equal to or less than 20 ppm), thereby forming a copper electrode having a film thickness of 200 nm.

—Formation of Polymer Layer—

In Example 27, a polymer layer was formed in the following manner. 2 parts by mass of ethylene-propylene rubber EPT 0045 (manufactured by Mitsui Chemicals, Inc.) and 98 parts by mass of toluene were stirred and mixed together and filtered through a 0.5 μm membrane filter, thereby preparing a solution. The obtained solution was added dropwise onto a glass substrate on which the aforementioned SD electrode was prepared, and the substrate was coated with the solution by spin coating (1,000 rpm, 120 seconds), followed by heating for 10 minutes at 100° C., thereby forming a polymer layer.

—Organic Semiconductor Layer: Ink Jet Method—

The substrate on which the source-drain electrode was formed was coated with the prepared composition for forming an organic semiconductor film by an ink jet method. By using DPP 2831 (manufactured by Fujifilm Graphic Systems) as an ink jet device and a 10 pL head, a solid film was formed at a jetting frequency of 2 Hz and a dot pitch of 20 μm. Then, the film was dried for 1 hour at 70° C., thereby preparing an organic semiconductor film.

In Example 27, a polymer was not added to the composition for forming an organic semiconductor film.

—Organic Semiconductor Layer: Flexographic Printing Method—

The substrate, on which the source-drain electrode were formed, was coated with the prepared composition for forming an organic semiconductor film by a flexographic printing method. As a printing device, a flexographic printability tester F1 (manufactured by IGT Testing Systems K.K.) was used, and as a flexographic resin plate, AFP DSH 1.70% (manufactured by Asahi Kasei Corporation.)/solid image was used. Printing was performed at a transport rate of 0.4 m/sec under a pressure between the plate and the substrate of 60 N, and then the substrate was dried as it was for 2 hours at room temperature that was equal to or less than 40° C., thereby preparing an organic semiconductor film.

<Evaluation>

—Measurement of Mobility—

By using a semiconductor characteristic evaluation device B2900A (manufactured by Agilent Technologies), carrier mobility was measured. According to the value of the mobility, the organic transistors were scored on a scale of 1 to 5. The greater the value of mobility, the better the performance of the transistor as an organic semiconductor.

5: a mobility of equal to or greater than 0.2 $cm^2$/Vs

4: a mobility of equal to or greater than 0.1 $cm^2$/Vs and less than 0.2 $cm^2$/Vs 3: a mobility of equal to or greater than 0.02 $cm^2$/Vs and less than 0.1 $cm^2$/Vs 2: a mobility of equal to or greater than 0.002 $cm^2$/Vs and less than 0.02 $cm^2$/Vs 1: a mobility of less than 0.002 $cm^2$/Vs —Evaluation of Heat Stability—

The TFT elements in which the organic semiconductor film were heated for 1 hour at 120° C., and then a change of mobility was evaluated. Specifically, for each of the 30 organic transistors, a difference between a mobility Y after heating and a mobility X before heating was divided by the mobility X, and the thus obtained value was multiplied by 100 [{(Y−X)/X}×100]. The values obtained in this way were averaged, and the average was taken as a rate of change. The smaller the rate of change, the better the heat stability.

5: a rate of change of less than 20%

4: a rate of change of equal to or greater than 20% and less than 30%

3: a rate of change of equal to or greater than 30% and less than 50%

2: a rate of change of equal to or greater than 50% and less than 100%

1: a rate of change of equal to or greater than 100%

The evaluation results are summarized in Table 1.

TABLE 1

| | Organic semiconductor compound | Concentration of organic semiconductor compound (% by mass) | Polymer | Concentration of polymer (% by mass) | Tg (° C.) | Elastic recovery %) | Surface energy (mN/m) | Mobility | Stability |
|---|---|---|---|---|---|---|---|---|---|
| Example 1 | OSC-1 | 1.0 | EPT0045 | 1.0 | −60 | 9.5 | 23 | 5 | 5 |
| Example 2 | OSC-2 | 1.0 | EPT0045 | 1.0 | −60 | 9.5 | 23 | 5 | 5 |
| Example 3 | OSC-3 | 1.0 | EPT0045 | 1.0 | −60 | 9.5 | 23 | 5 | 5 |
| Example 4 | OSC-4 | 1.0 | EPT0045 | 1.0 | −60 | 9.5 | 23 | 5 | 5 |
| Example 5 | OSC-5 | 1.0 | EPT0045 | 1.0 | −60 | 9.5 | 23 | 5 | 5 |
| Example 6 | OSC-6 | 1.0 | EPT0045 | 1.0 | −60 | 9.5 | 23 | 5 | 5 |
| Example 7 | OSC-7 | 1.0 | EPT0045 | 1.0 | −60 | 9.5 | 23 | 5 | 5 |
| Example 8 | OSC-8 | 1.0 | EPT0045 | 1.0 | −60 | 9.5 | 23 | 5 | 5 |
| Example 9 | OSC-9 | 1.0 | EPT0045 | 1.0 | −60 | 9.5 | 23 | 5 | 5 |
| Example 10 | OSC-10 | 1.0 | EPT0045 | 1.0 | −60 | 9.5 | 23 | 5 | 4 |
| Example 11 | OSC-11 | 1.0 | EPT0045 | 1.0 | −60 | 9.5 | 23 | 4 | 5 |
| Example 12 | OSC-12 | 1.0 | EPT0045 | 1.0 | −60 | 9.5 | 23 | 5 | 4 |
| Example 13 | OSC-13 | 1.0 | EPT0045 | 1.0 | −60 | 9.5 | 23 | 5 | 4 |
| Example 14 | OSC-14 | 1.0 | EPT0045 | 1.0 | −60 | 9.5 | 23 | 4 | 5 |
| Example 15 | OSC-15 | 1.0 | EPT0045 | 1.0 | −60 | 9.5 | 23 | 5 | 5 |

TABLE 1-continued

| | Organic semiconductor compound | Concentration of organic semiconductor compound (% by mass) | Polymer | Concentration of polymer (% by mass) | Tg (° C.) | Elastic recovery %) | Surface energy (mN/m) | Mobility | Stability |
|---|---|---|---|---|---|---|---|---|---|
| Example 16 | OSC-15 | 0.8 | EPT0045 | 1.0 | −60 | 9.5 | 23 | 4 | 5 |
| Example 17 | OSC-15 | 1.4 | EPT0045 | 1.0 | −60 | 9.5 | 23 | 5 | 5 |
| Example 18 | OSC-15 | 1.0 | EPT0045 | 0.5 | −60 | 9.5 | 23 | 5 | 4 |
| Example 19 | OSC-15 | 1.0 | EPT0045 | 1.3 | −60 | 9.5 | 23 | 4 | 5 |
| Example 20 | OSC-16 | 1.0 | EPT0045 | 1.0 | −60 | 9.5 | 23 | 4 | 5 |
| Example 21 | OSC-17 | 1.0 | EPT0045 | 1.0 | −60 | 9.5 | 23 | 4 | 5 |
| Example 22 | OSC-15 | 1.0 | EP22 | 1.0 | −54 | 14 | 24 | 5 | 5 |
| Example 23 | OSC-15 | 1.0 | EP43 | 1.0 | −58 | 13.3 | 29 | 5 | 5 |
| Example 24 | OSC-15 | 1.0 | EP24 | 1.0 | −54 | 21 | 31 | 4 | 5 |
| Example 25 | OSC-1 | 1.0 | EP65 | 1.0 | −50 | 23 | 31 | 5 | 5 |
| Example 26 | OSC-15 | 1.0 | EP65 | 1.0 | −50 | 23 | 31 | 5 | 5 |
| Example 27 | OSC-17 | 1.0 | EPT0045 | Polymer layer | −60 | 9.5 | 23 | 4 | 5 |
| Comparative Example 1 | OSC-17 | 1.0 | Polyisoprene (IR 2200L) | 1.0 | −65 | 34 | 27 | 2 | 3 |
| Comparative Example 2 | OSC-17 | 1.0 | Polyvinyl stearate (PVS) | 1.0 | 45 | <30 | 36 | 3 | 1 |
| Comparative Example 3 | OSC-18 | 1.0 | EPT0045 | 1.0 | −60 | 9.5 | 23 | 1 | 2 |
| Comparative Example 4 | OSC-17 | 1.0 | Polystyrene | 1.0 | 100 | <30 | 38 | 3 | 1 |
| Comparative Example 5 | OSC-17 | 1.0 | Poly α methylstyrene | 1.0 | 175 | <30 | 34 | 3 | 1 |
| Comparative Example 6 | OSC-1 | 1.0 | D1161 | 1.0 | −63 | 55 | 32 | 2 | 3 |
| Comparative Example 7 | OSC-1 | 1.0 | D1102 | 1.0 | −93 | 68 | 38 | 2 | 3 |

The abbreviations listed in Table 1 are as described below.

OSC-1 to OSC-17 used in examples are the same compounds as OSC-1 to OSC-17 described above.

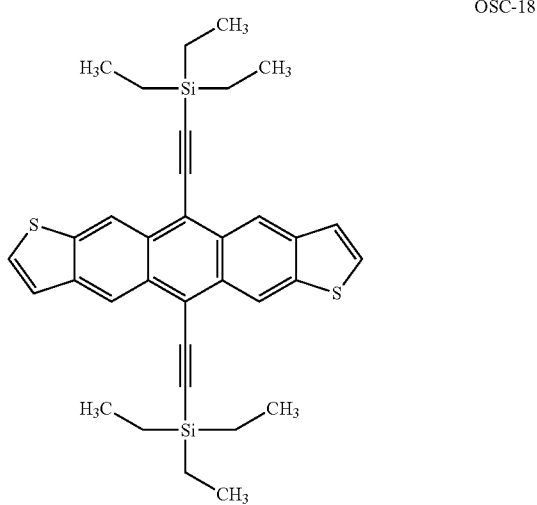 [SMILES: CC[Si](C#Cc1c2cc3ccsc3cc2c(C#C[Si](CC)(CC)CC)c2cc3ccsc3cc12)(CC)CC]

OSC-18

The synthesis methods and manufacturing sources of the organic semiconductors (OSC-1 to OSC-18) are as below.

OSC-1 was synthesized with reference to Journal of American Chemical Society, 116, 925 (1994), Journal of Chemical Society, 221 (1951), and the like.

OSC-2 was synthesized with reference to known documents (Org. Lett., 2001, 3, 3471, Macromolecules, 2010, 43, 6264, and Tetrahedron, 2002, 58, 10197).

OSC-3 was synthesized with reference to JP2012-513459A, JP2011-46687A, Journal of Chemical Research. miniprint, 3, 601-635 (1991), Bull. Chem. Soc. Japan, 64, 3682-3686 (1991), Tetrahedron Letters, 45, 2801-2803 (2004), and the like.

OSC-4 was synthesized with reference to EP2251342A, EP2301926A, EP2301921A, KR10-2012-0120886A, and the like.

OSC-5 was synthesized with reference to known documents (J. Org. Chem., 2011, 696, Org. Lett., 2001, 3, 3471, Macromolecules, 2010, 43, 6264, J. Org. Chem., 2013, 78, 7741, and Chem. Eur. J., 2013, 19, 3721).

OSC-6 was synthesized with reference to known documents (Bull. Chem. Soc. Jpn., 1987, 60, 4187, J. Am. Chem. Soc. 2011, 133, 5024, and Chem. Eur. J. 2013, 19, 3721).

OSC-7 and OSC-8 were synthesized with reference to known documents (Macromolecules, 2010, 43, 6264-6267 and J. Am, Chem. Soc., 2012, 134, 16548-16550).

OSC-9 was synthesized with reference to document A (K. Muellen, Chem. Commun., 2008, 1548-1550.), document B (K. Takimiya, Org. Lett., 2007, 9, 4499-4502.), document C (Rao; Tilak, Journal of Scientific and Industrial Research, 1958, vol. 17 B, p. 260-265), and document D (Ghaisas; Tilak, Journal of Scientific and Industrial Research, 1955, vol. 14 B, p. 11).

OSC-10 to OSC-13 were synthesized with reference to a known document (Journal of American Chemical Society, 129, 15732 (2007)).

OSC-14 was synthesized based on the method described in WO2005/087780A.

OSC-15 was synthesized based on the method described in JP2009-190999 Å.

OSC-16 was synthesized based on the method described in JP2012-206953 Å.

As OSC-17, C8BTBT (manufactured by Sigma-Aldrich Co. LLC.) was used.

As OSC-18, 5,11-bis(triethylsilylethynyl)anthradithiophene (manufactured by Sigma-Aldrich Co. LLC.) was used.

EPT0045: ethylene-propylene rubber, manufactured by Mitsui Chemicals, Inc.

EP22: ethylene-propylene rubber, JSR EP22, manufactured by JSR Corporation

EP43: ethylene-propylene rubber, JSR EP43, manufactured by JSR Corporation

EP24: ethylene-propylene-diene copolymer, copolymerized diene-ethylidene norbornene, JSR EP24, manufactured by JSR Corporation EP65: ethylene-propylene-diene copolymer, copolymerized diene=ethylidene norbornene, JSR EP65, manufactured by JSR Corporation D1161: styrene-isoprene block copolymer, Kraton D1161, manufactured by Kraton Performance Polymers Inc D1102: styrene-butadiene rubber, Kraton D1102, manufactured by Kraton Performance Polymers Inc IR2200L: polyisoprene rubber, Nipol IR2200L, manufactured by Zeon Corporation, Japan PVS: polyvinyl stearate, manufactured by Sigma-Aldrich Co. LLC.

Polystyrene: weight-average molecular weight of 400,000, manufactured by Sigma-Aldrich Co. LLC.

Poly α methylstyrene: poly-α-methylstyrene, weight-average molecular weight of 400,000, manufactured by Sigma-Aldrich Co. LLC.

Examples 28 to 37

<Preparation of Composition for Forming Organic Semiconductor Film>

An organic semiconductor compound shown in the following Table 2, o-dichlorobenzene (solvent), and polystyrene or poly α methylstyrene were weighed out in a glass vial at a predetermined ratio described in the following Table 2 and stirred and mixed together for 10 minutes by using MIX ROTOR (manufactured by AS ONE Corporation). The mixture was filtered through a 0.5 μm membrane filter, thereby obtaining a composition for forming an organic semiconductor film.

As polystyrene (PS) or poly α methylstyrene (PMS) in the following Table 2, the following compound was used.

Polystyrene: weight-average molecular weight: 2,000,000, manufactured by Sigma-Aldrich Co. LLC.

Poly α methylstyrene: poly-α-methylstyrene, weight-average molecular weight: 850,000, manufactured by Polysciences Inc.

—Formation of Polymer Layer—

In Examples 28 to 37, a polymer layer was formed by the same method as in Example 27.

—Organic Semiconductor Layer: Flexographic Printing Method—

In Examples 28 to 37, an organic semiconductor layer or a layer of polystyrene or poly α methylstyrene were formed by the same method as in Examples 1 to 26, except that the composition for forming an organic semiconductor film described above was used.

The evaluation results are summarized in Table 2. Herein, OSC-10 to OSC-14 and EPT0045 described in Table 2 are the same compounds as the compounds described above.

TABLE 2

|  | Organic semiconductor compound | Concentration of organic semiconductor compound (% by mass) | Polystyrene/poly α methylstyrene | Polymer layer | Tg (° C.) | Elastic recovery (%) | Surface energy (mN/m) | Mobility | Stability |
|---|---|---|---|---|---|---|---|---|---|
| Example 28 | OSC-10 | 1.0 | PS | EPT0045 | −60 | 9.5 | 23 | 5 | 5 |
| Example 29 | OSC-11 | 1.0 | PS | EPT0045 | −60 | 9.5 | 23 | 5 | 5 |
| Example 30 | OSC-12 | 1.0 | PS | EPT0045 | −60 | 9.5 | 23 | 5 | 5 |
| Example 31 | OSC-13 | 1.0 | PS | EPT0045 | −60 | 9.5 | 23 | 5 | 5 |
| Example 32 | OSC-14 | 1.0 | PS | EPT0045 | −60 | 9.5 | 23 | 5 | 5 |
| Example 33 | OSC-10 | 1.0 | PMS | EPT0045 | −60 | 9.5 | 23 | 5 | 5 |
| Example 34 | OSC-11 | 1.0 | PMS | EPT0045 | −60 | 9.5 | 23 | 5 | 5 |
| Example 35 | OSC-12 | 1.0 | PMS | EPT0045 | −60 | 9.5 | 23 | 5 | 5 |
| Example 36 | OSC-13 | 1.0 | PMS | EPT0045 | −60 | 9.5 | 23 | 5 | 5 |
| Example 37 | OSC-14 | 1.0 | PMS | EPT0045 | −60 | 9.5 | 23 | 5 | 5 |

By forming a polymer layer, adding polystyrene or poly-α-methylstyrene to the composition for forming an organic semiconductor film, and forming a layer of polystyrene or poly-α-methylstyrene, an organic semiconductor element having excellent mobility and heat stability could be obtained.

EXPLANATION OF REFERENCES

10: substrate
20: gate electrode
30: gate insulating film
40: source electrode
42: drain electrode
50: organic semiconductor film
51: metal mask
52: mask portion
53, 54: opening portion
60: sealing layer
100, 200: organic thin film transistor

What is claimed is:

1. A composition for forming an organic semiconductor film comprising:
  an organic semiconductor having a condensed polycyclic aromatic group; and
  a polymer,
  wherein the number of rings in the condensed polycyclic aromatic group is equal to or greater than 4,
  at least two rings in the condensed polycyclic aromatic group contain at least one atom selected from the group consisting of a sulfur atom, a nitrogen atom, a selenium atom, and an oxygen atom,
  the condensed polycyclic aromatic group contains, as a partial structure, at least any one structure selected from the group consisting of a benzene ring, a naphthalene ring, and a phenanthrene ring, and the polymer has a glass transition temperature of equal to or higher than −100° C. and equal to or less than −30° C. and an elastic recovery of equal to or less than 30%, wherein
the organic semiconductor contains at least one kind of compound represented by any one of Formula 1 to 16,
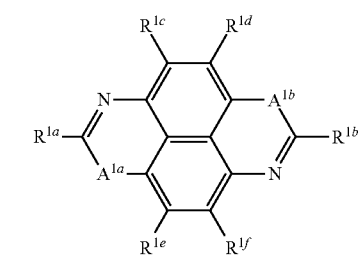
(1)
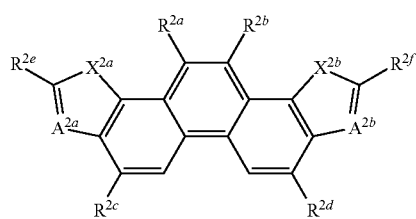
(2)
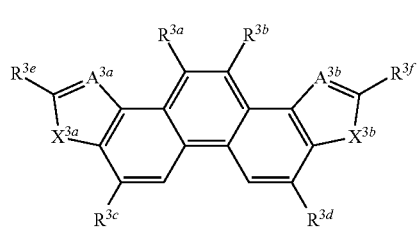
(3)
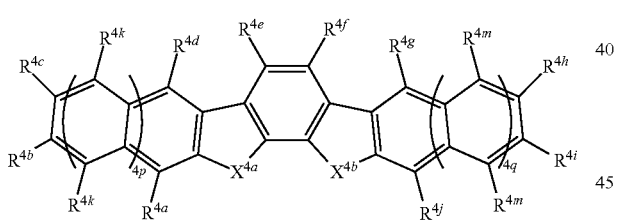
(4)
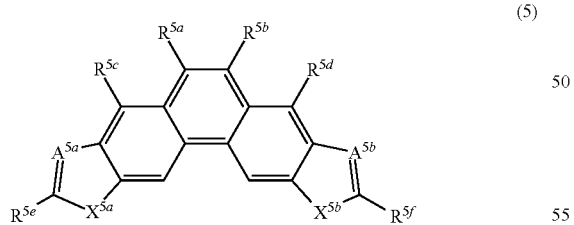
(5)
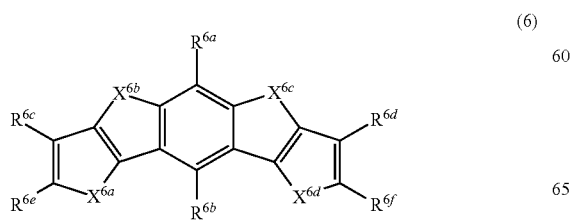
(6)
-continued
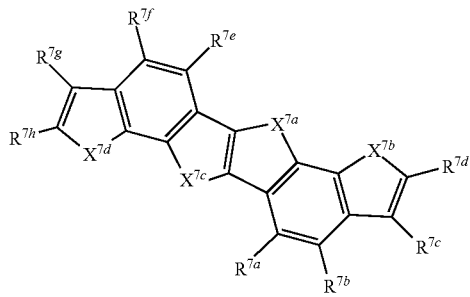
(7)
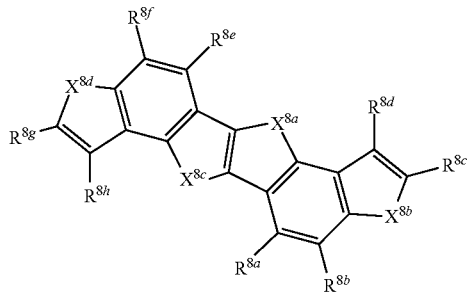
(8)
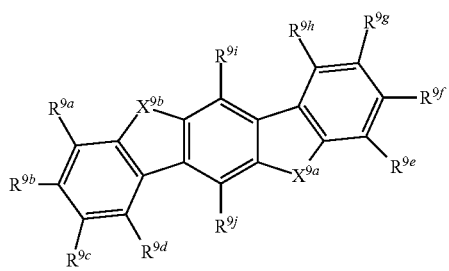
(9)
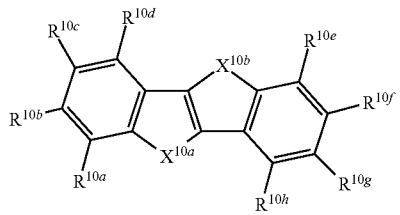
(10)
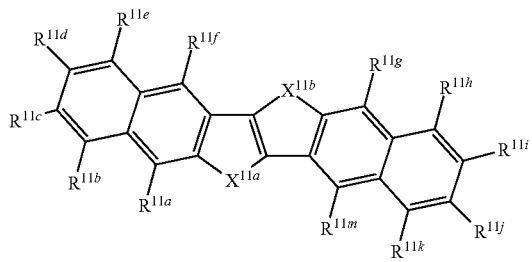
(11)

-continued (12)

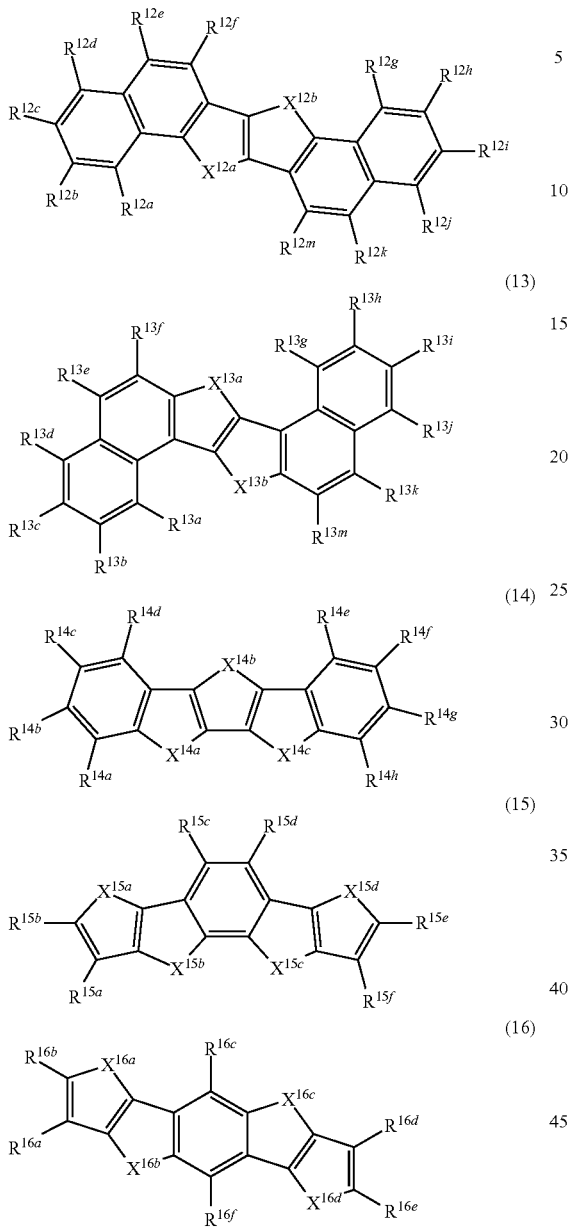

(13)

(14)

(15)

(16)

in Formula 1, $A^{1a}$ and $A^{1b}$ each independently represent a S atom, an O atom, or a Se atom, $R^{1a}$ to $R^{1f}$ each independently represent a hydrogen atom or a substituent, and at least one of $R^{1a}$, $R^{1b}$, $R^{1c}$, $R^{1d}$, $R^{1e}$ or $R^{1f}$ is a group represented by the following Formula W,

-L$^W$-R$^W$    (W)

in Formula W, L$^W$ represents a divalent linking group which is represented by any one of the following Formulae L-1 to L-25 or a divalent linking group in which two or more divalent linking groups represented by any one of the following Formulae L-1 to L-25 are bonded to each other, and R$^W$ represents an alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having two or more silicon atoms, or a trialkylsilyl group,

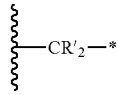  (L-1)

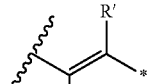  (L-2)

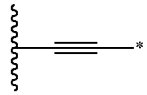  (L-3)

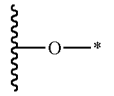  (L-4)

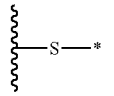  (L-5)

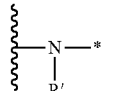  (L-6)

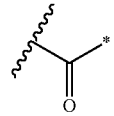  (l-7)

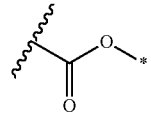  (L-8)

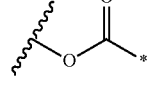  (L-9)

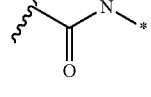  (L-10)

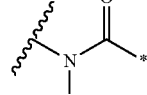  (L-11)

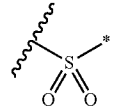  (L-12)

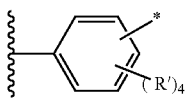
(L-13)

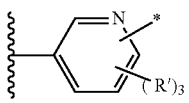
(L-14)

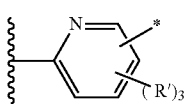
(L-15)

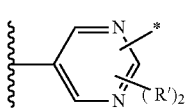
(L-16)

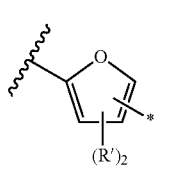
(L-17)

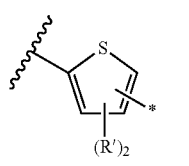
(L-18)

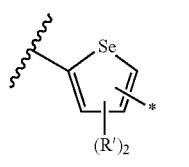
(L-19)

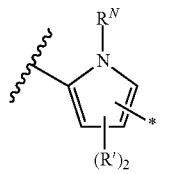
(L-20)

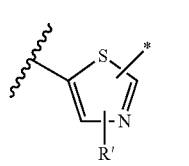
(L-21)

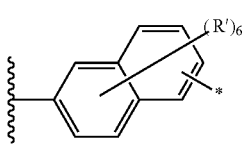
(L-22)

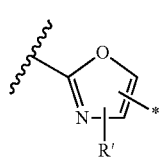
(L-23)

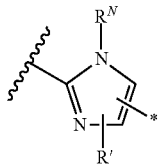
(L-24)

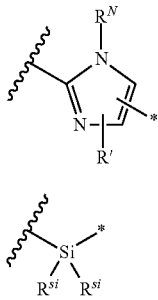
(L-25)

in Formulae L-1 to L-25, * represents a bonding position for $R^W$, the portion of a wavy line represents the other bonding position, R' in Formulae L-1, L-2, L-6, and L-13 to L-24 each independently represents a hydrogen atom or a substituent, $R^N$ in Formulae L-20 and L-24 represents a hydrogen atom or a substituent, and $R^{si}$ in Formula L-25 each independently represents a hydrogen atom, an alkyl group, an alkenyl group, or an alkynyl group, in Formula 2, $X^{2a}$ and $X^{2b}$ each independently represent $NR^{2i}$, an O atom, or a S atom, $A^{2a}$ represents $CR^{2g}$ or a N atom, $A^{2b}$ represents $CR^{2h}$ or a N atom, $R^{2i}$ represents a hydrogen atom, an alkyl group, an alkenyl group, an alkynyl group, or an acyl group, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ is a group represented by Formula W, in Formula 3, $X^{3a}$ and $X^{3b}$ each independently represent a S atom, an O atom, or $NR^{3g}$, and $A^{3a}$ and $A^{3b}$ each independently represent $CR^{3h}$ or a N atom, $R^{3a}$ to $R^{3h}$ each independently represent a hydrogen atom or a substituent, and at least one of $R^{3a}$, $R^{3b}$, $R^{3c}$, $R^{3d}$, $R^{3e}$, $R^{3f}$, $R^{3g}$, or $R^{3h}$ is a group represented by Formula W, in Formula 4, $X^{4a}$ and $X^{4b}$ each independently represent an O atom, a S atom, or a Se atom, 4p and 4q each independently represent an integer of 0 to 2, $R^{4a}$ to $R^{4j}$, $R^{4k}$, and $R^{4m}$ each independently represent a hydrogen atom, a halogen atom, or a group represented by Formula W, at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4j}$, $R^{4k}$, or $R^{4m}$ is a group represented by Formula W, and in a case where at least one of $R^{4e}$ or $R^{4f}$ is a group represented by Formula W, $L^W$ in Formula W represented by $R^{4e}$ and $R^{4f}$ is a divalent linking group represented by Formula L-2 or L-3, in Formula 5, $X^{5a}$ and $X^{5b}$ each independently represent $NR^{5i}$, an O atom, or a S atom, $A^{5a}$ represents $CR^{5g}$ or a N atom, $A^{5b}$ represents $CR^{5h}$ or a N atom, $R^{5i}$ represents a hydrogen atom, an alkyl group, an alkenyl group, an alkynyl group, an acyl group, an aryl group, or a heteroaryl group, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W, in Formula 6, $X^{6a}$ to $X^{6d}$ each independently represent $NR^{6g}$, an O atom, or a S atom, $R^{6g}$ represents a hydrogen atom, an alkyl group, an alkenyl group, an alkynyl group, an acyl group, an aryl group, or a heteroaryl group, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ is a group represented by Formula W, in Formula 7, $X^{7a}$ and $X^{7c}$ each independently represent a S atom, an O atom, a Se atom, or $NR^{7i}$, $X^{7b}$ and $X^{7d}$ each independently represent a S atom, an O atom, or a Se atom, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W, in Formula 8, $X^{8a}$ and $X^{8c}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W, in Formula 9, $X^{9a}$ and $X^{9b}$ each independently represent an O atom, a S atom, or a Se atom, $R^{9c}$, $R^{9d}$, and $R^{9g}$ to $R^{9j}$ each independently represent a hydrogen atom, a halogen atom, or a group represented by Formula W, and $R^{9a}$, $R^{9b}$, $R^{9e}$, and $R^{9f}$ each independently represent a hydrogen atom or a substituent, in Formula 10, $R^{10a}$ to $R^{10h}$ each independently represent a hydrogen atom or a substituent, at least one of $R^{10a}$, $R^{10b}$, $R^{10c}$, $R^{10d}$, $R^{10e}$, $R^{10f}$, $R^{10g}$ or $R^{10h}$ represents a substituent represented by Formula W, $X^{10a}$ and $X^{10b}$ each independently represent a S atom, an O atom, or a Se atom, or $NR^{10i}$, and $R^{10i}$ each independently represents a hydrogen atom or a group represented by Formula W, in Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ is a group represented by Formula W, in Formula 12, $X^{12a}$ and $X^{12b}$ each independently represent a S atom, an O atom, a Se atom, or $NR^{12n}$, $R^{12a}$ to $R^{12k}$, $R^{12m}$, and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ is a group represented by Formula W, in Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ is a group represented by Formula W, in Formula 14, $X^{14a}$ to $X^{14c}$ each independently represent a S atom, an O atom, a Se atom or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ is a group represented by Formula W, in Formula 15, $X^{15a}$ to $X^{15d}$ each independently represent a S atom, an O atom, a Se atom, or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ is a group represented by Formula W, and in Formula 16, $X^{16a}$ to $X^{16d}$ each independently represent a S atom, an O atom, a Se atom, or $NR^{16g}$, $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ is a group represented by Formula W.

2. The composition for forming an organic semiconductor film according to claim 1,
wherein the polymer has a surface energy of equal to or less than 30 mN/m².

3. The composition for forming an organic semiconductor film according to claim 1,
wherein the polymer is at least one kind of resin selected from the group consisting of natural rubber, synthetic rubber, a silicone resin, a thermoplastic elastomer, and a urea resin.

4. The composition for forming an organic semiconductor film according to claim 1,
wherein the polymer is at least one kind of polymer selected from the group consisting of ethylene-propylene rubber, acrylonitrile-butadiene rubber, hydrogenated nitrile rubber, fluororubber, a perfluoroelastomer, a tetrafluoroethylene propylene copolymer, an ethylene-propylene-diene copolymer, styrene-butadiene rubber, polychloroprene, polyneoprene, butyl rubber, a methyl phenyl silicone resin, a methyl phenyl vinyl silicone resin, a methyl vinyl silicone resin, a fluorosilicone resin, acryl rubber, ethylene acryl rubber, chlorosulfonated polyethylene, chloropolyethylene, an epichlorohydrin copolymer, a polyisoprene-natural rubber copolymer, polyisoprene rubber, a styrene-isoprene block copolymer, a polyester urethane copolymer, a polyether urethane copolymer, a polyether ester thermoplastic elastomer, and polybutadiene rubber.

5. The composition for forming an organic semiconductor film according to claim 1,
wherein the number of rings in the condensed polycyclic aromatic group is 5 or 6.

6. The composition for forming an organic semiconductor film according to claim 1,
wherein the condensed polycyclic aromatic group contains at least two heterocyclic rings, and the heterocyclic rings each contain one heteroatom.

7. The composition for forming an organic semiconductor film according to claim 1,
wherein the organic semiconductor contains at least one kind of compound represented by any one of Formulae 1 to 9 and 15.

8. The composition for forming an organic semiconductor film according to claim 1 further comprising:
at least one kind of compound selected from the group consisting of polystyrene and poly-α-methylstyrene.

9. An organic semiconductor element comprising:
an organic semiconductor having a condensed polycyclic aromatic group; and
a polymer,
wherein the number of rings in the condensed polycyclic aromatic group is equal to or greater than 4,
at least two rings in the condensed polycyclic aromatic group contain at least one atom selected from the group consisting of a sulfur atom, a nitrogen atom, a selenium atom, and an oxygen atom,
the condensed polycyclic aromatic group contains, as a partial structure, at least any one structure selected from the group consisting of a benzene ring, a naphthalene ring, and a phenanthrene ring, and
the polymer has a glass transition temperature of equal to or higher than −100° C. and equal to or less than −30° C. and an elastic recovery of equal to or less than 30%, wherein
the organic semiconductor contains at least one kind of compound represented by any one of Formulae 1 to 16, (1) 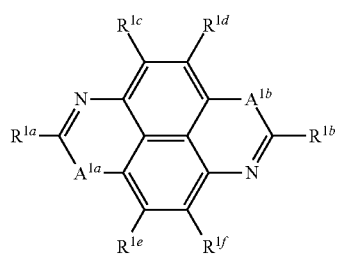
(2) 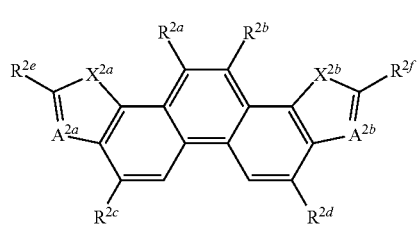
(3) 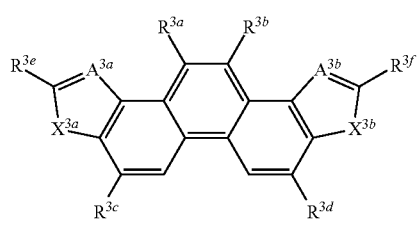
(4) 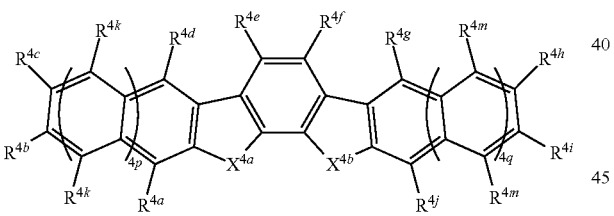
(5) 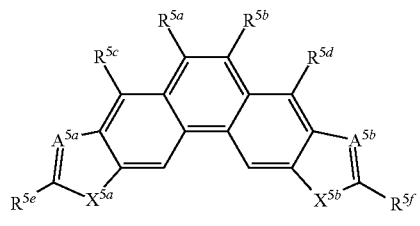
(6) 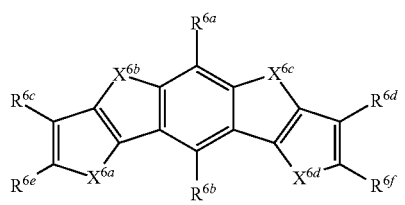
-continued
(7) 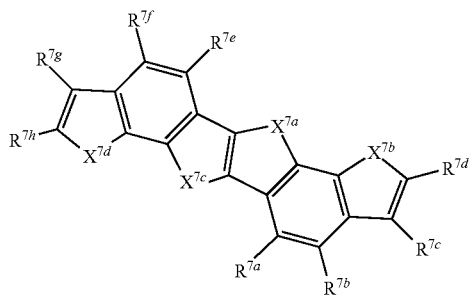
(8) 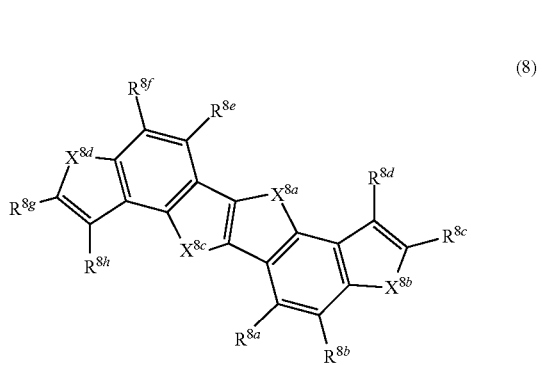
(9) 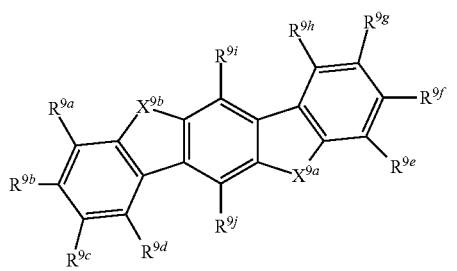
(10) 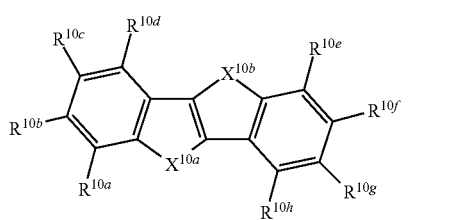
(11) 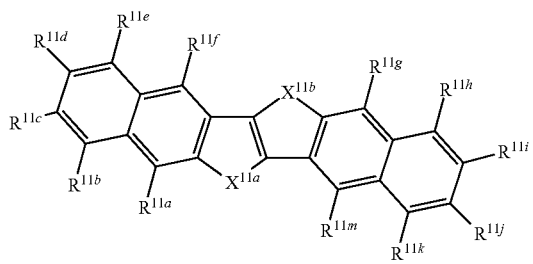

-continued

(12)
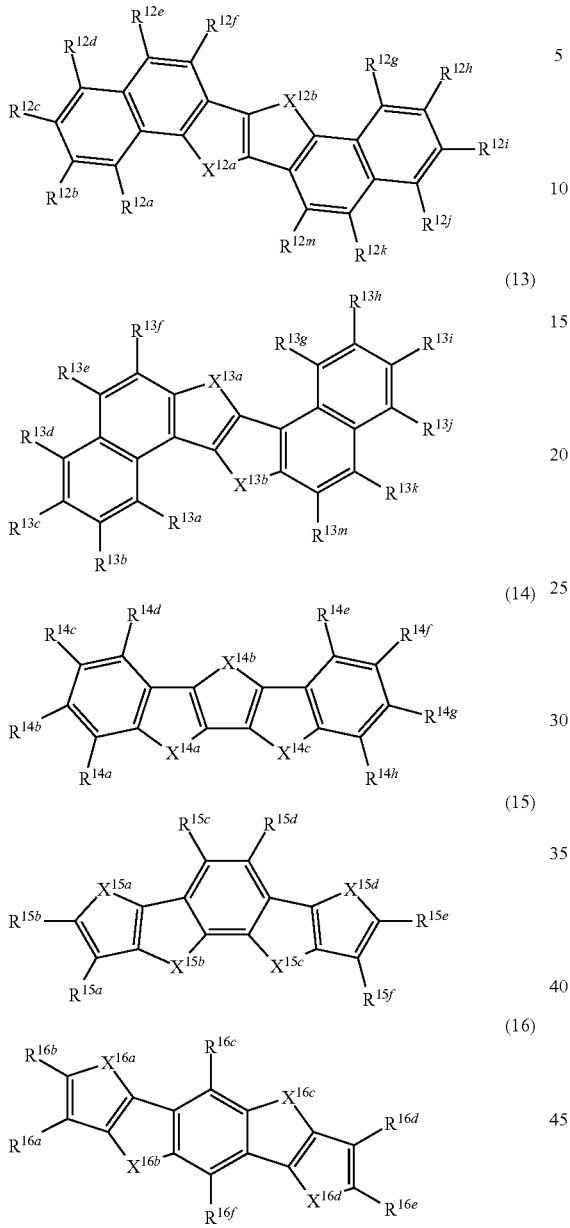
(13)

(14)

(15)

(16)

in Formula 1, $A^{1a}$ and $A^{1b}$ each independently represent a S atom, an O atom, or a Se atom, $R^{1a}$ to $R^{1f}$ each independently represent a hydrogen atom or a substituent, and at least one of $R^{1a}$, $R^{1b}$, $R^{1c}$, $R^{1d}$, $R^{1e}$ or $R^{1f}$ is a group represented by the following Formula W,

-$L^W$-$R^W$ (W)

in Formula W, $L^W$ represents a divalent linking group which is represented by any one of the following Formulae L-1 to L-25 or a divalent linking group in which two or more divalent linking groups represented by any one of the following Formulae L-1 to L-25 are bonded to each other, and $R^W$ represents an alkyl group, a cyano group, a vinyl group, an ethynyl group, an oxyethylene group, an oligo-oxyethylene group in which a repetition number v of an oxyethylene unit is equal to or greater than 2, a siloxane group, an oligosiloxane group having two or more silicon atoms, or a trialkylsilyl group,

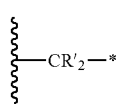 (L-1)

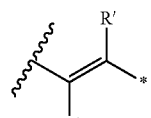 (L-2)

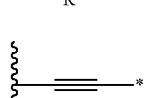 (L-3)

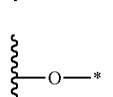 (L-4)

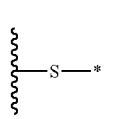 (L-5)

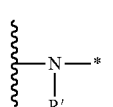 (L-6)

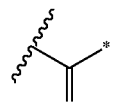 (l-7)

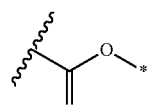 (L-8)

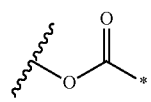 (L-9)

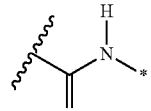 (L-10)

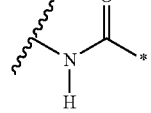 (L-11)

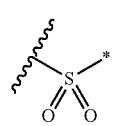 (L-12)

-continued (L-13) 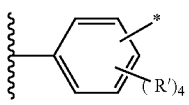

(L-14) 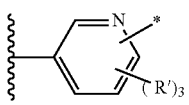

(L-15) 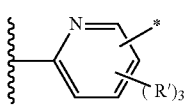

(L-16) 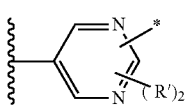

(L-17) 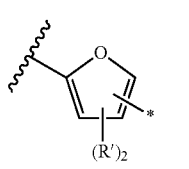

(L-18) 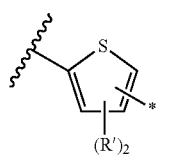

(L-19) 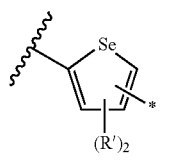

(L-20) 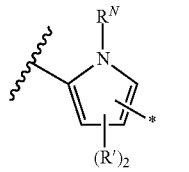

(L-21) 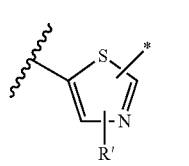

(L-22) 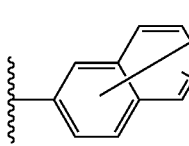

(L-23) 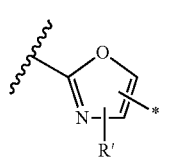

-continued (L-24) 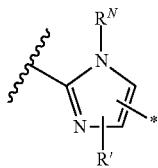

(L-25) 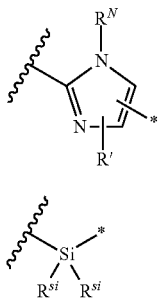

in Formulae L-1 to L-25, * represents a bonding position for $R^W$, the portion of a wavy line represents the other bonding position, R' in Formulae L-1, L-2, L-6, and L-13 to L-24 each independently represents a hydrogen atom or a substituent, $R^N$ in Formulae L-20 and L-24 represents a hydrogen atom or a substituent, and $R^{si}$ in Formula L-25 each independently represents a hydrogen atom, an alkyl group, an alkenyl group, or an alkynyl group, in Formula 2, $X^{2a}$ and $X^{2b}$ each independently represent $NR^{2i}$, an O atom, or a S atom, $A^{2a}$ represents $CR^{2g}$ or a N atom, $A^{2b}$ represents $CR^{2h}$ or a N atom, $R^{2i}$ represents a hydrogen atom, an alkyl group, an alkenyl group, an alkynyl group, or an acyl group, $R^{2a}$ to $R^{2h}$ each independently represent a hydrogen atom or a substituent, and at least one of $R^{2a}$, $R^{2b}$, $R^{2c}$, $R^{2d}$, $R^{2e}$, $R^{2f}$, $R^{2g}$, or $R^{2h}$ is a group represented by Formula W, in Formula 3, $X^{3a}$ and $X^{3b}$ each independently represent a S atom, an O atom, or $NR^{3g}$, and $A^{3a}$ and $A^{3b}$ each independently represent $CR^{3h}$ or a N atom, $R^{3a}$ to $R^{3h}$ each independently represent a hydrogen atom or a substituent, and at least one of $R^{3a}$, $R^{3b}$, $R^{3c}$, $R^{3d}$, $R^{3e}$, $R^{3f}$, $R^{3g}$, or $R^{3h}$ is a group represented by Formula W, in Formula 4, $X^{4a}$ and $X^{4b}$ each independently represent an O atom, a S atom, or a Se atom, 4p and 4q each independently represent an integer of 0 to 2, $R^{4a}$ to $R^{4i}$, $R^{4k}$, and $R^{4m}$ each independently represent a hydrogen atom, a halogen atom, or a group represented by Formula W, at least one of $R^{4a}$, $R^{4b}$, $R^{4c}$, $R^{4d}$, $R^{4e}$, $R^{4f}$, $R^{4g}$, $R^{4h}$, $R^{4i}$, $R^{4k}$, or $R^{4m}$ is a group represented by Formula W, and in a case where at least one of $R^{4e}$ or $R^{4f}$ is a group represented by Formula W, $L^W$ in Formula W represented by $R^{4e}$ and $R^{4f}$ is a divalent linking group represented by Formula L-2 or L-3, in Formula 5, $X^{5a}$ and $X^{5b}$ each independently represent $NR^{5i}$, an O atom, or a S atom, $A^{5a}$ represents $CR^{5g}$ or a N atom, $A^{5b}$ represents $CR^{5h}$ or a N atom, $R^{5i}$ represents a hydrogen atom, an alkyl group, an alkenyl group, an alkynyl group, an acyl group, an aryl group, or a heteroaryl group, $R^{5a}$ to $R^{5h}$ each independently represent a hydrogen atom or a substituent, and at least one of $R^{5a}$, $R^{5b}$, $R^{5c}$, $R^{5d}$, $R^{5e}$, $R^{5f}$, $R^{5g}$, or $R^{5h}$ is a group represented by Formula W, in Formula 6, $X^{6a}$ to $X^{6d}$ each independently represent $NR^{6g}$, an O atom, or a S atom, $R^{6g}$ represents a hydrogen atom, an alkyl group, an alkenyl group, an alkynyl group, an acyl group, an aryl group, or a heteroaryl group, $R^{6a}$ to $R^{6f}$ each independently represent a hydrogen atom or a substituent, and at least one of $R^{6a}$, $R^{6b}$, $R^{6c}$, $R^{6d}$, $R^{6e}$, or $R^{6f}$ is a group represented by Formula W, in Formula 7, $X^{7a}$ and $X^{7c}$ each independently represent a S atom, an O atom, a Se atom, or $NR^{7i}$, $X^{7b}$ and $X^{7d}$ each independently represent a S atom, an O atom, or a Se atom, $R^{7a}$ to $R^{7i}$ each independently represent a hydrogen atom or a substituent, and at least one of $R^{7a}$, $R^{7b}$, $R^{7c}$, $R^{7d}$, $R^{7e}$, $R^{7f}$, $R^{7g}$, $R^{7h}$, or $R^{7i}$ is a group represented by Formula W, in Formula 8, $X^{8a}$ and $X^{8c}$ each independently represent a S atom, an O atom, a Se atom, or $NR^{8i}$, $X^{8b}$ and $X^{8d}$ each independently represent a S atom, an O atom, or a Se atom, $R^{8a}$ to $R^{8i}$ each independently represent a hydrogen atom or a substituent, and at least one of $R^{8a}$, $R^{8b}$, $R^{8c}$, $R^{8d}$, $R^{8e}$, $R^{8f}$, $R^{8g}$, $R^{8h}$, or $R^{8i}$ is a group represented by Formula W, in Formula 9, $X^{9a}$ and $X^{9b}$ each independently represent an O atom, a S atom, or a Se atom, $R^{9c}$, $R^{9d}$, and $R^{9g}$ to $R^{9j}$ each independently represent a hydrogen atom, a halogen atom, or a group represented by Formula W, and $R^{9a}$, $R^{9b}$, $R^{9e}$, and $R^{9f}$ each independently represent a hydrogen atom or a substituent, in Formula 10, $R^{10a}$ to $R^{10b}$ each independently represent a hydrogen atom or a substituent, at least one of $R^{10a}$, $R^{10b}$, $R^{10c}$, $R^{10d}$, $R^{10e}$, $R^{10f}$, $R^{10g}$, or $R^{10h}$ represents a substituent represented by Formula W, $X^{10a}$ and $X^{10b}$ each independently represent a S atom, an O atom, or a Se atom, or $NR^{10i}$, and $R^{10i}$ each independently represents a hydrogen atom or a group represented by Formula W, in Formula 11, $X^{11a}$ and $X^{11b}$ each independently represent a S atom, an O atom, a Se atom, or $NR^{11n}$, $R^{11a}$ to $R^{11k}$, $R^{11m}$, and $R^{11n}$ each independently represent a hydrogen atom or a substituent, and at least one of $R^{11a}$, $R^{11b}$, $R^{11c}$, $R^{11d}$, $R^{11e}$, $R^{11f}$, $R^{11g}$, $R^{11h}$, $R^{11i}$, $R^{11j}$, $R^{11k}$, $R^{11m}$, or $R^{11n}$ is a group represented by Formula W, in Formula 12, $X^{12a}$ and $X^{12b}$ each independently represent a S atom, an O atom, a Se atom, or $NR^{12n}$, $R^{12a}$ to $R^{12k}$, $R^{12m}$, and $R^{12n}$ each independently represent a hydrogen atom or a substituent, and at least one of $R^{12a}$, $R^{12b}$, $R^{12c}$, $R^{12d}$, $R^{12e}$, $R^{12f}$, $R^{12g}$, $R^{12h}$, $R^{12i}$, $R^{12j}$, $R^{12k}$, $R^{12m}$, or $R^{12n}$ is a group represented by Formula W, in Formula 13, $X^{13a}$ and $X^{13b}$ each independently represent a S atom, an O atom, a Se atom, or $NR^{13n}$, $R^{13a}$ to $R^{13k}$, $R^{13m}$, and $R^{13n}$ each independently represent a hydrogen atom or a substituent, and at least one of $R^{13a}$, $R^{13b}$, $R^{13c}$, $R^{13d}$, $R^{13e}$, $R^{13f}$, $R^{13g}$, $R^{13h}$, $R^{13i}$, $R^{13j}$, $R^{13k}$, $R^{13m}$, or $R^{13n}$ is a group represented by Formula W, in Formula 14, $X^{14a}$ to $X^{14c}$ each independently represent a S atom, an O atom, a Se atom or $NR^{14i}$, $R^{14a}$ to $R^{14i}$ each independently represent a hydrogen atom or a substituent, and at least one of $R^{14a}$, $R^{14b}$, $R^{14c}$, $R^{14d}$, $R^{14e}$, $R^{14f}$, $R^{14g}$, $R^{14h}$, or $R^{14i}$ is a group represented by Formula W, in Formula 15, $X^{15a}$ to $X^{15d}$ each independently represent a S atom, an O atom, a Se atom, or $NR^{15g}$, $R^{15a}$ to $R^{15g}$ each independently represent a hydrogen atom or a substituent, and at least one of $R^{15a}$, $R^{15b}$, $R^{15c}$, $R^{15d}$, $R^{15e}$, $R^{15f}$, or $R^{15g}$ is a group represented by Formula W, and in Formula 16, $X^{16a}$ to $X^{16d}$ each independently represent a S atom, an O atom, a Se atom, or $NR^{16g}$, $R^{16a}$ to $R^{16g}$ each independently represent a hydrogen atom or a substituent, and at least one of $R^{16a}$, $R^{16b}$, $R^{16c}$, $R^{16d}$, $R^{16e}$, $R^{16f}$, or $R^{16g}$ is a group represented by Formula W.

10. The organic semiconductor element according to claim 9,
wherein the polymer has a surface energy of equal to or less than 30 mN/m².

11. The organic semiconductor element according to claim 9,
wherein the polymer is at least one kind of resin selected from the group consisting of natural rubber, synthetic rubber, a silicone resin, a thermoplastic elastomer, and a urea resin.

12. The organic semiconductor element according to claim 9,
wherein the polymer is at least one kind of polymer selected from the group consisting of ethylene-propylene rubber, acrylonitrile-butadiene rubber, hydrogenated nitrile rubber, fluororubber, a perfluoroelastomer, a tetrafluoroethylene propylene copolymer, an ethylene-propylene-diene copolymer, styrene-butadiene rubber, polychloroprene, polyneoprene, butyl rubber, a methyl phenyl silicone resin, a methyl phenyl vinyl silicone resin, a methyl vinyl silicone resin, a fluorosilicone resin, acryl rubber, ethylene acryl rubber, chlorosulfonated polyethylene, chloropolyethylene, an epichlorohydrin copolymer, a polyisoprene-natural rubber copolymer, polyisoprene rubber, a styrene-isoprene block copolymer, a polyester urethane copolymer, a polyether urethane copolymer, a polyether ester thermoplastic elastomer, and polybutadiene rubber.

13. The organic semiconductor element according to claim 9 having a layer of the polymer between the organic semiconductor and a gate insulating film.

14. The organic semiconductor element according to claim 13 having a layer containing at least one kind of compound selected from the group consisting of polystyrene and poly-α-methylstyrene between the organic semiconductor and the layer of the polymer.

15. The organic semiconductor element according to claim 9,
wherein the number of rings in the condensed polycyclic aromatic group is 5 or 6.

16. The organic semiconductor element according to claim 9,
wherein the condensed polycyclic aromatic group contains at least two heterocyclic rings, and the heterocyclic rings each contain one heteroatom.

17. The organic semiconductor element according to claim 9,
wherein the organic semiconductor contains at least one kind of compound represented by any one of Formulae 1 to 9 and 15.

18. A method for manufacturing an organic semiconductor element, comprising:
a coating step of coating a substrate with the composition for forming an organic semiconductor film according to claim 1.

* * * * *